US 9,230,987 B2

(12) United States Patent
Pachamuthu et al.

(10) Patent No.: US 9,230,987 B2
(45) Date of Patent: Jan. 5, 2016

(54) MULTILEVEL MEMORY STACK STRUCTURE AND METHODS OF MANUFACTURING THE SAME

(71) Applicant: SANDISK TECHNOLOGIES INC., Plano, TX (US)

(72) Inventors: Jayavel Pachamuthu, San Jose, CA (US); Johann Alsmeier, San Jose, CA (US); Henry Chien, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/611,785

(22) Filed: Feb. 2, 2015

(65) Prior Publication Data
US 2015/0236038 A1     Aug. 20, 2015

Related U.S. Application Data

(60) Provisional application No. 61/942,539, filed on Feb. 20, 2014.

(51) Int. Cl.
*H01L 27/00*     (2006.01)
*H01L 27/115*    (2006.01)
(Continued)

(52) U.S. Cl.
CPC ...... *H01L 27/11582* (2013.01); *H01L 21/8221* (2013.01); *H01L 27/0688* (2013.01);
(Continued)

(58) Field of Classification Search
CPC ............... H01L 27/11578; H01L 27/0688; H01L 29/7926; H01L 27/2481; H01L 27/11551; H01L 21/8221
See application file for complete search history.

(56) References Cited

U.S. PATENT DOCUMENTS 5,387,530 A    2/1995 Doyle et al.
5,915,167 A    6/1999 Leedy
(Continued)

FOREIGN PATENT DOCUMENTS

EP    1398831 A2    3/2004
WO    WO02/15277 A2    2/2002
(Continued)

OTHER PUBLICATIONS

Endoh, et al., "Novel Ultra High Density Memory with a Stacked-Surrounding Gate Transistor (S-SGT) Structured Cell," IEDM Proc. (2001) 33-36.
(Continued)

*Primary Examiner* — Ngan Ngo
(74) *Attorney, Agent, or Firm* — The Marbury Law Group PLLC

(57) ABSTRACT

A first stack of alternating layers including first electrically conductive layers and first electrically insulating layers is formed with first stepped surfaces and a first dielectric material portion thereupon. Dielectric pillar structures including a dielectric metal oxide can be formed through the first stepped surfaces. Lower memory openings can be formed, and filled with a disposable material or a lower memory opening structure including a lower semiconductor channel and a doped semiconductor region. At least one dielectric material layer and a second stack of alternating layers including second electrically conductive layers and second electrically insulating layers can be sequentially formed. Upper memory openings can be formed through the second stack and the at least one dielectric material layer. A memory film and a semiconductor channel can be formed after removal of the disposable material, or an upper semiconductor channel can be formed on the doped semiconductor region.

38 Claims, 32 Drawing Sheets

(51) Int. Cl.
  *H01L 29/792* (2006.01)
  *H01L 27/06* (2006.01)
  *H01L 21/822* (2006.01)
  *H01L 27/24* (2006.01)

(52) U.S. Cl.
  CPC ...... *H01L27/1157* (2013.01); *H01L 27/11551* (2013.01); *H01L 27/11575* (2013.01); *H01L 27/11578* (2013.01); *H01L 27/2481* (2013.01); *H01L 29/7926* (2013.01)

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,394,716 | B2 | 3/2013 | Hwang et al. |
| 8,445,347 | B2 | 5/2013 | Alsmeier |
| 8,450,181 | B2 | 5/2013 | Chen et al. |
| 8,614,126 | B1 | 12/2013 | Lee et al. |
| 8,658,499 | B2 | 2/2014 | Makala et al. |
| 8,741,761 | B2 | 6/2014 | Lee et al. |
| 8,884,357 | B2 | 11/2014 | Wang et al. |
| 8,946,023 | B2 | 2/2015 | Makala et al. |
| 2006/0003531 | A1 | 1/2006 | Chang et al. |
| 2006/0258076 | A1 | 11/2006 | Mizushima et al. |
| 2007/0210338 | A1 | 9/2007 | Orlowski |
| 2007/0252201 | A1 | 11/2007 | Kito et al. |
| 2008/0067583 | A1 | 3/2008 | Kidoh et al. |
| 2008/0169496 | A1 | 7/2008 | Keller et al. |
| 2009/0026561 | A1 | 1/2009 | Reichenbach et al. |
| 2009/0121271 | A1 | 5/2009 | Son et al. |
| 2009/0242967 | A1 | 10/2009 | Katsumata et al. |
| 2010/0044778 | A1 | 2/2010 | Seol |
| 2010/0059811 | A1 | 3/2010 | Sekine et al. |
| 2010/0112769 | A1 | 5/2010 | Son et al. |
| 2010/0120214 | A1 | 5/2010 | Park et al. |
| 2010/0133598 | A1* | 6/2010 | Chae ................ H01L 27/11551 257/314 |
| 2010/0155810 | A1 | 6/2010 | Kim et al. |
| 2010/0155818 | A1 | 6/2010 | Cho |
| 2010/0171162 | A1 | 7/2010 | Katsumata et al. |
| 2010/0181610 | A1 | 7/2010 | Kim et al. |
| 2010/0207195 | A1 | 8/2010 | Fukuzumi et al. |
| 2010/0213458 | A1 | 8/2010 | Prall |
| 2010/0320528 | A1 | 12/2010 | Jeong et al. |
| 2010/0327340 | A1* | 12/2010 | Oota ................ H01L 27/11573 257/324 |
| 2011/0065270 | A1 | 3/2011 | Shim et al. |
| 2011/0076819 | A1 | 3/2011 | Kim et al. |
| 2011/0133606 | A1 | 6/2011 | Yoshida et al. |
| 2011/0151667 | A1 | 6/2011 | Hwang et al. |
| 2011/0215394 | A1* | 9/2011 | Komori ................ H01L 29/792 257/324 |
| 2011/0266606 | A1 | 11/2011 | Park et al. |
| 2011/0287612 | A1 | 11/2011 | Lee et al. |
| 2011/0291177 | A1* | 12/2011 | Lee ................ H01L 21/28282 257/324 |
| 2011/0309431 | A1* | 12/2011 | Kidoh ............... H01L 27/11573 257/324 |
| 2011/0312174 | A1 | 12/2011 | Lee et al. |
| 2012/0001247 | A1 | 1/2012 | Alsmeier |
| 2012/0001249 | A1 | 1/2012 | Alsmeier et al. |
| 2012/0003800 | A1 | 1/2012 | Lee et al. |
| 2012/0032250 | A1* | 2/2012 | Son .................... H01L 21/28273 257/324 |
| 2012/0049268 | A1* | 3/2012 | Chang ............... H01L 21/28273 257/324 |
| 2012/0052674 | A1 | 3/2012 | Lee et al. |
| 2012/0068242 | A1 | 3/2012 | Shin et al. |
| 2012/0068255 | A1* | 3/2012 | Lee .................... H01L 29/7926 257/324 |
| 2012/0074367 | A1 | 3/2012 | Costa et al. |
| 2012/0081958 | A1* | 4/2012 | Lee .................... G11C 16/0483 365/185.05 |
| 2012/0098050 | A1* | 4/2012 | Shim .................. H01L 29/7926 257/324 |
| 2012/0098051 | A1* | 4/2012 | Son .................... H01L 27/11582 257/324 |
| 2012/0112264 | A1* | 5/2012 | Lee .................... H01L 27/11551 257/324 |
| 2012/0140562 | A1 | 6/2012 | Choe et al. |
| 2012/0153376 | A1 | 6/2012 | Alsmeier et al. |
| 2012/0208347 | A1 | 8/2012 | Hwang et al. |
| 2012/0241842 | A1* | 9/2012 | Matsuda ........... H01L 27/11582 257/324 |
| 2012/0256247 | A1 | 10/2012 | Alsmeier et al. |
| 2012/0261638 | A1 | 10/2012 | Sills et al. |
| 2012/0276719 | A1 | 11/2012 | Han et al. |
| 2013/0056820 | A1* | 3/2013 | Jeong ................. H01L 27/0688 257/324 |
| 2013/0062683 | A1* | 3/2013 | Fukuzumi ......... H01L 29/66833 257/324 |
| 2013/0248974 | A1 | 9/2013 | Alsmeier et al. |
| 2013/0264631 | A1 | 10/2013 | Alsmeier et al. |
| 2013/0270625 | A1* | 10/2013 | Jang .................... H01L 29/7926 257/324 |
| 2013/0270643 | A1* | 10/2013 | Lee .................... H01L 27/1052 257/365 |
| 2013/0313627 | A1 | 11/2013 | Lee et al. |
| 2013/0313717 | A1 | 11/2013 | Holmes et al. |
| 2013/0322174 | A1 | 12/2013 | Li et al. |
| 2013/0328005 | A1* | 12/2013 | Shin ................... H01L 27/2436 257/1 |
| 2013/0341701 | A1* | 12/2013 | Blomme ............ H01L 21/764 257/324 |
| 2014/0014889 | A1* | 1/2014 | Shim .................. H01L 29/7827 257/1 |
| 2014/0035026 | A1* | 2/2014 | Jang ................... H01L 29/792 257/324 |
| 2014/0070302 | A1* | 3/2014 | Yoo .................... H01L 27/1157 257/324 |
| 2014/0084358 | A1* | 3/2014 | Lee .................... H01L 27/11582 257/324 |
| 2014/0167131 | A1* | 6/2014 | Lu ..................... H01L 29/7889 257/316 |
| 2014/0197542 | A1* | 7/2014 | Yun .................... H01L 27/1157 257/773 |
| 2014/0264525 | A1 | 9/2014 | Takahashi et al. |
| 2014/0264533 | A1 | 9/2014 | Simsek-Ege et al. |
| 2014/0264542 | A1 | 9/2014 | Simsek-Ege et al. |
| 2014/0273373 | A1 | 9/2014 | Makala et al. |
| 2015/0076580 | A1* | 3/2015 | Pachamuthu ..... H01L 27/11551 257/314 |
| 2015/0079765 | A1* | 3/2015 | Pachamuthu ..... H01L 21/28282 438/478 |
| 2015/0115455 | A1* | 4/2015 | Chen ................. H01L 27/76895 257/773 |
| 2015/0132906 | A1* | 5/2015 | Chang .............. H01L 27/11582 438/268 |
| 2015/0243671 | A1* | 8/2015 | Simsek-Ege ...... H01L 27/11556 257/321 |
| 2015/0255468 | A1* | 9/2015 | Chen ................. H01L 27/11582 257/326 |

FOREIGN PATENT DOCUMENTS

| | | |
|---|---|---|
| WO | WO2008/118433 A1 | 10/2008 |
| WO | WO2009/085078 A1 | 7/2009 |
| WO | WO2012/003301 A2 | 1/2012 |

(56) References Cited

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Invitation to Pay Additional Search Fees, International Application No. PCT/US13/24638, issued Apr. 24, 2013.

Non-Final Office for U.S. Appl. No. 13/933,743, Office Action issued Apr. 21, 2014, 29pgs.

Search Report and Written Opinion PCT/US2014/020290, dated Jun. 25, 2014, 10 pages.

Search Report and Written Opinion of PCT/US2014/023276, dated Jun. 30, 2014, 13 pages.

Invitation to Pay Additional Fees and Annex Partial International Search Report for PCT/US2015/015155, dated May 25, 2015, 8 Sheets.

* cited by examiner

MULTILEVEL MEMORY STACK STRUCTURE AND METHODS OF MANUFACTURING THE SAME

FIELD

The present disclosure relates generally to the field of three-dimensional memory devices and specifically to three-dimensional memory devices including a vertical stack of multilevel memory arrays and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises a lower stack structure comprising a first stack of alternating layers including first electrically insulating layers and first electrically conductive layers and located over a substrate, at least one dielectric material layer overlying the lower stack structure, and an upper stack structure comprising a second stack of alternating layers including second electrically insulating layers and second electrically conductive layers and located over the at least one dielectric material layer. The at least one dielectric material layer has a thickness that is greater than a maximum thickness of the first and second electrically insulating layers. The monolithic three-dimensional memory device further comprises a memory opening extending through the second stack, the at least one dielectric material layer, and the first stack, a memory film and at least one semiconductor channel located within the memory opening, and at least one via contact structure vertically extending through the upper stack structure, the at least one dielectric material layer, and a portion of the lower stack structure, and electrically shorted to at least one conductive structure located in, or underneath, the first stack. The at least one via contact structure comprises a first via contact portion embedded within the lower stack structure, and a second via contact portion embedded within the upper stack structure.

According to another aspect of the present disclosure, a monolithic three-dimensional memory device is provided, which comprises a first stack of alternating layers including first electrically insulating layers and first electrically conductive layers and located over a substrate; a first dielectric material portion located on, and over, first stepped surfaces of the first stack; and a plurality of dielectric pillar structures comprising a stress-compensating dielectric material and extending through the first stepped surfaces of the first stack. At least two of the plurality of dielectric pillar structures pass through different numbers of layers among the first electrically insulating layers. The stress-compensating dielectric material and the electrically conductive layers apply stresses of opposite types to the substrate. The monolithic three-dimensional memory device further comprises a memory opening extending at least through the first stack, a memory film and at least one semiconductor channel located within the memory opening, and at least one via contact structure vertically extending at least through the first dielectric material portion and electrically shorted to at least one conductive structure located in, or underneath, the first stack.

According to yet another aspect of the present disclosure, a method of forming a three-dimensional memory device is provided. A lower stack structure is formed over a substrate. The lower stack structure comprises a first stack of alternating layers including first electrically insulating layers and first electrically conductive layers, and lower memory openings extending through the lower stack structure and filled with a respective lower memory opening fill structure. Lower memory openings are formed through the lower stack structure. The lower memory openings are filled with lower memory opening fill structures. At least one dielectric material layer is formed over the lower stack structure. An upper stack structure is formed over the at least one dielectric material layer. The upper stack structure comprises a second stack of alternating layers including second electrically insulating layers and second electrically conductive layers, and upper memory openings that extend through the second stack. A memory film and at least one semiconductor channel are formed within each vertically adjoined pair of a lower memory opening and an upper memory opening. At least one via contact structure is formed on a top surface of at least one conductive structure located in, or underneath, the first stack. Each of the at least one via contact structure vertically extends through the upper stack structure, the at least one dielectric material layer, and a portion of the lower stack structure. Each of the at least one via contact structure comprises a first via contact portion formed within the lower stack structure, and a second via contact portion extending through the upper stack structure and above the first via contact portion.

DETAILED DESCRIPTION

Figure 1:
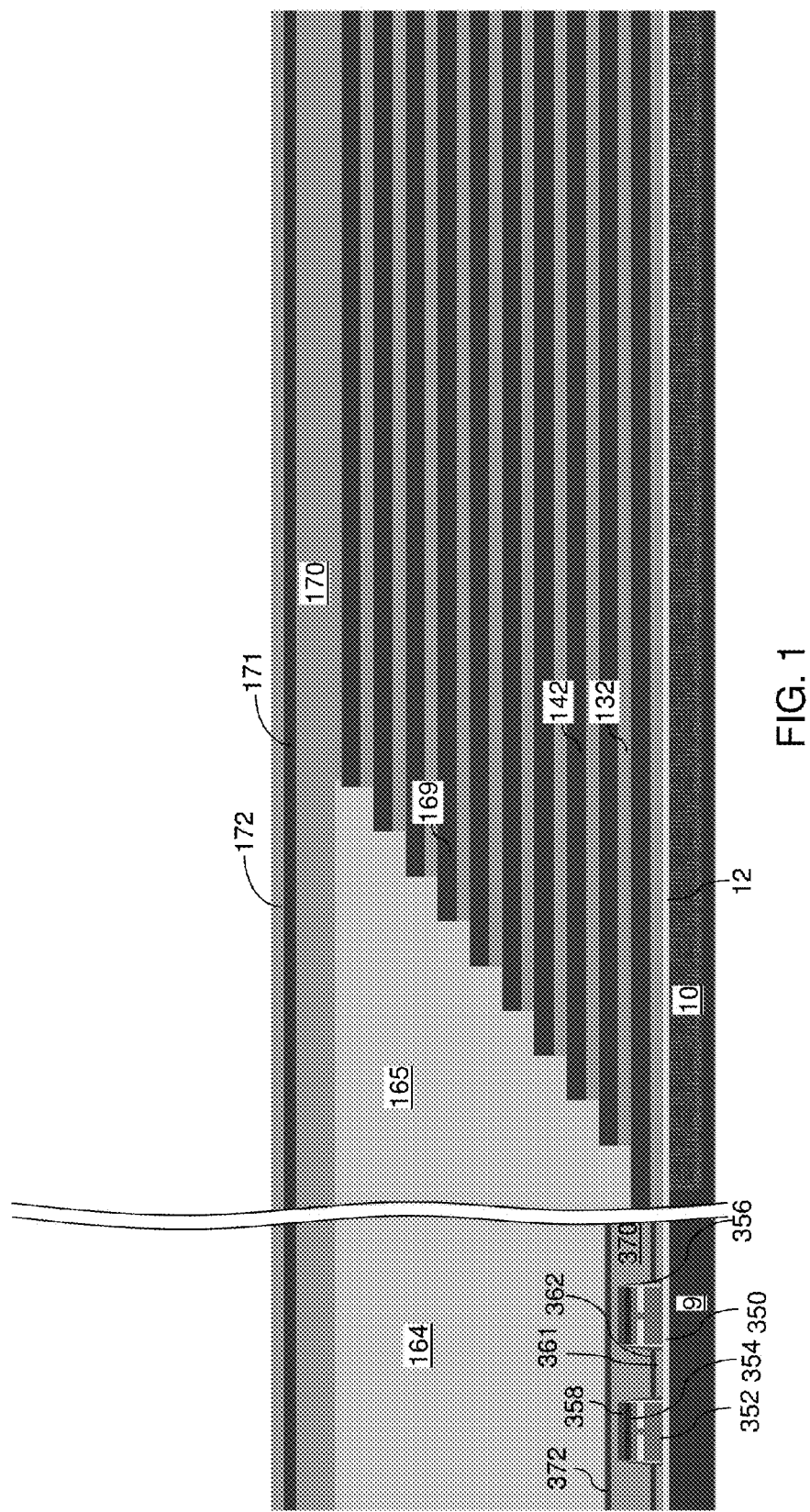
FIG. 1 is a vertical cross-sectional view of a first exemplary structure after formation of a lower-level stack of an alternating plurality of lower-level first material layers and lower-level second material layers, a lower-level dielectric cap layer, and planarization stopping layers according to a first embodiment of the present disclosure.

As discussed above, the present disclosure is directed to metal interconnect structures including multiple electrically shorted conductive layers for vertical semiconductor devices and methods of making the same, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915, 167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

The inventors of the present disclosure realized that monolithic integration of MANOS (metal-aluminum oxide-nitride-oxide-silicon) layers for double memory hole (MH, i.e., memory opening) stack is desirable for good device performance, in particular boosting potential of the semiconductor channels, cell contacts, and peripheral contacts to improve RC delay.

For example, pattern collapse is seen in array and wafer edges due to integration issues involving a wet etch process for removing sacrificial layers (such as silicon nitride layers) and wafer warpage due to word line stress after replacement of the sacrificial material layers with electrically conductive layers. There is a need for strong and wet etch resistant support pillar structures for holding the patterned structure during the wet etch process and after formation of the word lines. Strong supporting pillars may prevent wet-etch induced pattern collapse both at memory cells and wafer edges.

In addition, stacked terrace contacts and peripheral transistors contacts preferably have low resistance and good alignment to avoid electrical opens. Another consideration is that mask counts and metal levels should be reduced for cost reduction when stacking multi-levels of MH stacks. Thus, vertical scaling of memory array can be limited by very high aspect ratios of terrace and peripheral transistor contacts.

Preferably, vertical stacking of three-dimensional memory structures includes prevention of memory hole punch-through and contact punch-through during dry etch processes for an upper-level memory structures, cost containment through reduction of the total number of lithographic masks needed to pattern the various levels, and prevention of a substrate over etch during high aspect ratio etches through the memory stack structures.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 9 can comprise a single crystalline semiconductor material.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The region in which the at least one semiconductor device for the peripheral circuitry is herein referred to as a peripheral device region. The at least one semiconductor device can include, for example, field effect transistors. For example, at least one shallow trench isolation structure (not shown) can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (350, 352, 354, 358), each of which can include a gate dielectric 350, at least one gate electrode (352, 354), and a gate cap dielectric 358. A gate electrode (352, 354) may include a stack of a first gate electrode portion 352 and a second gate electrode portion 354. At least one gate spacer 356 can be formed around the at least one gate structure (350, 352, 354, 358) by depositing and anisotropically etching a conformal dielectric layer. Active regions (such as source regions and drain regions) can be formed in upper portions of the substrate semiconductor layer 9, for example, by introducing electrical dopants employing the at least one gate structure (350, 352, 354, 358) as masking structures. Additional masks may be employed as needed. The active regions 330 can include source regions and drain regions of field effect transistors. A first dielectric liner 361 and a second dielectric liner 362 can be optionally formed. Each of the first and second dielectric liners (361, 362) can comprise a silicon oxide layer, a silicon nitride layer, and/or a dielectric metal oxide layer. In an illustrative example, the first dielectric liner 361 can be a silicon oxide layer, and the second dielectric liner 362 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 370. In one embodiment the planarized top surface of the planarization dielectric layer 370 can be coplanar with a top surface of the dielectric liners (361, 362). Optionally, an etch stop layer 372 can be formed over the planarization dielectric layer 370. Subsequently, the etch stop layer 372, the planarization dielectric layer 370, and the dielectric liners (361, 362) can be removed from an area to physically expose a top surface of the substrate semiconductor layer 9.

Optionally, a doped semiconductor material layer 10 can be formed on the top surface of the substrate semiconductor layer 9 by implantation of electrical dopants (p-type dopants or n-type dopants) into an upper portion of the substrate semiconductor layer 9, or by deposition of a single crystalline semiconductor material, for example, by selective epitaxy. The single crystalline semiconductor material of the doped semiconductor material layer 10 can be in epitaxial alignment with the single crystalline structure of the substrate semiconductor layer 9.

Optionally, a dielectric pad layer 12 can be formed on the doped semiconductor material layer 10. The dielectric pad layer 12 can be, for example, silicon oxide layer. The thickness of the dielectric pad layer 12 can be in a range from 3 nm to 30 nm, although lesser and greater thicknesses can also be employed.

A stack of an alternating plurality of first material layers and second material layers is subsequently formed. Because the first material layers and the second material layers are employed to form a lower-level stack of a multi-stack structure, the first material layers and the second material layers are herein referred to as lower-level first material layers and lower-level second material layers, respectively. The stack formed by the lower-level first material layers and the lower-level second material layers is herein referred to as a lower-level stack (132, 142), or a first stack (132, 142). As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness there amongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each lower-level first material layer includes a first material, and each lower-level second material layer includes a second material that is different from the first material. In one embodiment, each lower-level first material layer can be a first electrically insulating layer 132 including a first electrically insulating material, and each lower-level second material layer can be a first sacrificial material layer 142 including a first sacrificial material. In this case, the stack can include an alternating plurality of first electrically insulating layers 132 and first sacrificial material layers 142. As used herein, a "sacrificial material" refers to a material that is removed during a subsequent processing step. In another embodiment, the stack composed of an alternating plurality of first sacrificial material layers and first electrically insulating layers. In this case, the stack is a NONO stack rather than an ONON stack.

In one embodiment, the first stack (132, 142) can include first electrically insulating layers 132 composed of the first material, and first sacrificial material layers 142 composed of the second material, which is different from the first material. The first material of the first electrically insulating layers 132 can be at least one electrically insulating material. Electrically insulating materials that can be employed for the first electrically insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first electrically insulating layers 132 can be silicon oxide.

The second material of the first sacrificial material layers 142 is a sacrificial material that can be removed selective to the first material of the first electrically insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an electrically insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first electrically insulating layers 132 can include silicon oxide, and sacrificial material layers can include silicon nitride sacrificial material layers. The first material of the first electrically insulating layers 132 can be deposited, for example, by chemical vapor deposition (CVD). For example, if silicon oxide is employed for the first electrically insulating layers 132, tetraethylorthosilicate (TEOS) can be employed as the precursor material for the CVD process. The second material of the first sacrificial material layers 142 can be formed, for example, CVD or atomic layer deposition (ALD).

The first sacrificial material layers 142 can be suitably patterned so that conductive material portions to be subsequently formed by replacement of the first sacrificial material layers 142 can function as electrically conductive electrodes, such as the control gate electrodes of the monolithic three-dimensional NAND string memory devices to be subsequently formed. The first sacrificial material layers 142 may comprise a portion having a strip shape extending substantially parallel to the top surface of the substrate (9, 10).

The thicknesses of the first electrically insulating layers 132 and the first sacrificial material layers 142 can be in a range from 20 nm to 50 nm, although lesser and greater thicknesses can be employed for each first electrically insulating layer 132 and for each first sacrificial material layer 142. The number of repetitions of the pairs of a first electrically insulating layer 132 and a first sacrificial material layer (e.g., a control gate electrode or a sacrificial material layer) 142 can be in a range from 2 to 1,024, and typically from 8 to 256, although a greater number of repetitions can also be employed. The top and bottom gate electrodes in the stack may function as the select gate electrodes. In one embodiment, each first sacrificial material layer 142 in the first stack (132, 142) can have a uniform thickness that is substantially invariant within each respective first sacrificial material layer 142.

The first stack (132, 142) can be removed from above the peripheral devices including the at least one gate structure (350, 352, 354, 458), for example, by a combination of lithographic methods and an etch that employs a patterned photoresist layer as an etch mask. A lower-level dielectric fill material layer 164 can be formed over the peripheral devices. Excess portions of the lower-level dielectric fill material layer 164 can be removed from above the topmost surface of the first stack (132, 142), for example, by chemical mechanical planarization.

Stepped surfaces are formed in a region of the first exemplary structure. The stepped surfaces are herein referred to as first stepped surfaces, and can be formed, for example, by forming a mask layer with an opening therein, etching a cavity within the levels of the topmost first sacrificial material layer 142 and the topmost first electrically insulating layer 132, and iteratively expanding the etched area and vertically recessing the cavity by etching each pair of a first electrically insulating layer 132 and a first sacrificial material layer 142 located directly underneath the bottom surface of the etched cavity within the etched area. The first stack (132, 142) is patterned such that each underlying first sacrificial material layer 142 laterally protrudes farther than any overlying first sacrificial material layer 142 in the etched region, and each underlying first electrically insulating layer 132 laterally protrudes farther than any overlying first electrically insulating layer 132 in the etched region. The etched region is a contact region of the first stack (132, 142). The cavity is herein referred to as a first stepped cavity.

A dielectric material is deposited to fill the first stepped cavity. Excess portions of the dielectric material overlying the topmost surface of the first stack (132, 142), are removed for example, by chemical mechanical planarization. The remaining portion of the deposited dielectric material forms a first dielectric material portion 165. The first dielectric material portion 165 is retro-stepped, i.e., is a retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present.

Dielectric material layers (170, 171, 172) can be formed over the first stack (132, 142), the first dielectric material portion 165, and the lower-level dielectric fill material layer 164. The dielectric material layers (170, 171, 172) include a first-stack-cap dielectric layer 170, and can optionally include a first planarization stopping layer 171 and/or a second planarization stopping layer 172. The first-stack-cap dielectric layer 170 includes a dielectric material, which can be, for example, a silicon oxide such as undoped silicate glass (USG). The first-stack-cap dielectric layer 170 is a capping dielectric layer for the first stack (132, 142). The thickness of the first-stack-cap dielectric layer 170 can be in a range from 30 nm to 100 nm, although lesser and greater thicknesses can also be employed. In one embodiment, the first planarization stopping layer 171 can be a silicon nitride layer, and the second planarization stopping layer 172 can be a silicon oxide layer. The portion of the first exemplary structure below the dielectric material layers (170, 180, 190) is herein referred to as a lower stack structure, or a first stack structure.

Figure 2:
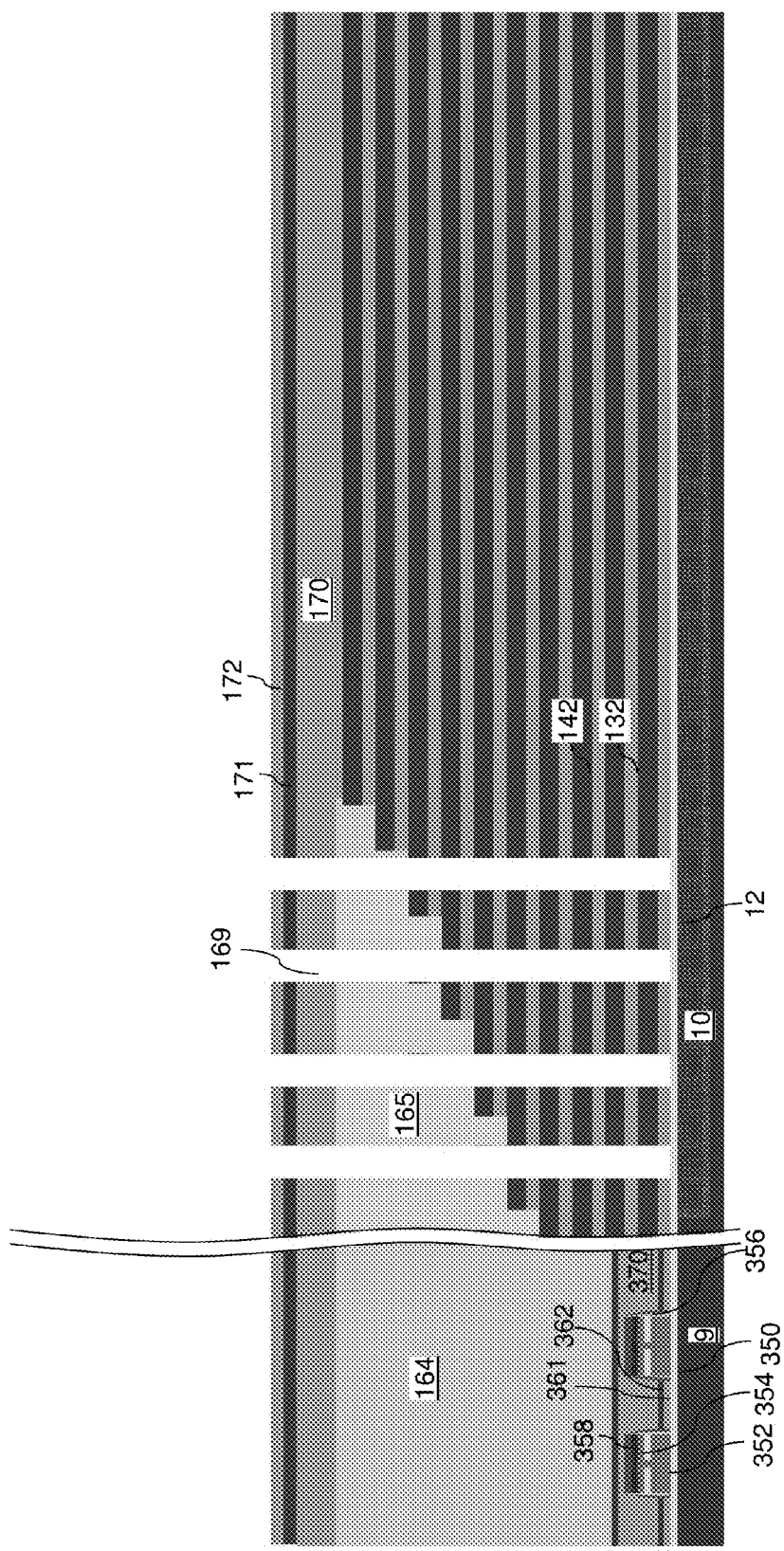
FIG. 2 is a vertical cross-sectional view of the first exemplary structure after formation of pillar cavities according to the first embodiment of the present disclosure.

Referring to FIG. 2, a vertical cross-sectional view of the first exemplary structure is shown along a vertical plane that is offset from the vertical cross-sectional plane of FIG. 1. A photoresist layer (not shown) can be applied over the first stepped surfaces of the first exemplary structure and lithographically patterned to form openings in the photoresist layer. The pattern of the openings in the photoresist layer is selected such that the area of the openings corresponds to regions in which structural support is needed to prevent collapse of the first electrically insulating layers 132 during removal of the first sacrificial material layers 142 in a subsequent etch step, and to reduce warpage of the first exemplary structure after replacement of the first sacrificial material layers 142 with first electrically conductive layers. In one embodiment, the shapes of the openings in the photoresist layer can be circular, elliptical, polygonal, or of a closed shape having a curvilinear periphery.

The pattern in the photoresist layer is transferred through the first dielectric material portion 165 and the stepped regions of the first stack (132, 142) by an anisotropic etch. Cavities extending from the topmost surface of the dielectric material layers (170, 171, 172) at least to the dielectric pad layer 12 or to the substrate (9, 10) can be formed in the first exemplary structure. The cavities are herein referred to as pillar cavities 169.

Figure 3:
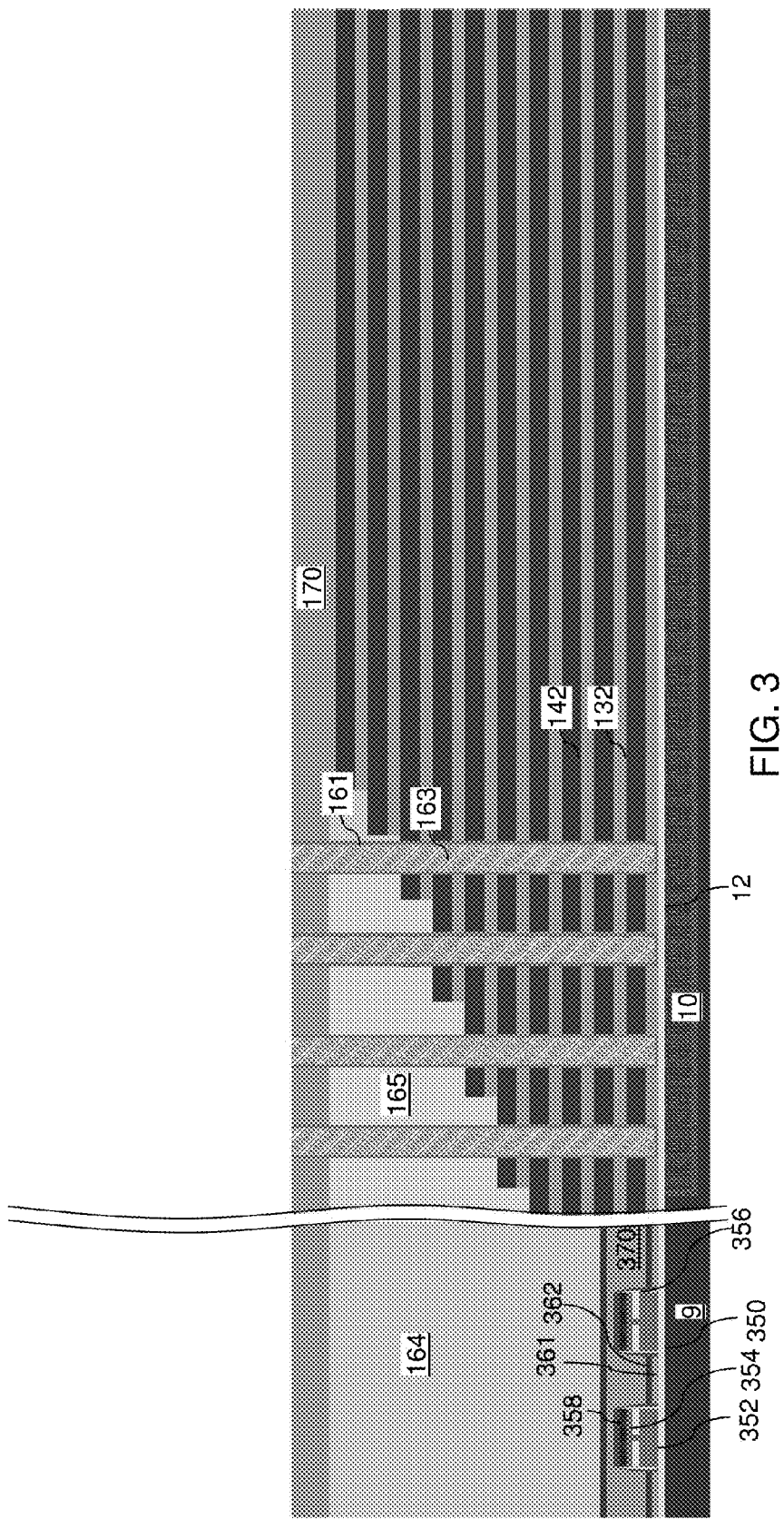
FIG. 3 is a vertical cross-sectional view of the first exemplary structure after formation of dielectric pillar structures according to the first embodiment of the present disclosure.

Referring to FIG. 3, dielectric pillar structures 163 are formed by filling the pillar cavities 169 with a dielectric material, such as a dielectric metal oxide, a non-metal oxide (e.g., silicon oxide), diamond-like carbon or amorphous carbon. Optionally, a dielectric liner 161 can be formed on the sidewalls of the pillar cavities 169 prior to formation of the dielectric pillar structures 163. If a plurality of dielectric pillar structures 163 are formed through the first stepped surfaces of the first stack (132, 142), at least two of the plurality of dielectric pillar structures 163 can pass through different numbers of layers among the first electrically insulating layers 132.

The material of the dielectric metal oxide, non-metal oxide, diamond like carbon or amorphous carbon of the dielectric pillar structures 163 can be selected such that the dielectric pillar structures 163 applies compressive stress to the first stack (132, 142). An example of a dielectric metal oxide that generates a compressive to a surrounding structure is tantalum oxide ($Ta_2O_5$). Tantalum oxide can be deposited, for example, by chemical vapor deposition. An excess portion of tantalum oxide above the top surface of the dielectric material layers (170, 171, 172) can be removed, for example, by chemical mechanical planarization. In one embodiment, the second planarization stopping layer 172 and the first planarization stopping layer 171 can be removed at the end of the planarization process. The plurality of dielectric pillar structures 163 can provide structural support during subsequent processing steps, and can apply a compensating stress at the time of formation of first electrically conductive layers that apply a tensile stress to surrounding structures.

Figure 4:
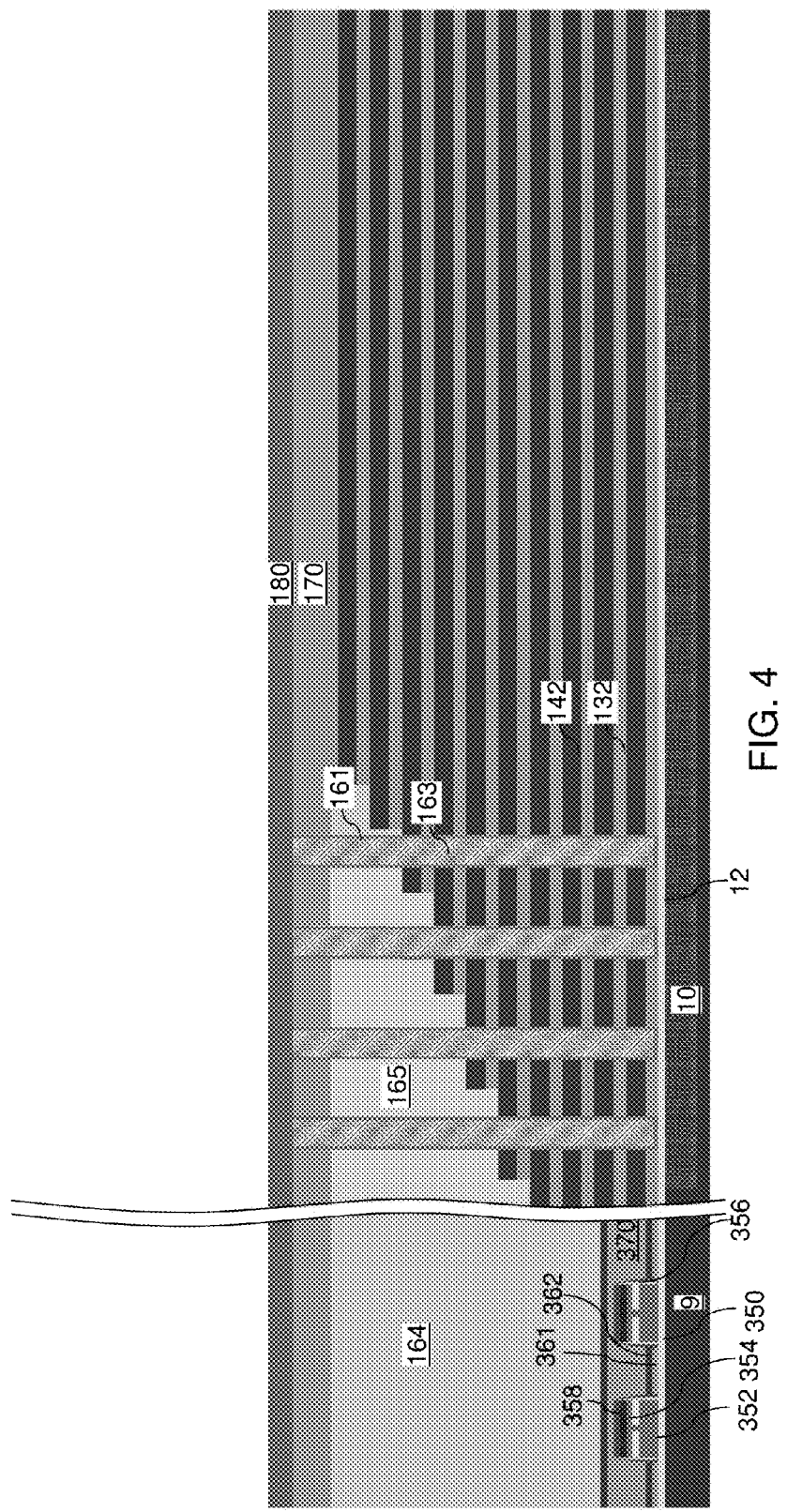
FIG. 4 is a vertical cross-sectional view of the first exemplary structure after formation of an interstack dielectric layer according to the first embodiment of the present disclosure.

Referring to FIG. 4, an interstack dielectric layer 180 is formed on the first-stack-cap dielectric layer 170. The interstack dielectric layer 180 can comprise a dielectric material that can be etched at a faster rate than the dielectric material of the first-stack-cap dielectric layer 170 in an isotropic etch such as a wet etch employing hydrofluoric acid. For example, if the first-stack-cap dielectric layer 170 comprises undoped silicate glass (USG), the interstack dielectric layer 180 can comprise a doped silicate glass such as borosilicate glass (BSG) or a borophosphosilicate glass (BPSG), or can comprise porous or non-porous organosilicate glass (OSG). The thickness of the interstack dielectric layer 180 can be in a range from 30 nm to 100 nm, although lesser and greater thicknesses can also be employed.

Figure 5:
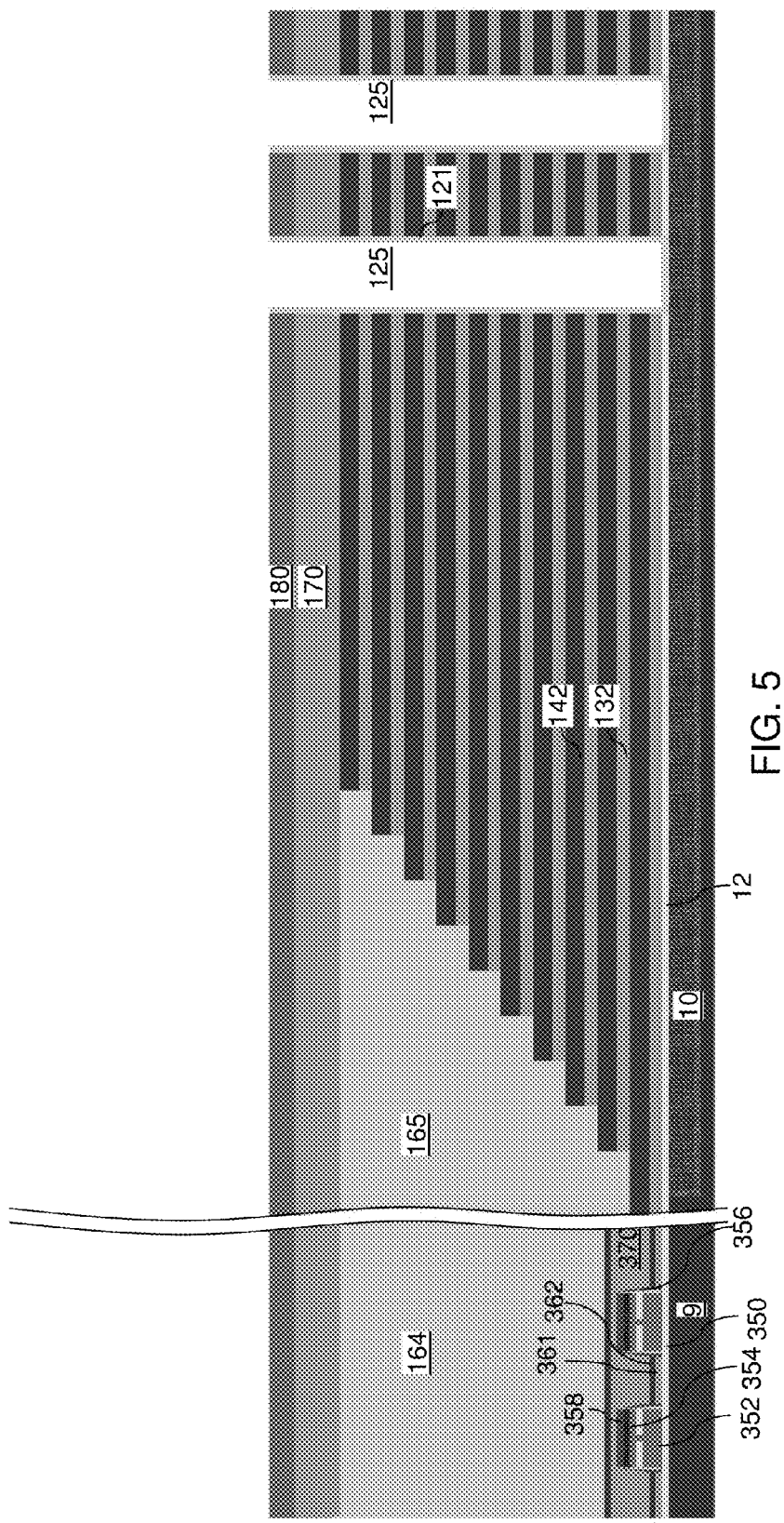
FIG. 5 is a vertical cross-sectional view of the first exemplary structure after formation of lower-level memory openings according to the first embodiment of the present disclosure.

Referring to FIG. 5, a cross-sectional view of the first exemplary structure is shown along a vertical plane, which is different from the vertical cross-sectional plane of FIGS. 2-4, and can be the same as the vertical cross-sectional plane of FIG. 1. A lithographic material stack (not shown) including at least a photoresist layer can be formed over the first stack (132, 142), and can be lithographically patterned to form openings within a region in which the first stack (132, 142) includes all layers therein. The pattern in the lithographic material stack can be transferred through the entirety of the first stack (132, 142) by at least one anisotropic etch that employs the patterned lithographic material stack as an etch mask. Portions of the first stack (132, 142) underlying the openings in the patterned lithographic material stack are etched to form lower memory openings 125. In other words, the transfer of the pattern in the patterned lithographic material stack through the first stack (132, 142) forms the lower memory openings 125 that extend through the first stack (132, 142). The chemistry of the anisotropic etch process employed to etch through the materials of the first stack (132, 142) can alternate to optimize etching of the first and second materials in the first stack (132, 142). The anisotropic etch can be, for example, a series of reactive ion etches. The sidewalls of the lower memory openings 125 can be substantially vertical, or can be tapered. The patterned lithographic material stack can be subsequently removed, for example, by ashing. The region in which the lower memory openings 125 are formed is herein referred to as a device region. A contact region that includes the first stepped surfaces can be provided adjacent to the device region.

In one embodiment, the substrate (9, 10) can be employed as a stopping layer. In one embodiment, the lower memory openings 125 may extend below the top surface of the substrate (9, 10) by an over etch. In one embodiment, a lower opening liner 121 can be formed on each sidewall of the lower memory openings 125. The lower opening liners 121 can include a sacrificial material such as silicon oxide, organosilicate glass, silicon nitride, and/or a dielectric metal oxide. The lower opening liners 121 can be formed, for example, by deposition of a conformal material layer. The thickness of the lower opening liners 121 can be in a range from 1 nm to 10 nm, although lesser and greater thicknesses can also be employed. Optionally, an anisotropic etch that removes the horizontal portion of the conformal dielectric material layer may be performed.

Figure 6:
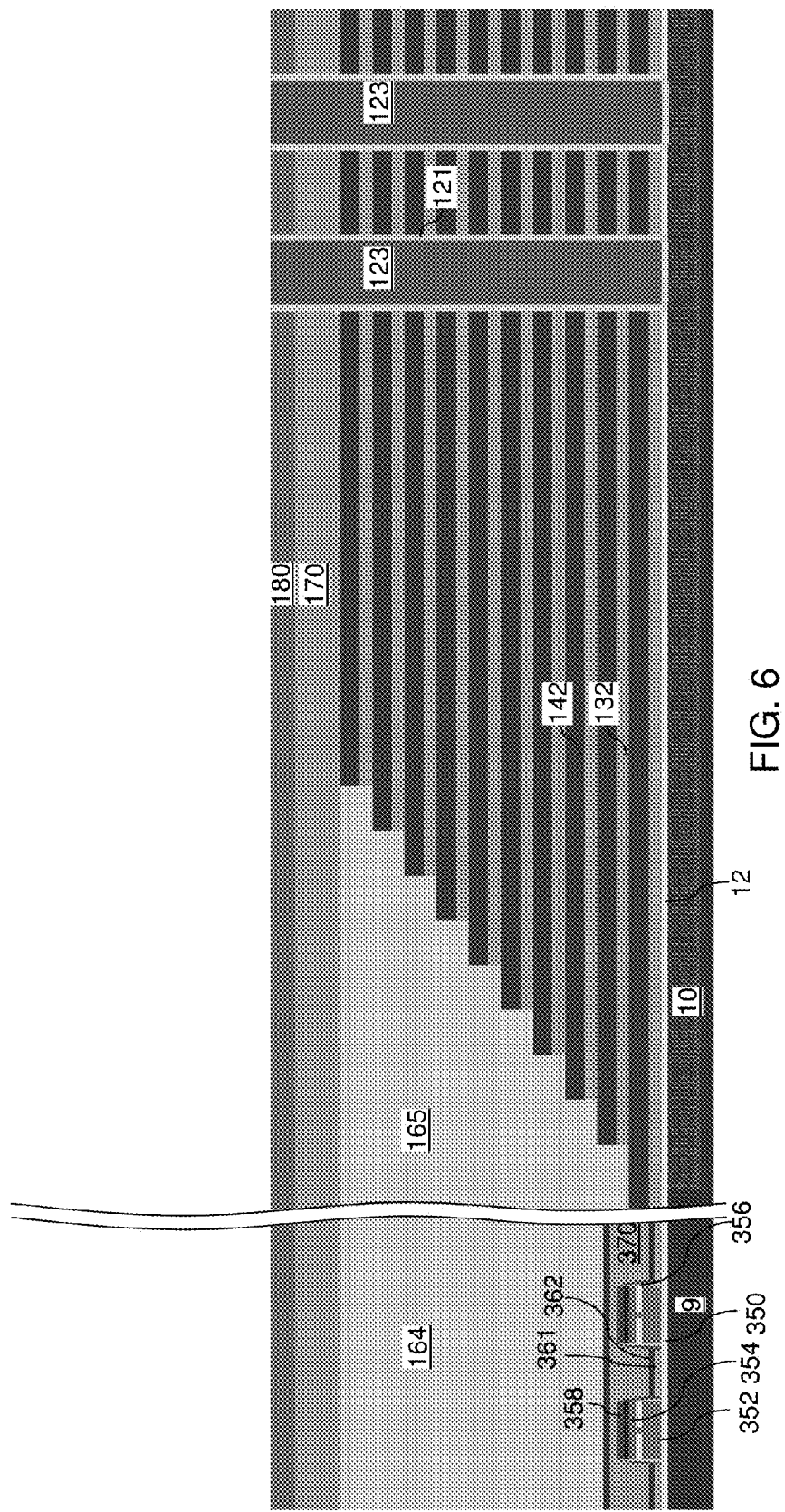
FIG. 6 is a vertical cross-sectional view of the first exemplary structure after formation of sacrificial memory opening fill structures according to the first embodiment of the present disclosure.

Referring to FIG. 6, a lower memory opening fill structure is formed within each lower memory opening 125. For example, sacrificial memory opening fill structures 123 are formed within each lower memory opening 125 by deposition of a sacrificial material that can be removed selective to the lower opening liners 121 and the interstack dielectric layer 180. The sacrificial material of the sacrificial memory opening fill structures 123 can include, for example, amorphous silicon, polysilicon, a silicon-germanium alloy, silicon nitride, amorphous carbon, diamond-like carbon, or another insulating material, such as a high etch rate oxide, including porous organosilicate glass. The sacrificial material of the sacrificial memory opening fill structures 123 can be deposited, for example, by chemical vapor deposition (CVD) or spin coating. Excess portions of the sacrificial material over the top surface of the interstack dielectric layer 180 can be removed, for example, by a planarization process along with any remaining horizontal portion of the lower opening liner 121. Each sacrificial memory opening fill structure 123 is a lower memory opening fill structure, i.e., a fill structure that fills the volume of a lower memory opening 125.

Figure 7:
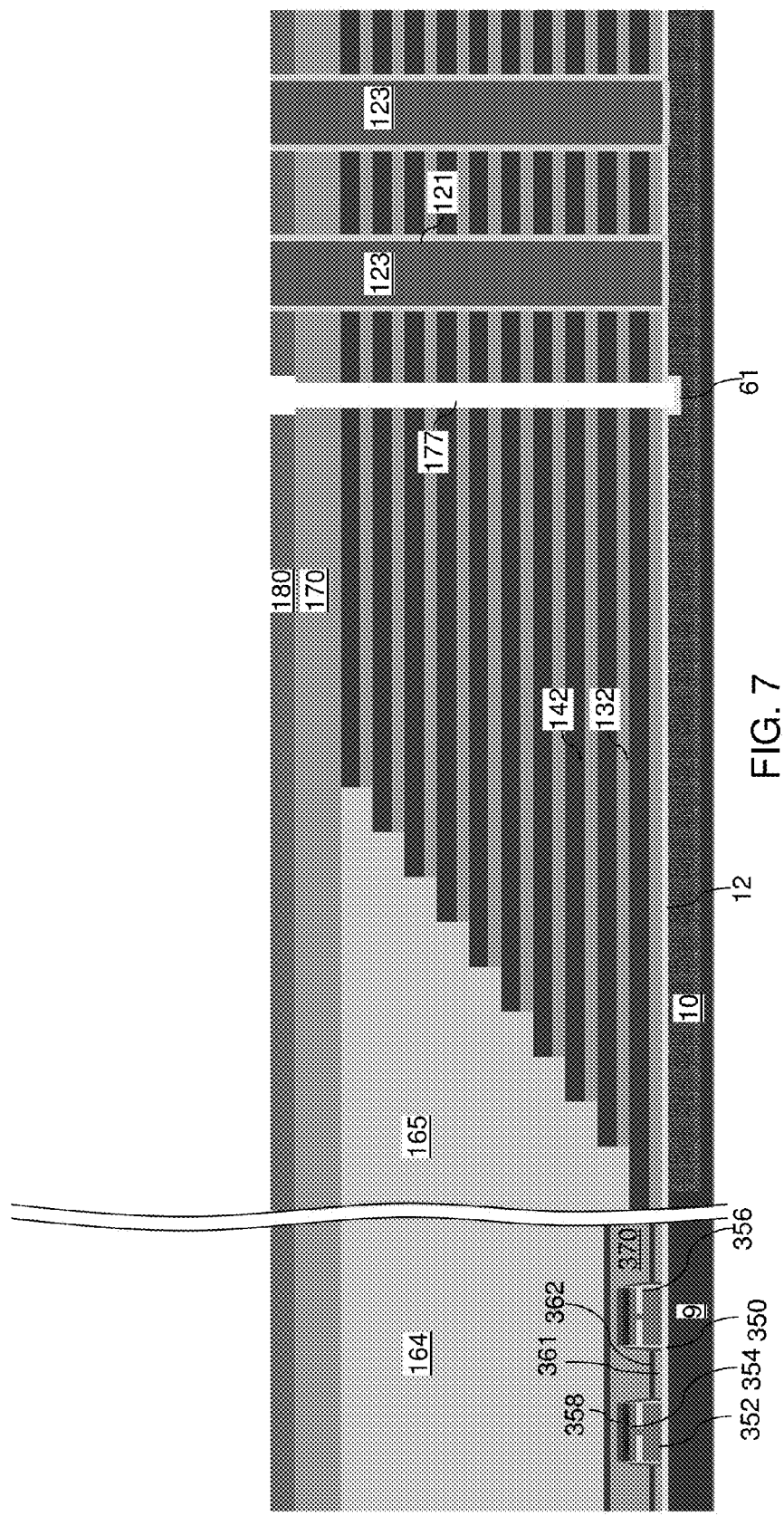
FIG. 7 is a vertical cross-sectional view of the first exemplary structure after formation of a lower backside contact trench according to the first embodiment of the present disclosure.

Referring to FIG. 7, a lower-level backside contact trench 177 can be formed through the interstack dielectric layer 180, the first-stack-cap dielectric layer 170, and the first stack (132, 142). The lower-level backside contact trench 177 can be a source contact trench in which a source contact via structure is subsequently formed. The lower-level backside contact trench 177 can be formed, for example, by applying and patterning a photoresist layer above the top surface of the interstack dielectric layer 180 to form an opening in an area adjacent to the sacrificial memory opening fill structure 123. The lower-level backside contact trench 177 contacts sidewalls of each layer within the first stack (132, 142). In one embodiment, the dielectric material of the interstack dielectric layer 180 can be laterally recessed more than the dielectric material of the first-stack-cap dielectric layer 170. The lateral width of the lower-level backside contact trench 177 can be greater at the level of the interstack dielectric layer 180 than at the level of the first-stack-cap dielectric layer 170. The photoresist layer can be subsequently removed, for example, by ashing.

In one embodiment, electrical dopants can be implanted to a surface portion of the doped semiconductor material layer 10 to form a source region 61. In one embodiment, the horizontal portion of the doped semiconductor material layer 10 from the source region 61 to the region underlying the sacrificial memory opening fill structures 123 can have a doping of a first conductivity type, and the source region 61 can have a doping of a second conductivity type that is the opposite of the first conductivity. For example, if the doped semiconductor material layer 10 has n-type doping, the source region 61 can have a p-type doping. The source region 61 is a conductive structure that contains a doped semiconductor material and is located underneath the first stack (132, 142).

Figure 8:
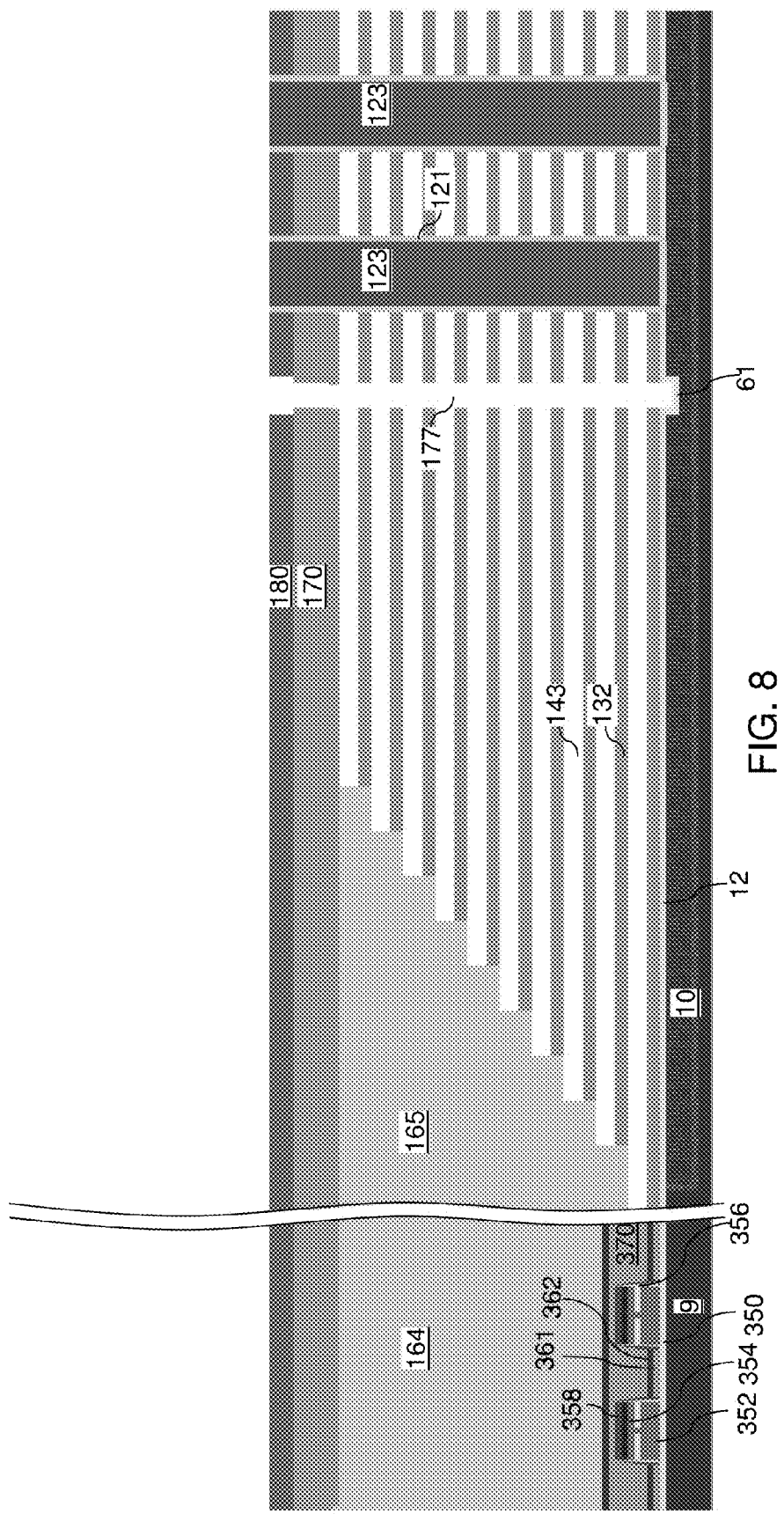
FIG. 8 is a vertical cross-sectional view of the first exemplary structure after removing the lower-level second material layers selective to the lower-level first material layers according to the first embodiment of the present disclosure.

Referring to FIG. 8, an etchant that selectively etches the second material of the first sacrificial material layers 142 with respect to the first material of the first electrically insulating layers 132 can be introduced into the lower-level backside contact trench 177, for example, employing an etch process. Backside recesses 143, which are also referred to as lower-level backside recesses, are formed in volumes from which the first sacrificial material layers 142 are removed. The removal of the second material of the first sacrificial material layers 142 can be selective to the first material of the first electrically insulating layers 132, the material of the retro-stepped first dielectric material portion 165, the material of the lower opening liners 121 (or the material of the sacrificial memory opening fill structures 123 if the lower opening liners 121 are not present), and the material of the source region 61 (or the material of the doped semiconductor material layer 10 in case a source region 61 is not formed). In one embodiment, the first sacrificial material layers 142 can include silicon nitride, and the materials of the first electrically insulating layers 132, the retro-stepped first dielectric material portion 165, and the lower opening liners 121 can be selected from silicon oxide and dielectric metal oxides. In another embodiment, the first sacrificial material layers 142 can include a semiconductor material such as polysilicon, and the materials of the first electrically insulating layers 132, the retro-stepped first dielectric material portion 65, and the lower opening liners 121 can be selected from silicon oxide, silicon nitride, and dielectric metal oxides. In this case, the depth of the lower-level backside contact trench 177 can be modified so that the bottommost surface of the lower-level backside contact trench 177 is located within the dielectric pad layer 12, i.e., to avoid physical exposure of the top surface of the semiconductor substrate layer 10 until after formation of electrically conductive layers.

The etch process that removes the second material selective to the first material and the lower opening liners 121 can be a wet etch process employing a wet etch solution, or can be a gas phase (dry) etch process in which the etchant is introduced in a vapor phase into the lower-level backside contact trench 177. For example, if the first sacrificial material layers 142 include silicon nitride, the etch process can be a wet etch process in which the first exemplary structure is immersed within a wet etch tank including phosphoric acid, which etches silicon nitride selective to silicon oxide, silicon, and various other materials employed in the art. The dielectric pillar structures 163 (see FIGS. 3 and 4) provide structural support to the first exemplary structure along with the retro-stepped first dielectric material portion 165 and the sacrificial memory opening fill structures 123 while the backside recesses 143 are formed within volumes previously occupied by the first sacrificial material layers 142.

Each backside recess 143 can be a laterally extending cavity having a lateral dimension that is greater than the vertical extent of the cavity. In other words, the lateral dimension of each backside recess 143 can be greater than the height of the backside recess 143. A plurality of backside recesses 143 can be formed in the volumes from which the second material of the first sacrificial material layers 142 is removed. The lower-level memory openings in which the sacrificial memory opening fill structures 123 are formed are herein referred to as front side recesses or front side cavities in contrast with the backside recesses 143. In one embodiment, the device region comprises an array of monolithic three-dimensional NAND strings having a plurality of device levels disposed above the substrate (9, 10). In this case, each backside recess 143 can define a space for receiving a respective word line of the array of monolithic three-dimensional NAND strings.

Each of the plurality of backside recesses 143 can extend substantially parallel to the top surface of the substrate (9, 10). A backside recess 143 can be vertically bounded by a top surface of an underlying first electrically insulating layer 132 and a bottom surface of an overlying first electrically insulating layer 132. In one embodiment, each backside recess 143 can have a uniform height throughout.

Figure 9:
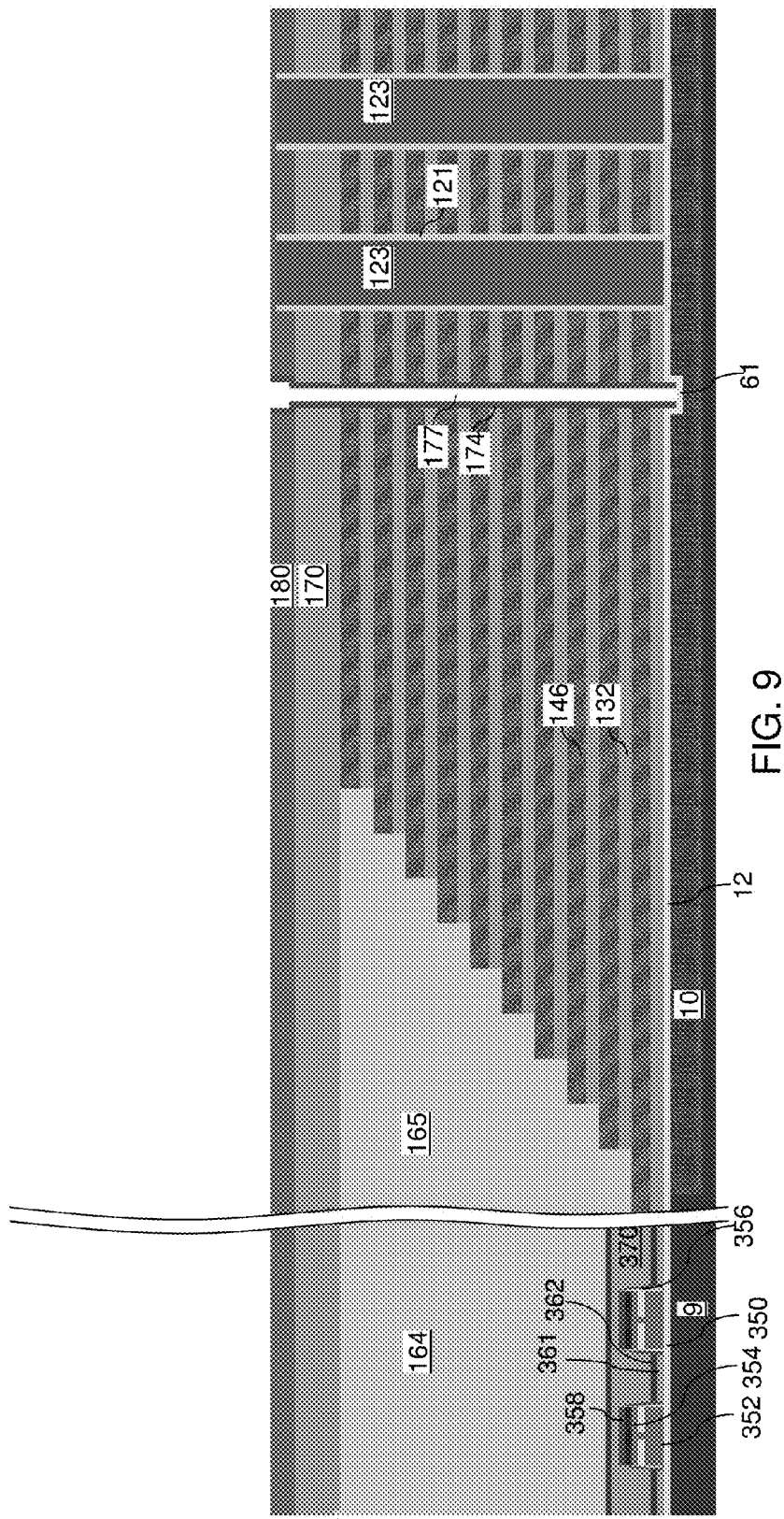
FIG. 9 is a vertical cross-sectional view of the first exemplary structure after formation of first electrically conductive layers and a lower-level insulating spacer according to the first embodiment of the present disclosure.

Referring to FIG. 9, a conductive material can be deposited in the plurality of backside recesses 143, on sidewalls of the at least one the lower-level backside contact trench 177, and over the interstack dielectric layer 180. As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 143 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 143 can be selected from tungsten and a combination of titanium nitride and tungsten. In one embodiment, the conductive material can be deposited by chemical vapor deposition. A plurality of first electrically conductive layers 146 is formed in the backside recesses 143.

The deposited conductive material can be etched back from the sidewalls of each lower-level backside contact trench 177 and from above the interstack dielectric layer 180. Each first electrically conductive layer 146, which is located outside the volume of the backside contact cavity, can remain in its respective level. The first electrically conductive layers 146 can include at least control gate level electrically conductive layers, which function as a combination of a plurality of control gate electrodes and a word line electrically connecting, i.e., electrically shorting, the plurality of control gate electrodes. Each control gate level electrically conductive layer can be a word line that functions as a common control gate electrode for the plurality of vertical memory devices. The lower stack structure comprises a first stack (132, 146) of alternating layers including the first electrically insulating layers 132 and the first electrically conductive layers 146.

A lower-level insulating spacer 174 can be formed on the sidewalls of the lower-level backside contact trench 177 by deposition of a contiguous dielectric material layer and an anisotropic etch of its horizontal portions. The lower-level insulating spacer 174 includes a dielectric material, which can comprise, for example, silicon oxide, silicon nitride, a dielectric metal oxide, a dielectric metal oxynitride, or a combination thereof. The thickness of the lower-level insulating spacer 174 can be in a range from 1 nm to 50 nm, although lesser and greater thicknesses can also be employed. In one embodiment, the thickness of the lower-level insulating spacer 174 can be in a range from 3 nm to 10 nm.

Figure 10:
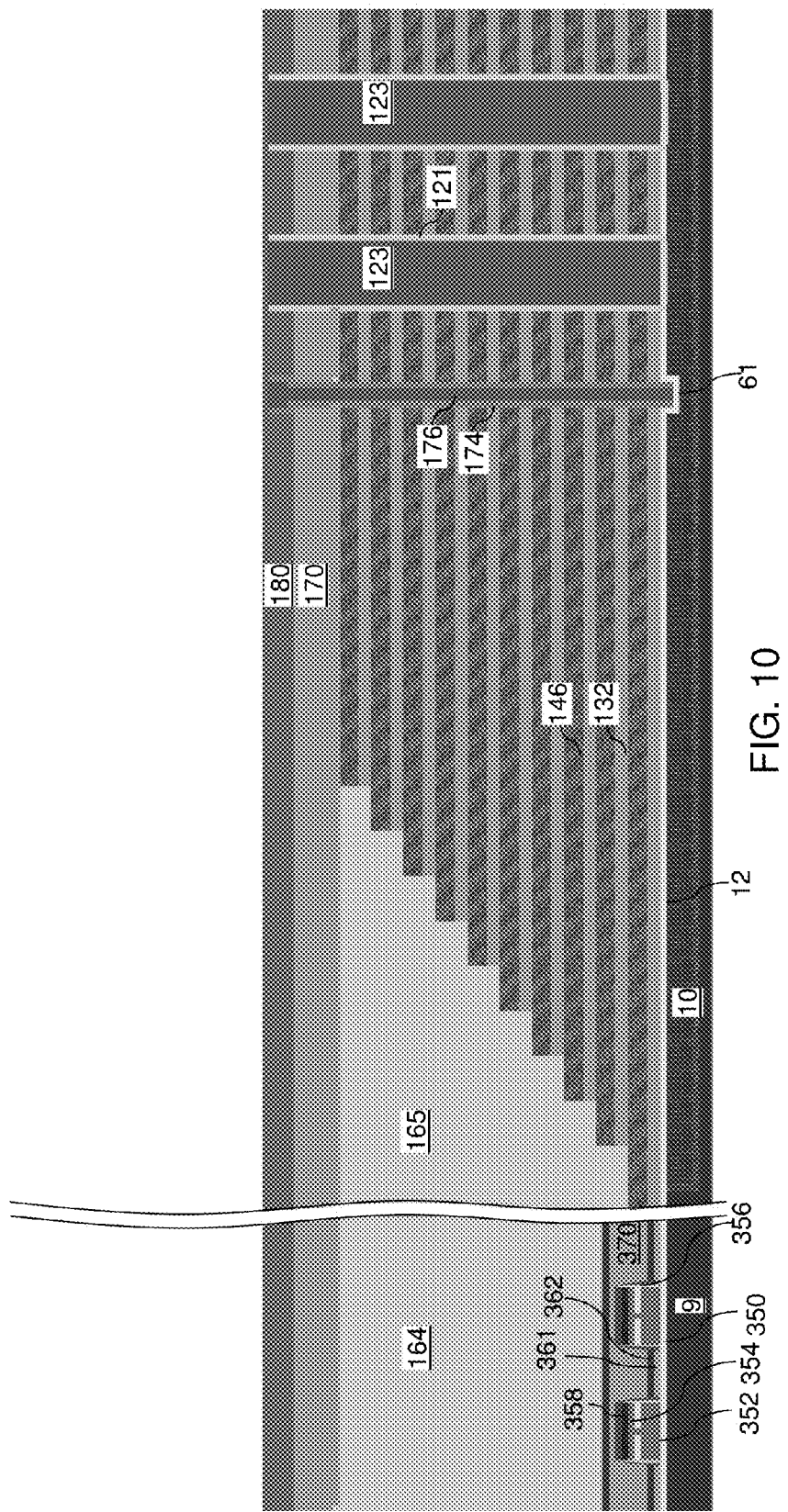
FIG. 10 is a vertical cross-sectional view of the first exemplary structure after formation of a sacrificial lower-level backside contact trench fill structure according to the first embodiment of the present disclosure.

Referring to FIG. 10, a sacrificial lower-level backside contact trench fill structure 176 can be formed by depositing a sacrificial material into the lower-level backside contact trench 177. The sacrificial material of the sacrificial lower-level backside contact trench fill structure 176 can include, for example, amorphous silicon, polysilicon, a silicon-germanium alloy, silicon nitride, amorphous carbon, diamond-like carbon, or another insulating material, such as a high etch rate oxide, including porous organosilicate glass. In one embodiment, the sacrificial material of the backside contact trench fill structure 176 can be the same as the sacrificial material of the sacrificial memory opening fill structures 123. In another embodiment, the sacrificial material of the backside contact trench fill structure 176 can be different from the sacrificial material of the sacrificial memory opening fill structures 123. The sacrificial material of the backside contact trench fill structure 176 can be deposited, for example, by chemical vapor deposition (CVD) or spin coating. Excess portions of the sacrificial material over the top surface of the interstack dielectric layer 180 can be removed, for example, by a planarization process. Each sacrificial lower-level backside contact trench fill structure 176 is a fill structure that fills the volume of the lower-level backside contact trench 177.

Figure 11:
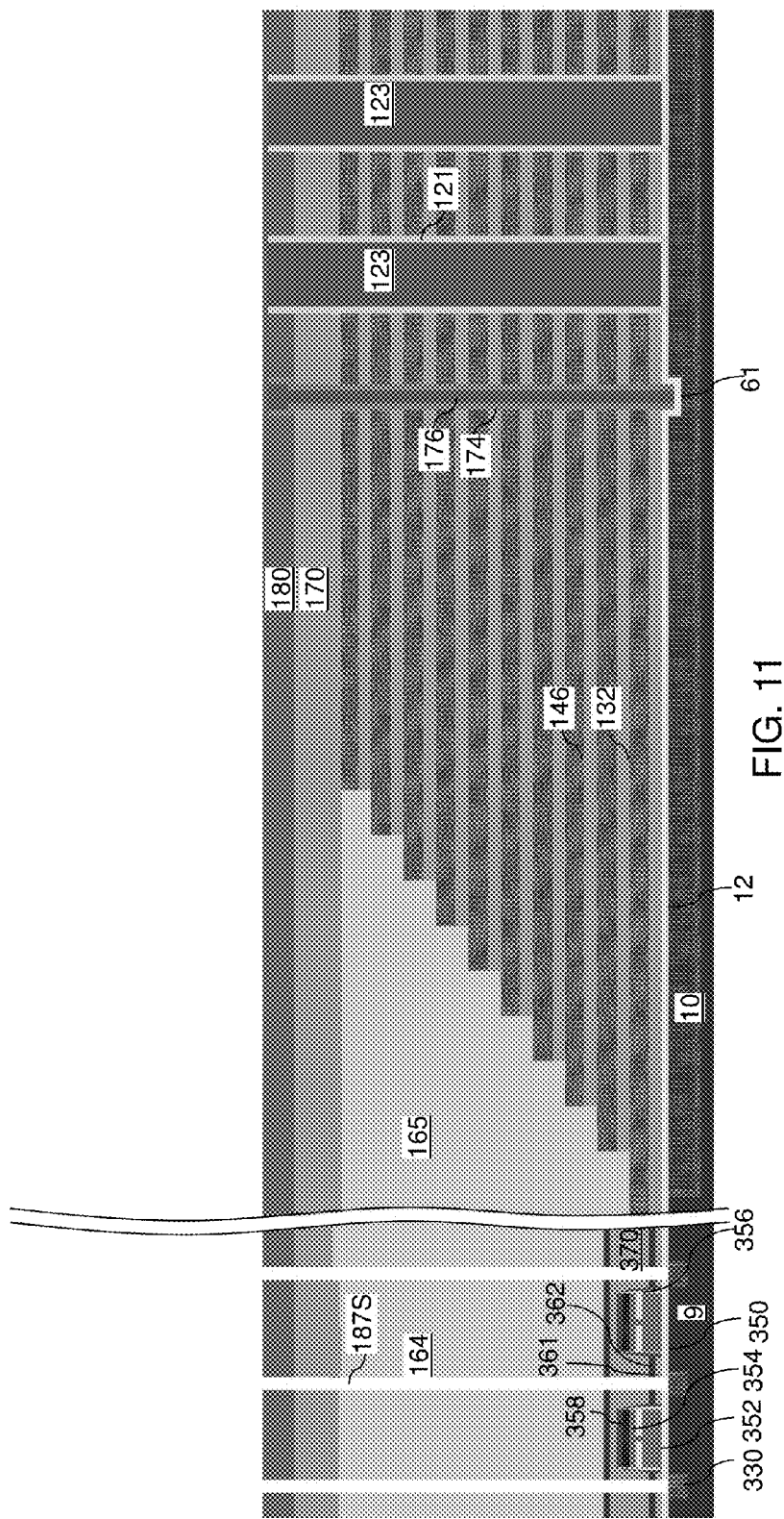
FIG. 11 is a vertical cross-sectional view of the first exemplary structure after formation of substrate contact via cavities according to the first embodiment of the present disclosure.

Referring to FIG. 11, first substrate contact via cavities 187S can be formed through the interstack dielectric layer 180, the first-stack-cap dielectric layer 170, the lower-level dielectric fill material layer 164, and the planarization dielectric layer 370 to portions of the top surfaces of the substrate semiconductor layer 9. The first substrate contact via cavities 187S can be formed, for example, by application and patterning of a photoresist layer to form openings therein, and by transfer of the pattern through the underlying dielectric layers employing at least one anisotropic etch.

Electrical dopants can be implanted into surface portions of the substrate semiconductor layer 9 by ion implantation, plasma doping, and/or gas phase doping to form various doped semiconductor portions, which can include, for example, active regions 330. The active regions 330 include source regions and drain regions of the various field effect transistors in the peripheral device region. Each active region 330 can be a conductive structure containing a doped semiconductor material and located a horizontal plane including the bottommost surface of the first stack (132, 142). The patterned photoresist layer can be subsequently removed, for example, by ashing.

Figure 12:
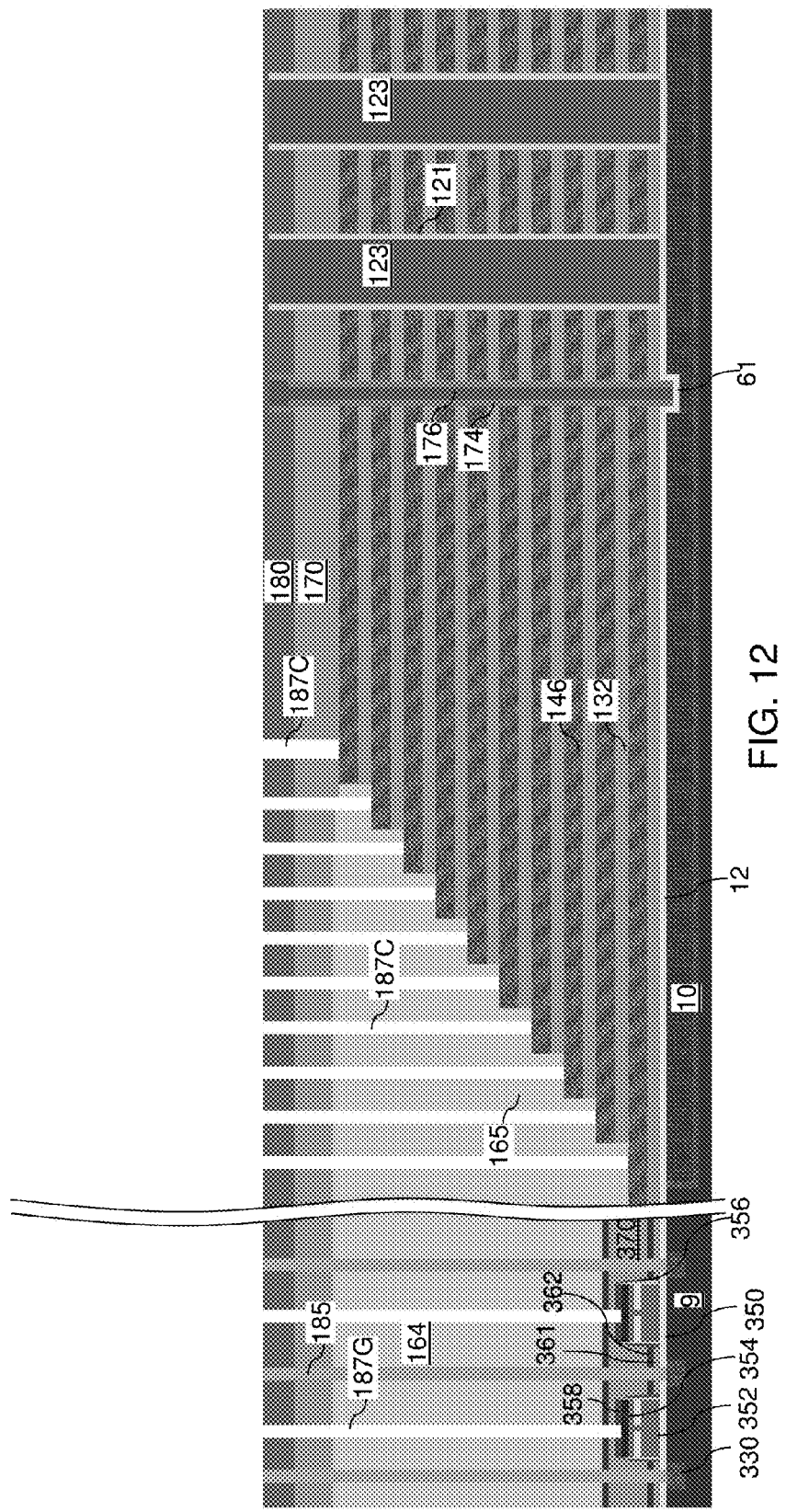
FIG. 12 is a vertical cross-sectional view of the first exemplary structure after formation of temporary substrate contact via fill structures, control gate contact via cavities, and gate contact via cavities according to the first embodiment of the present disclosure.

Referring to FIG. 12, temporary substrate contact via fill structures 185 can be formed by filling the first substrate contact via cavities 187S with a temporary material, i.e., a material that is subsequently removed. The temporary substrate contact via fill structures 185 are via fill structures, i.e., structures that fill via cavities, for filling the first substrate contact via cavities 187S. The temporary material of the temporary substrate contact via fill structures 185 is a material that can be subsequently removed selective to the dielectric materials of the interstack dielectric layer 180, the first-stack-cap dielectric layer 170, the lower-level dielectric fill material layer 164, and the planarization dielectric layer 370. In one embodiment, the temporary material can be a photoresist material, an organic polymer, or an inorganic polymer.

Excess portions of the temporary material above the top surface of the interstack dielectric layer 180 can be removed, for example, by a planarization process.

Subsequently, first control gate contact via cavities 187C and first gate contact via cavities 187G can be formed through the interstack dielectric layer 180, the first-stack-cap dielectric layer 170, the lower-level dielectric fill material layer 164, and the planarization dielectric layer 370 to the gate electrodes (352, 354) of the peripheral devices and to the top surfaces of the first electrically conductive layers 146. The first control gate contact via cavities 187C and the first gate contact via cavities 187G can be formed, for example, by application and patterning of a photoresist layer to form openings therein, and by transfer of the pattern through the underlying dielectric layers employing at least one anisotropic etch. The chemistry of the step of the anisotropic etch that etches the lower-level dielectric fill material layer 164 and the first dielectric material portion 165 stops on the materials of the first electrically conductive layers 146 or the gate electrodes (352, 354). If the first electrically conductive layers 146 and the gate electrodes (352, 354) comprise metallic materials, the chemistry of the step of the anisotropic etch that etches the lower-level dielectric fill material layer 164 and the first dielectric material portion 165 can have an etch chemistry that is selective to the metallic materials, i.e., that an etch chemistry that does not etch the metallic materials.

Figure 13:
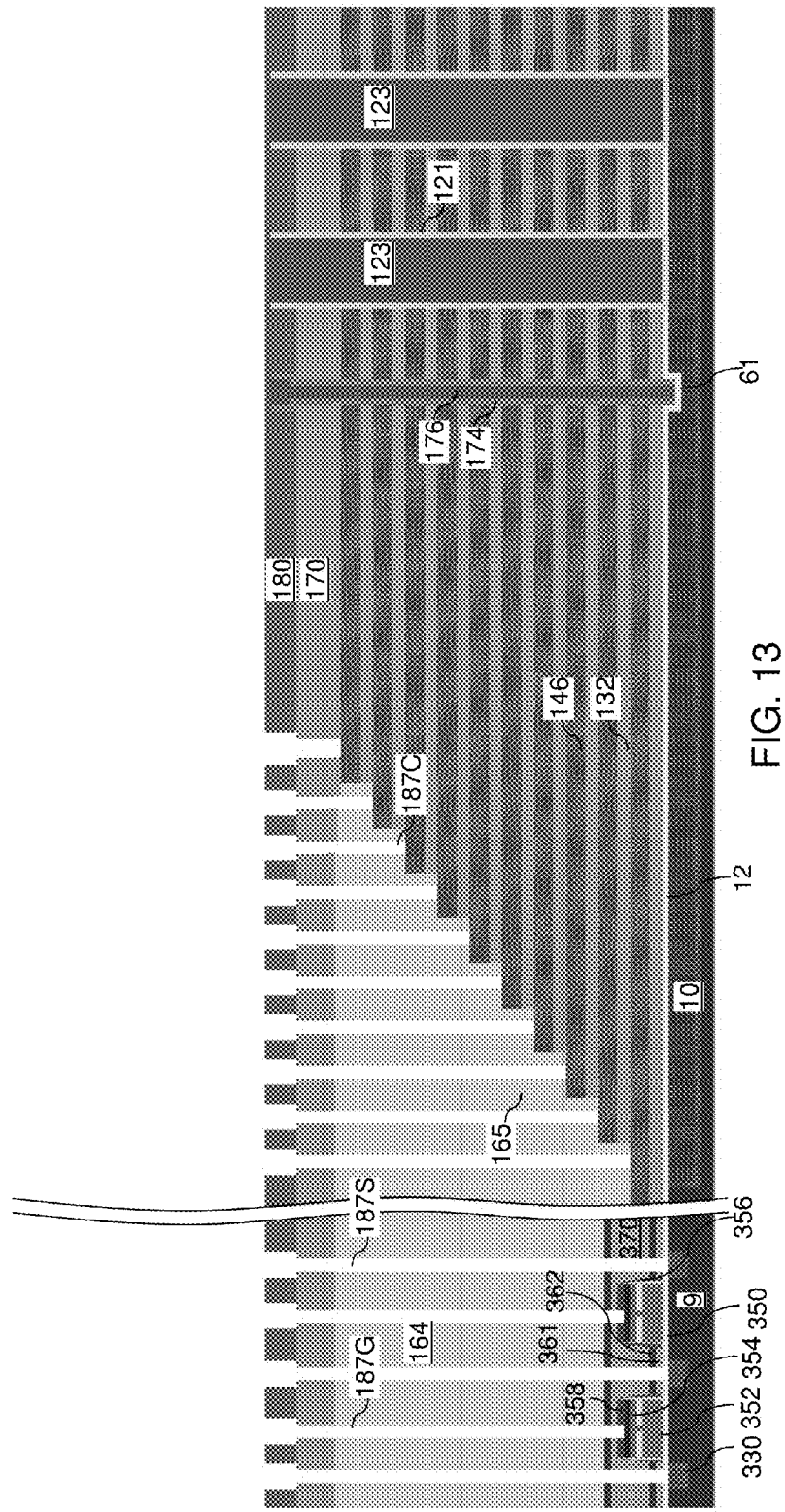
FIG. 13 is a vertical cross-sectional view of the first exemplary structure after removal of the sacrificial substrate contact via fill structures according to the first embodiment of the present disclosure.

Referring to FIG. 13, the temporary substrate contact via fill structures 185 can be removed selective to the dielectric materials of the interstack dielectric layer 180, the first-stack-cap dielectric layer 170, the lower-level dielectric fill material layer 164, and the planarization dielectric layer 370. The temporary substrate contact via fill structures 185 can be removed, for example, by ashing. The first substrate contact via cavities 187S become empty after removal of the temporary substrate contact via fill structures 185. The width of the cavities 187 may be greater in layer 180 than in the underlying layers (e.g., in layer 170 or in the lower stack).

Figure 14:
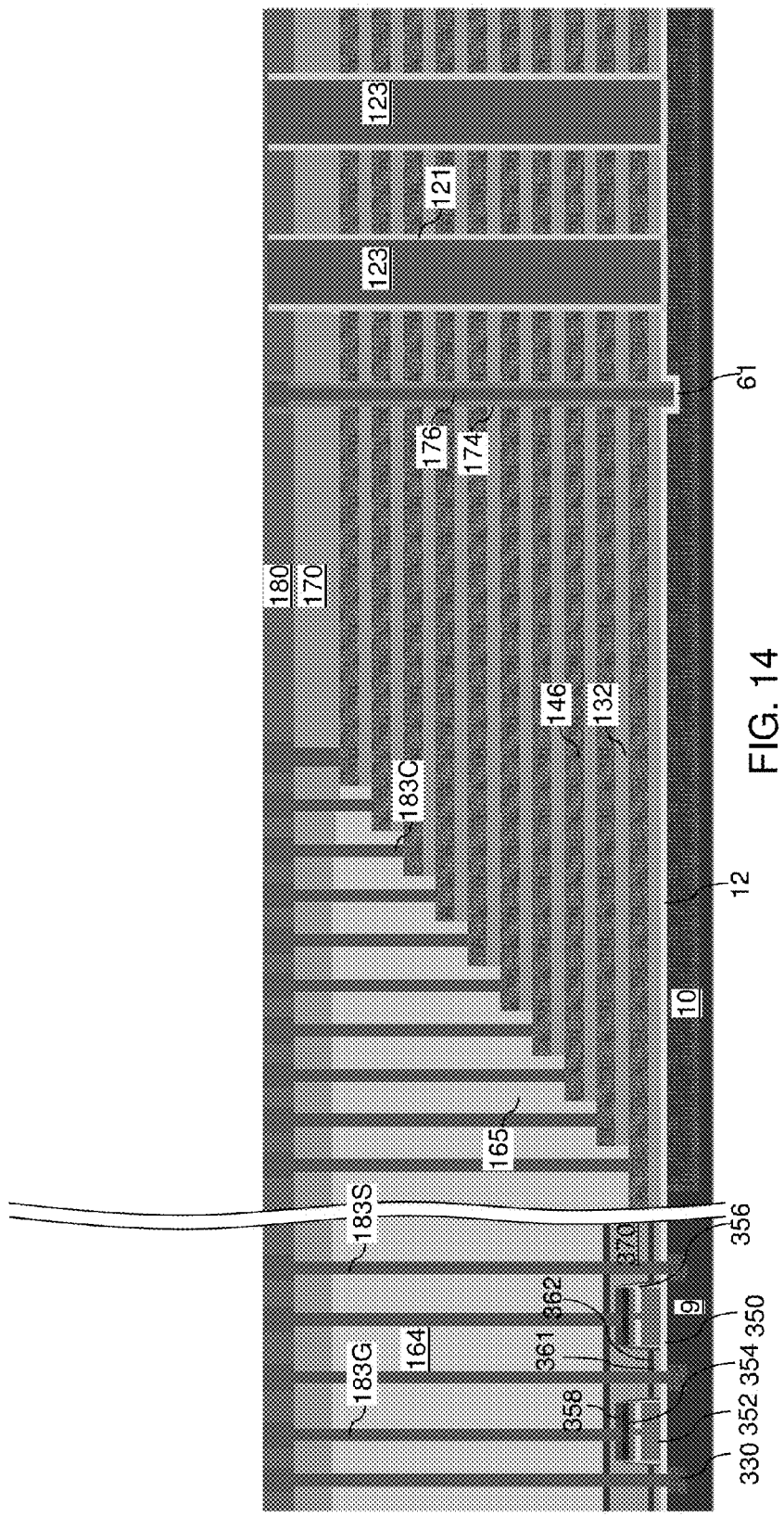
FIG. 14 is a vertical cross-sectional view of the first exemplary structure after formation of sacrificial contact via fill structures according to the first embodiment of the present disclosure.

Referring to FIG. 14, a sacrificial material is deposited within the various via cavities (187C, 187S, 187G) to form various sacrificial contact via fill structures (183C, 183S, 183G). The sacrificial material of the various sacrificial contact via fill structures (183C, 183S, 183G) are materials that can withstand the elevated temperatures of subsequent processing processes employed to form an upper stack structure. The various sacrificial contact via fill structures (183C, 183S, 183G) include sacrificial control gate contact via fill structures 183C that fill the first control gate contact via cavities 187C, sacrificial substrate contact via fill structures 183S that fill the first substrate contact via cavities 187S, and sacrificial gate contact via fill structures 183G that fill the first gate contact via cavities 187G.

The sacrificial material of the various sacrificial contact via fill structures (183C, 183S, 183G) can include, for example, amorphous silicon, polysilicon, a silicon-germanium alloy, silicon nitride, amorphous carbon, diamond-like carbon, or another insulating material, such as a high etch rate oxide, including porous organosilicate glass. In one embodiment, the sacrificial material of the various sacrificial contact via fill structures (183C, 183S, 183G) can be the same as the sacrificial materials of the sacrificial memory opening fill structures 123 and/or the backside contact trench fill structure 176. In another embodiment, the sacrificial material of the various sacrificial contact via fill structures (183C, 183S, 183G) can be different from the sacrificial material of the sacrificial memory opening fill structures 123 and/or the backside contact trench fill structure 176. The sacrificial material of the various sacrificial contact via fill structures (183C, 183S, 183G) can be deposited, for example, by chemical vapor deposition (CVD) or spin coating. Excess portions of the sacrificial material over the top surface of the interstack dielectric layer 180 can be removed, for example, by a planarization process. Each various sacrificial contact via fill structure (183C, 183S, 183G) is a fill structure that fills the volume of a contact via cavity.

Figure 15:
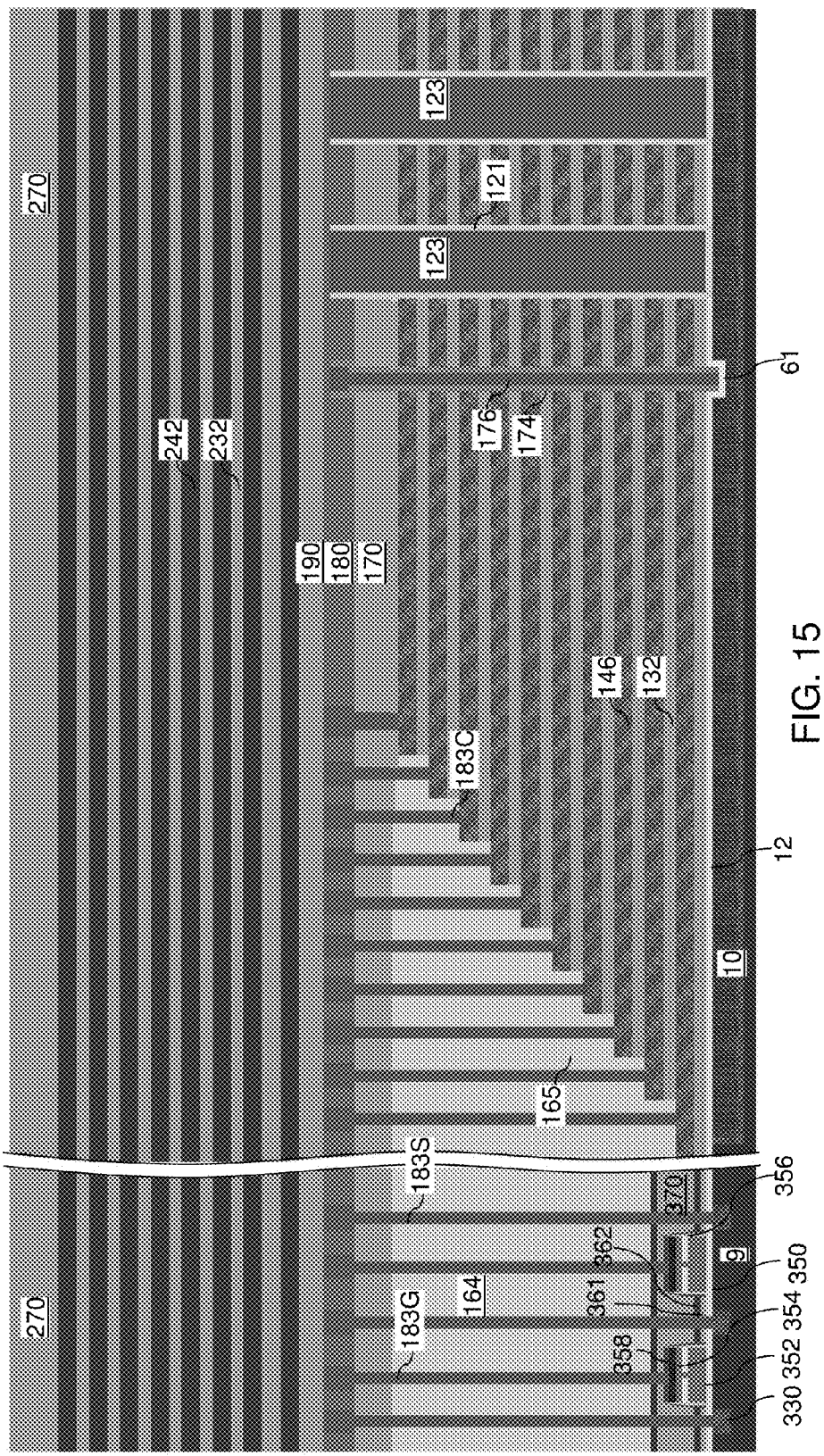
FIG. 15 is a vertical cross-sectional view of the first exemplary structure after formation of an upper-level stack of an alternating plurality of first upper-level material layers and second upper-level material layers, and an upper-level dielectric cap layer according to the first embodiment of the present disclosure.

Referring to FIG. 15, a second-stack-base dielectric layer 190 can be formed over the lower stack structure, the first-stack-cap dielectric layer 170, and the interstack dielectric layer 180. The second-stack-base dielectric layer 190 constitutes a base structure, i.e., a bottom portion, of a second stack structure, i.e., an upper stack structure to be formed.

The second-stack-base dielectric layer 190 includes a dielectric material, which can be, for example, a silicon oxide such as undoped silicate glass (USG). The thickness of the second-stack-base dielectric layer 190 can be in a range from 30 nm to 100 nm, although lesser and greater thicknesses can also be employed. In one embodiment, the second-stack-base dielectric layer 190 can comprise a same dielectric material as the first-stack-cap dielectric layer 170. The materials of the first-stack-cap dielectric layer 170, the interstack dielectric layer 180, and the second-stack-base dielectric layer 190 are selected such that the interstack dielectric layer 180 comprises a dielectric material that can be etched at a faster rate than the dielectric materials of the first-stack-cap dielectric layer 170 and the second-stack-base dielectric layer 190 in an isotropic etch such as a wet etch employing hydrofluoric acid. For example, if the first-stack-cap dielectric layer 170 and the second-stack-base dielectric layer 190 comprise undoped silicate glass (USG), the interstack dielectric layer 180 can comprise a doped silicate glass such as borosilicate glass (BSG) or a borophosphosilicate glass (BPSG), or can comprise porous or non-porous organosilicate glass (OSG).

The first-stack-cap dielectric layer 170 and the second-stack-base dielectric layer 190 are optional structures, and as such, may be omitted. The combination of the first-stack-cap dielectric layer 170, the interstack dielectric layer 180, and the second-stack-base dielectric layer 190 collectively constitute at least one dielectric material layer (170, 180, 190) having a thickness that is greater than the maximum thickness of the first electrically insulating layers 132, and greater than the thickness of second electrically insulating layers 232 to be subsequently formed in the upper stack structure.

A stack of an alternating plurality of third material layers and fourth material layers is subsequently formed as components of the upper stack structure. Because the third material layers and the fourth material layers are employed to form an upper-level stack of a multi-stack structure, the third material layers and the fourth material layers are herein referred to as upper-level first material layers and upper-level second material layers, respectively. The stack formed by the upper-level first material layers and the upper-level second material layers is herein referred to as an upper-level stack (232, 242), or a second stack (232, 242).

Each upper-level first material layer includes a third material, and each upper-level second material layer includes a fourth material that is different from the third material. In one embodiment, the third material can be the same as the first material of a lower-level first material layer, and the fourth material can be the same as the second material of a lower-level second material layer. In one embodiment, each upper-level first material layer can be a second electrically insulating layer 232 including a second electrically insulating material, and each upper-level second material layer can be a second sacrificial material layer 242 including a second sacrificial material. In this case, the stack can include an alternating plurality of second electrically insulating layers 232 and second sacrificial material layers 242. In one embodiment, the second electrically insulating material can be the same as the first electrically insulating material, and the second sacrificial material can be the same as the first sacrificial material.

In one embodiment, the second stack (232, 242) can include second electrically insulating layers 232 composed of the third material, and second sacrificial material layers 242 composed of the fourth material, which is different from the third material. The third material of the second electrically insulating layers 232 can be at least one electrically insulating material. Electrically insulating materials that can be employed for the second electrically insulating layers 232 can be any material that can be employed for the first electrically insulating layers 132. The fourth material of the second sacrificial material layers 242 is a sacrificial material that can be removed selective to the third material of the second electrically insulating layers 232. Sacrificial materials that can be employed for the second sacrificial material layers 242 can be any material that can be employed for the first sacrificial material layers 142.

A second-stack-cap dielectric layer 270 can be formed over the second stack (232, 242). The second-stack-cap dielectric layer 270 includes a dielectric material, which can be, for example, a silicon oxide such as undoped silicate glass (USG). The second-stack-cap dielectric layer 270 is a capping dielectric layer for the second stack (232, 242). The thickness of the second-stack-cap dielectric layer 270 can be in a range from 30 nm to 100 nm, although lesser and greater thicknesses can also be employed.

Figure 16:
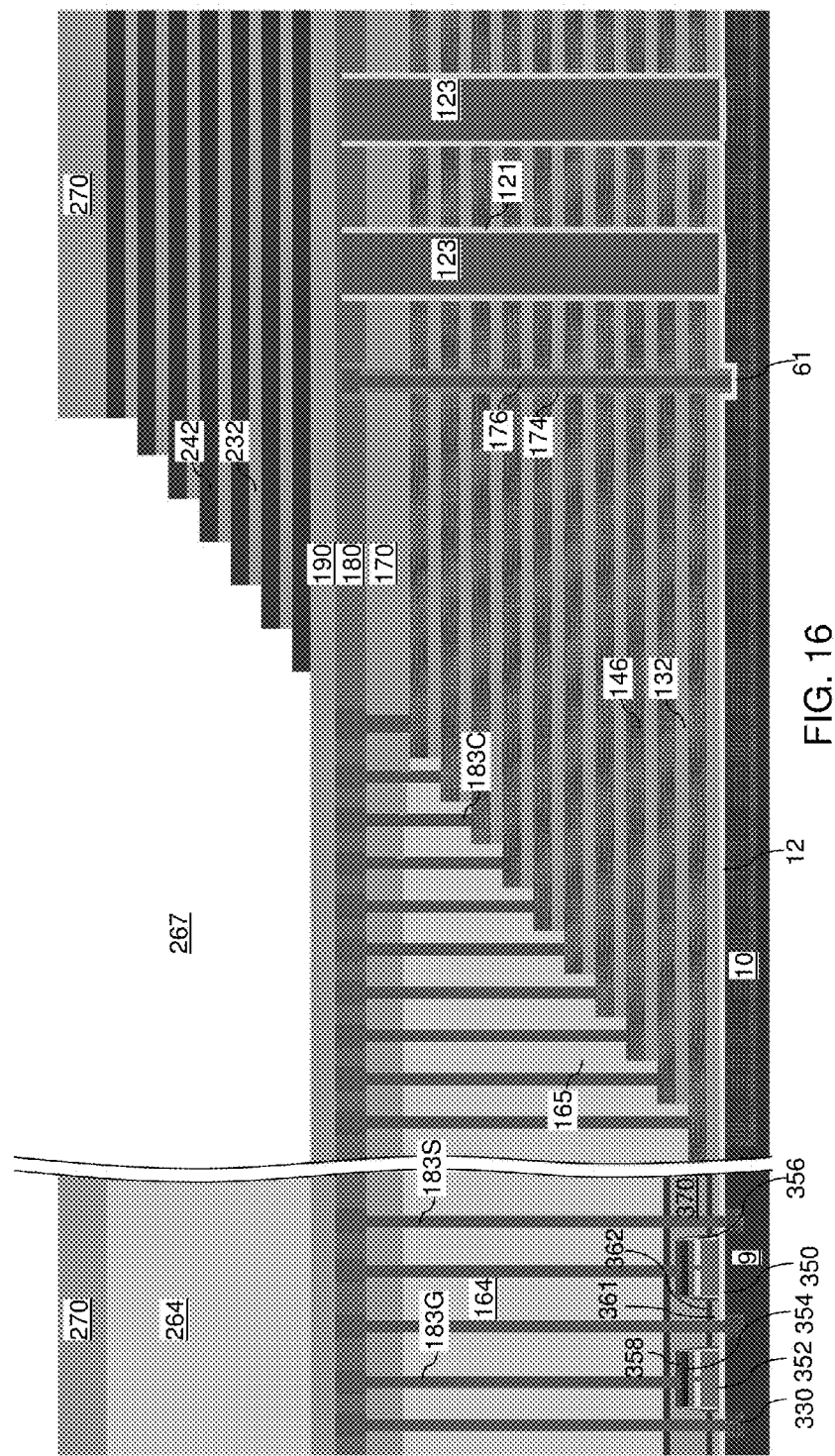
FIG. 16 is a vertical cross-sectional view of the first exemplary structure after formation of a stepped contact cavity according to the first embodiment of the present disclosure.

Referring to FIG. 16, an upper-level dielectric fill material layer 264 can be formed in the upper level structure over the region of the peripheral devices, which can be over the region of the lower-level dielectric fill material layers 164. Excess portions of the upper-level dielectric fill material layer 264 can be removed from above the topmost surface of the second stack (232, 242), for example, by chemical mechanical planarization.

Additional stepped surfaces are formed in another region of the first exemplary structure. The additional stepped surfaces are herein referred to second stepped surfaces, and can be formed, for example, by forming a mask layer with an opening therein, etching a cavity within the levels of the topmost second sacrificial material layer 242 and the topmost second electrically insulating layer 232, and iteratively expanding the etched area and vertically recessing the cavity by etching a pair of a second electrically insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second electrically insulating layer 232 laterally protrudes farther than any overlying second electrically insulating layer 232 in the etched region. The etched region is a contact region of the second stack (232, 242). The cavity is herein referred to as a second stepped cavity 267. The second stepped cavity 267 includes a first cavity portion, which overlies the first stepped cavity and the retro-stepped first dielectric material portion 165 and from which all layers of the second stack (232, 242) are removed. The second stepped cavity 267 further includes a second cavity portion including stepped surfaces of the second stack (232, 242).

Figure 17:
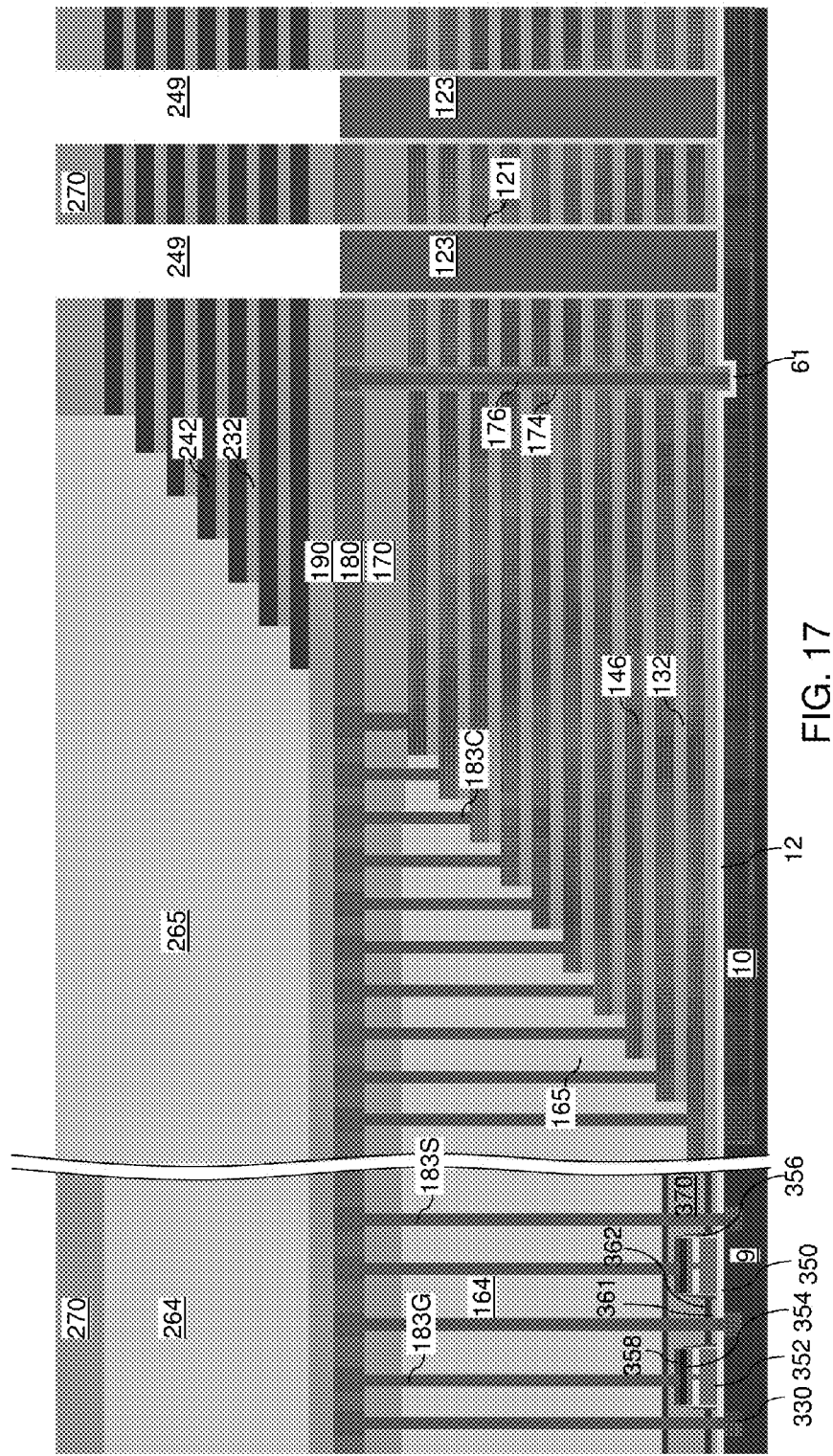
FIG. 17 is a vertical cross-sectional view of the first exemplary structure after formation of a retro-stepped dielectric material portion and upper-level memory openings according to the first embodiment of the present disclosure.

Referring to FIG. 17, a dielectric material is deposited to fill the second stepped cavity 267. Excess portions of the dielectric material overlying the topmost surface of the second stack (232, 242) are removed, for example, by chemical mechanical planarization. The remaining portion of the deposited dielectric material forms a second dielectric material portion 265. The second dielectric material portion 265 is located on, and over, the second stepped surfaces of the second stack (232, 242).

A lithographic material stack (not shown) including at least a photoresist layer can be formed over the second stack (232, 242), and can be lithographically patterned to form openings that overlie a respective sacrificial memory opening fill structure 123. The pattern in the lithographic material stack can be transferred through the entirety of the second stack (232, 242) by at least one anisotropic etch that employs the patterned lithographic material stack as an etch mask. Portions of the second stack (232, 242) underlying the openings in the patterned lithographic material stack are etched to form upper memory openings 249. In other words, the transfer of the pattern in the patterned lithographic material stack through the second stack (232, 242) forms the upper memory openings 249 that extend through the second stack (232, 242). The chemistry of the anisotropic etch process employed to etch through the materials of the second stack (232, 242) can alternate to optimize etching of the third and fourth materials in the second stack (232, 242). The anisotropic etch can be, for example, a series of reactive ion etches. The sidewalls of the upper memory openings 249 can be substantially vertical, or can be tapered. A top surface of the underlying sacrificial memory opening fill structure 123 is physically exposed at the bottom of each upper memory opening 249.

Figure 18:
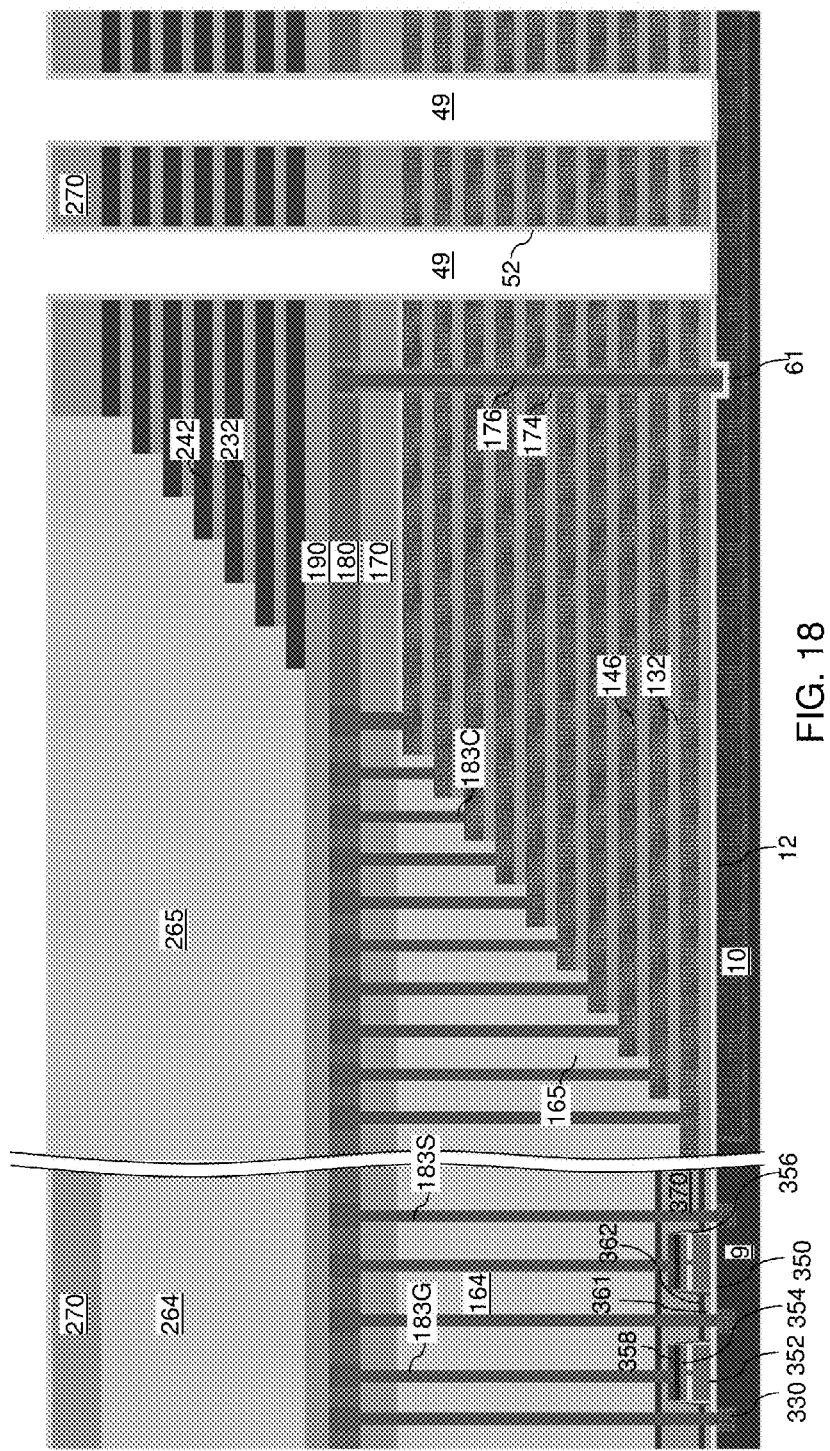
FIG. 18 is a vertical cross-sectional view of the first exemplary structure after formation of a multi-level memory opening according to the first embodiment of the present disclosure.

Referring to FIG. 18, each lower memory opening fill structure, i.e., each sacrificial memory opening fill structure 123, is removed from underneath the upper memory openings 249. A selective etch process that removes the sacrificial material of the sacrificial memory opening fill structures 123 can be employed. In one embodiment, the lower opening liners 121 can be employed as etch stop layers. The selective etch process can be an isotropic etch process or an anisotropic etch process. Subsequently, the lower opening liners 121 can be removed, for example, by a isotropic etch such as a wet etch.

Memory openings 49 are formed in the combined volume of an upper-level memory opening 249 and an underlying lower-level memory opening 125 from which a sacrificial memory opening fill structure 123 is removed. Each memory opening 49 is a vertically adjoined pair of a lower memory opening 125 and an upper memory opening 249, and extends through the upper stack structure, the at least one dielectric material layer (170, 180, 190), and the lower stack structure. As such, the memory openings 49 are multi-level memory openings containing a first-level opening within the first stack (132, 146) and a second-level opening in the second stack (232, 242).

A blocking dielectric layer 52 can be formed in the sidewalls of the memory openings 49. Specifically, the blocking dielectric layer 52 can contact the sidewalls of the first stack (132, 146), the at least one dielectric material layer (170, 180, 190), and the second stack (232, 242). The blocking dielectric layer 52 may include one or more dielectric material layers that can function as the dielectric material(s) of a control gate dielectric between the control gate electrodes (which include the first electrically conductive layers 146 and second electrically conductive layers to be subsequently formed in the volumes of the second sacrificial material layers 242) and charge storage regions to be subsequently formed in a memory film. The blocking dielectric layer 52 can include silicon oxide, a dielectric metal oxide, a dielectric metal oxynitride, or a combination thereof. In one embodiment, the blocking dielectric layer 52 can include a stack of at least one silicon oxide layer and at least one dielectric metal oxide layer. The blocking dielectric layer 52 can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer 52 can be in a range from 6 nm to 24 nm, although lesser and greater thicknesses can also be employed. Alternatively, the blocking dielectric layer 52 may be omitted from the memory opening, and instead be formed through a backside contact trench and backside recesses prior to forming the first electrically conductive layers 146 and second electrically conductive layers.

Figure 19:
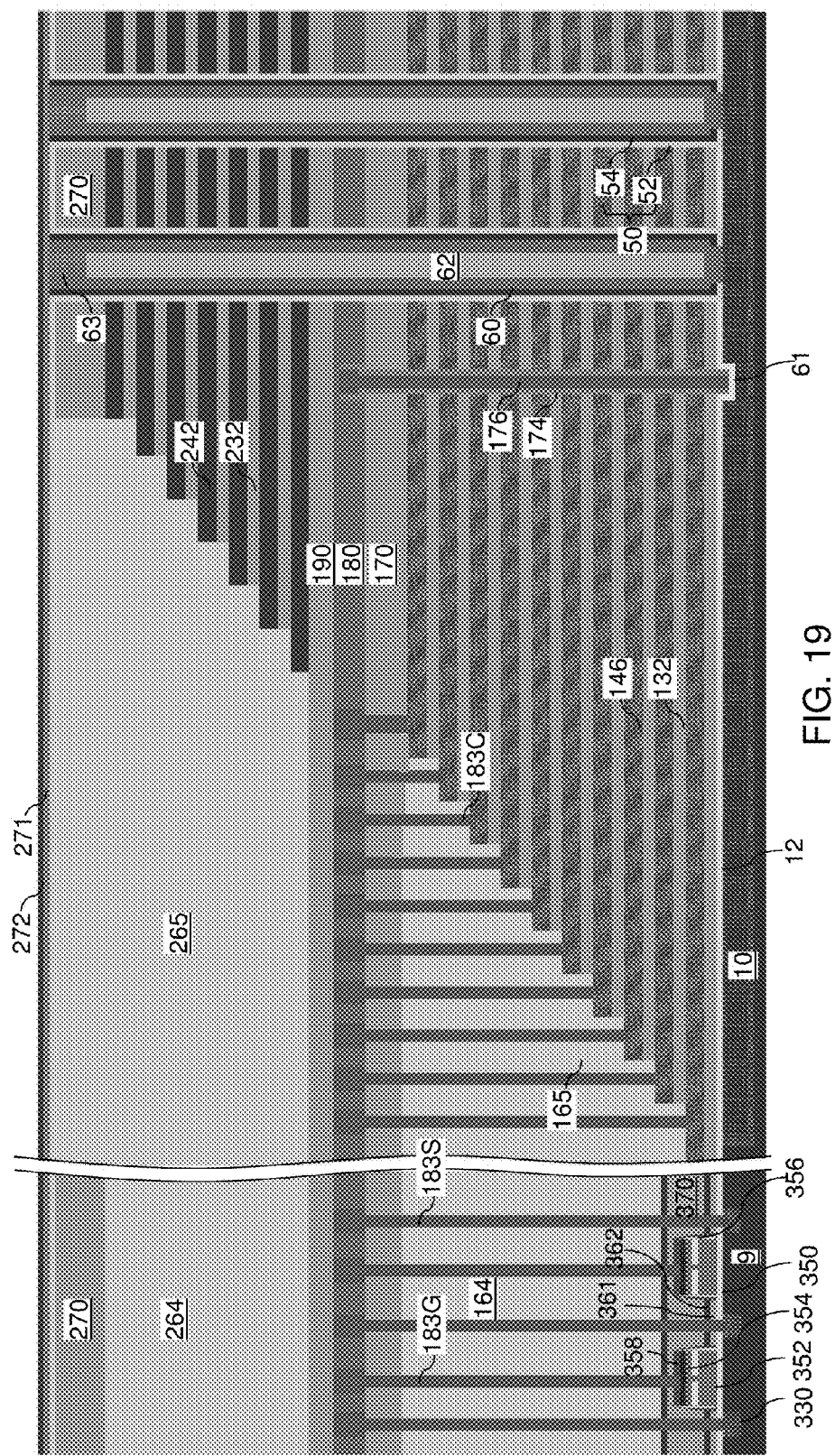
FIG. 19 is a vertical cross-sectional view of the first exemplary structure after formation of memory stack structures and at least one planarization stop layer according to the first embodiment of the present disclosure.

Referring to FIG. 19, a memory and tunneling layer 54 can be formed on the sidewalls of the blocking dielectric layer 52 within each memory opening 49. The memory and tunneling layer 54 can include a stack, from outside to inside, of a charge storage layer and a tunneling dielectric layer.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed. The blocking dielectric layer 52 and the memory and tunneling layer 54 are collectively referred to as a memory film 50.

An opening can be formed through each horizontal portion of the memory film 50 at the bottom of the memory openings 49 by an anisotropic etch. The horizontal portion of the memory film 50 can be removed from above the top surfaces of the second-stack-cap dielectric layer 270 and the second dielectric material portion 265.

A semiconductor channel 60 is formed within each memory opening 49 (which is a vertically adjoined pair of a lower memory opening and an upper memory opening) and directly on the inner sidewall of the respective memory film 50. The semiconductor channel 60 can be formed by depositing at least one semiconductor material on the inner sidewalls of the memory films 50 and on semiconductor surfaces of the doped or undoped semiconductor material layer 10 at the bottom of the memory openings 49. The semiconductor material of the semiconductor channel 60 can include a doped or undoped polycrystalline semiconductor material (such as doped polysilicon), or can include a doped or undoped amorphous semiconductor material (such as amorphous silicon) that can be subsequently converted into a doped or undoped polycrystalline semiconductor material after a suitable anneal at an elevated temperature. In one embodiment, each semiconductor channel 60 can be a single semiconductor channel extending through the upper stack structure, the at least one dielectric material layer (170, 180, 190), and the lower stack structure.

A dielectric core 62 can be formed within a cavity inside each semiconductor channel 60, for example, by deposition of a dielectric material such as silicon oxide, and subsequent planarization of the dielectric material. Planarization of the dielectric material can be performed to remove the portion of the deposited dielectric material from above the top surface of the horizontal plane including the top surface of the topmost layer of the upper stack structure. The planarization of the dielectric material can be performed, for example, by chemical mechanical planarization. The remaining dielectric material portions can be recessed below the top surface of the upper stack structure, for example, by a recess etch. Each remaining portion of the dielectric material inside a memory opening constitutes a dielectric core 62. The dielectric core 62 is an optional component, and a combination of a memory film 50 and a semiconductor channel 60 may completely fill a memory opening.

A drain region 63 can be formed on the top portion of each semiconductor channel 60, for example, by deposition of a doped semiconductor material and doping impurities by ion implantation method. The conductivity type of the drain regions 63 can be the same as the conductivity type of the source region 61. If the semiconductor channels 60 comprise a doped semiconductor material, the conductivity type of the source region 61 and the drain regions 63 can be the opposite of the conductivity type of the semiconductor channels 60 and the doped semiconductor material layer 10, which collectively constitute the channel of a vertical stack of field effect transistors embodied within a vertical memory stack structure such as a vertical NAND structure. Each set of a memory film 50 and a semiconductor channel 60 contacting the memory film 50 collectively constitutes a memory stack structure (50, 60) in which data can be stored in a plurality of vertically spaced memory elements.

A first upper-stack planarization stopping layer 271 and/or a second upper-stack planarization stopping layer 272 can be subsequently formed. In one embodiment, the first upper-stack planarization stopping layer 271 can be a silicon nitride layer, and the second upper-stack planarization stopping layer 272 can be a silicon oxide layer.

Figure 20:
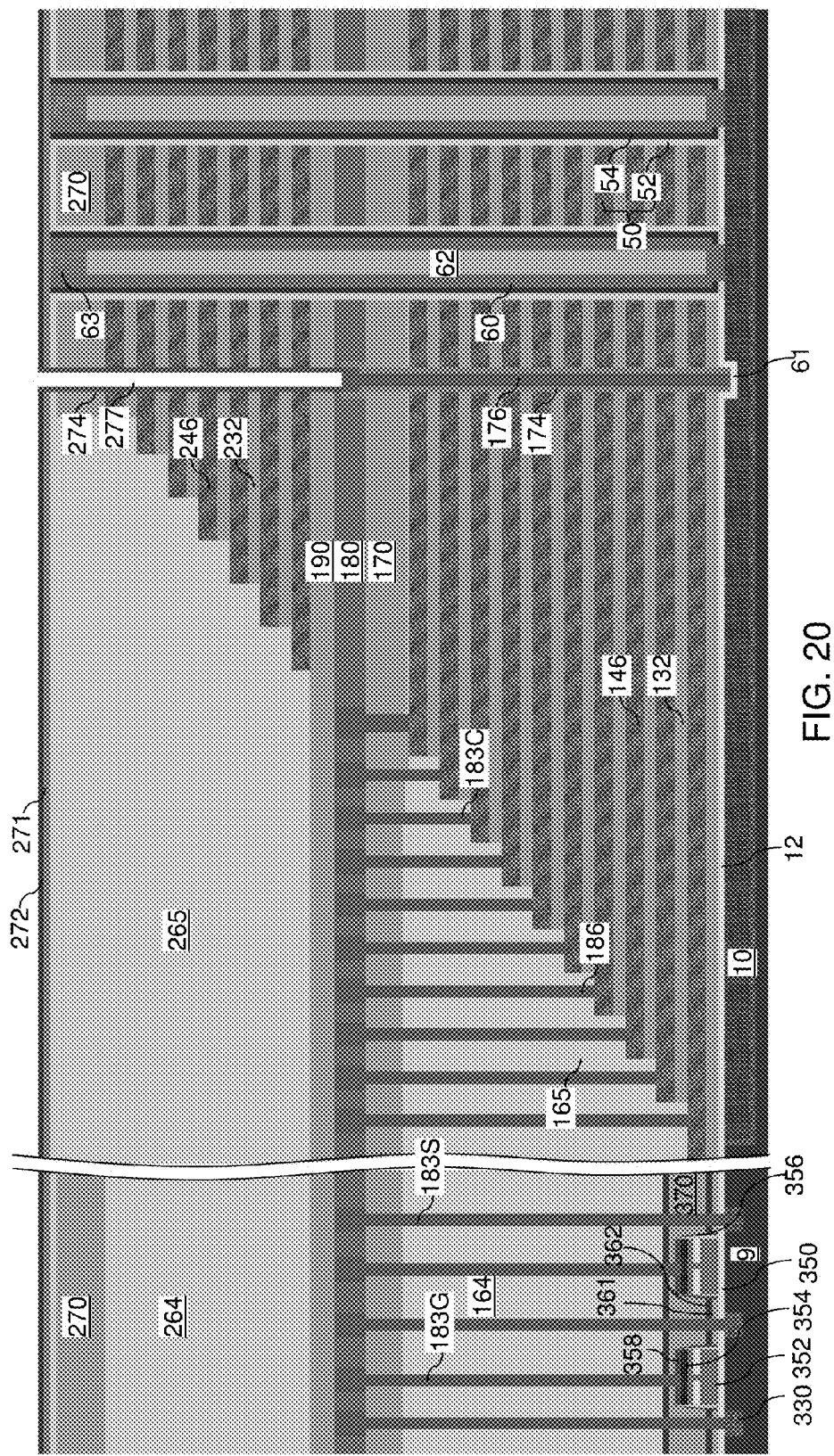
FIG. 20 is a vertical cross-sectional view of the first exemplary structure after formation of second electrically conductive layers and an upper-level insulating spacer according to the first embodiment of the present disclosure.

Referring to FIG. 20, second electrically conductive layers 246 can be formed by forming an upper level back side contact trench 277, removing the second sacrificial material layers 242 through trench 277 to form upper-level backside cavities, and by filling the upper-level backside cavities with a conductive material through trench 277. The processing steps employed to form the second electrically conductive layers 246 can be the same as the processing steps of FIGS. 8 and 9 that are employed to form the first electrically conductive layers 146. The upper stack structure comprises a second stack (232, 246) of alternating layers including the second electrically insulating layers 232 and the second electrically conductive layers 246.

An upper-level insulating spacer 274 can be formed on the sidewalls of the upper-level backside contact trench 277 by deposition of a contiguous dielectric material layer and an anisotropic etch of its horizontal portions. The upper-level insulating spacer 274 includes a dielectric material, which can comprise, for example, silicon oxide, silicon nitride, a dielectric metal oxide, a dielectric metal oxynitride, or a combination thereof. The thickness of the upper-level insulating spacer 274 can be in a range from 1 nm to 50 nm, although lesser and greater thicknesses can also be employed. In one embodiment, the thickness of the upper-level insulating spacer 174 can be in a range from 3 nm to 10 nm.

Figure 21:
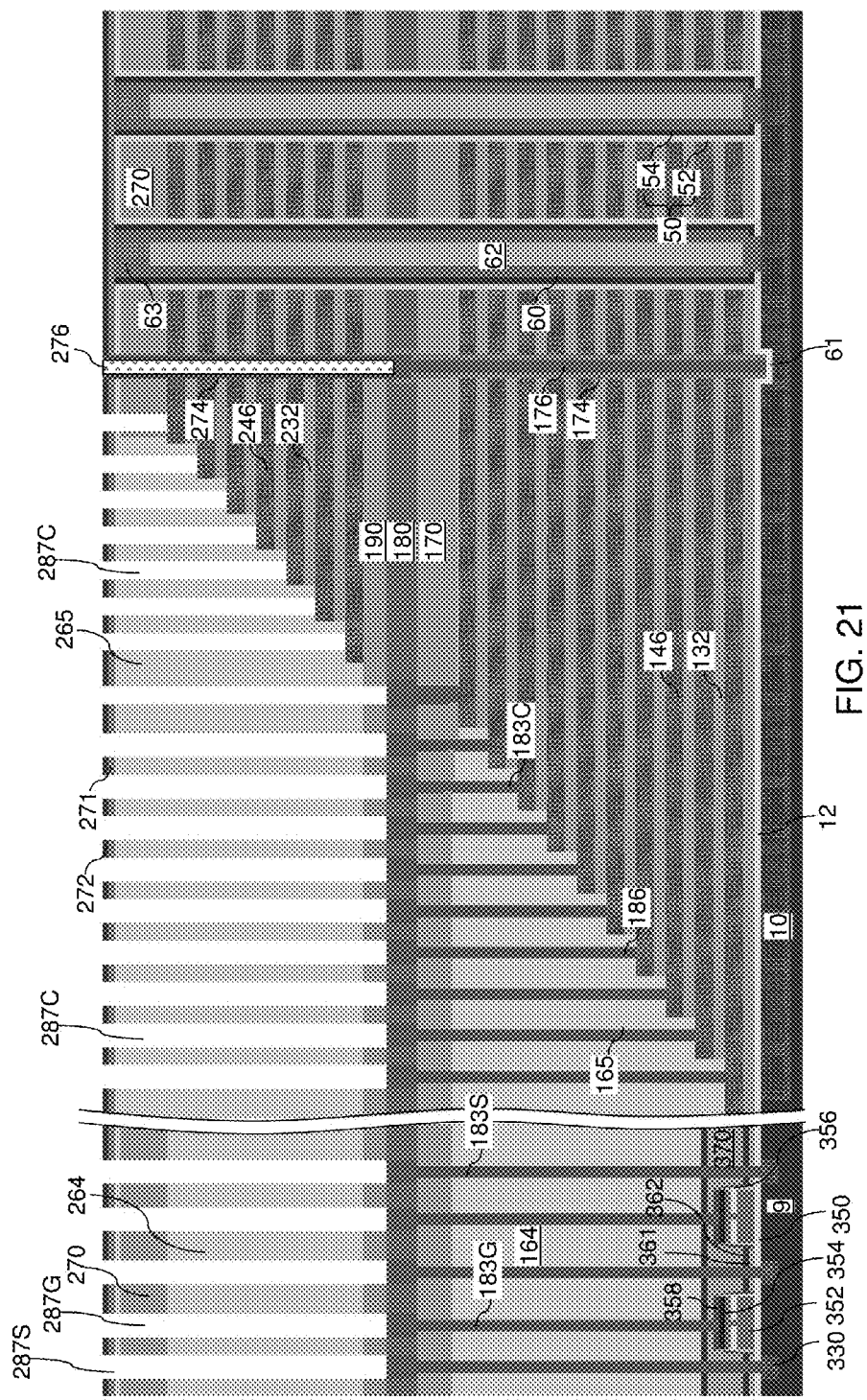
FIG. 21 is a vertical cross-sectional view of the first exemplary structure after formation of upper-level contact via cavities according to the first embodiment of the present disclosure.

Referring to FIG. 21, a sacrificial upper-level backside contact trench fill structure 276 can be formed by depositing a sacrificial material into the upper-level backside contact trench 277. The sacrificial material of the sacrificial upper-level backside contact trench fill structure 276 can include, for example, amorphous silicon, polysilicon, a silicon-germanium alloy, silicon nitride, amorphous carbon, diamond-like carbon, or another insulating material, such as a high etch rate oxide, including porous organosilicate glass. Alternatively, photoresist or organic or inorganic polymer may be used instead.

Upper-level contact via cavities (287S, 287G, 287C) are formed through at least one of the second-stack-cap dielectric layer 270, the upper-level dielectric fill material layer 164, the retro-stepped second dielectric material portion 265, the interstack dielectric layer 180, the first-stack-cap dielectric layer 170, the lower-level dielectric fill material layer 164, the retro-stepped first dielectric material portion 165, and the planarization dielectric layer 370. The upper-level contact via cavities (287S, 287G, 287C) can be formed, for example, by application and patterning of a photoresist layer to form openings therein, and by transfer of the pattern through the underlying dielectric layers employing at least one anisotropic etch. The upper-level contact via cavities (287S, 287G, 287C) comprise second substrate contact via cavities 287S overlying, and extending to a top surface of, a respective sacrificial substrate contact via fill structure 183S, second gate contact via cavities 287G overlying, and extending to a top surface of, a respective sacrificial gate contact via fill structure 183G, and second control gate contact via cavities 287C. A first subset of the second control gate contact via cavities 287C overlies, and extends to top surfaces of, the sacrificial control gate contact via fill structures 183C. A second subset of the second control gate contact via cavities 287C extends to top surfaces of the second electrically conductive layers 246 in the second stepped surfaces.

Alternatively, the first stepped surfaces and the second stepped surfaces can be formed such that stepped surfaces include horizontal surfaces of first and second electrically insulating layers (132, 232). For example, during patterning of the first stack to form the first stepped surfaces at the processing step of FIG. 1, the first stepped surfaces include horizontal surfaces of the first electrically insulating layers 132. At the processing steps of FIG. 12, the via cavities 187C can extend to a respective first electrically conductive layer 146 through a respective overlying first electrically insulating layer 132. At the processing step of FIG. 16, the second stack can be patterned to form second stepped surfaces. The second stepped surfaces can include horizontal surfaces of the second electrically insulating layers 246. At the processing step of FIG. 21, via cavities extending to a respective second electrically conductive layer 246 can be formed through a respective overlying second electrically insulating layer 232. In this case, the sacrificial control gate contact via fill structures 183C can extend through a first electrically insulating layer 132 that overlies a first electrically conductive layer 146, and the second subset of the second control gate contact via cavities 287C can extend through a second electrically insulating layer 132 that overlies a second electrically conductive layer 146.

Figure 22:
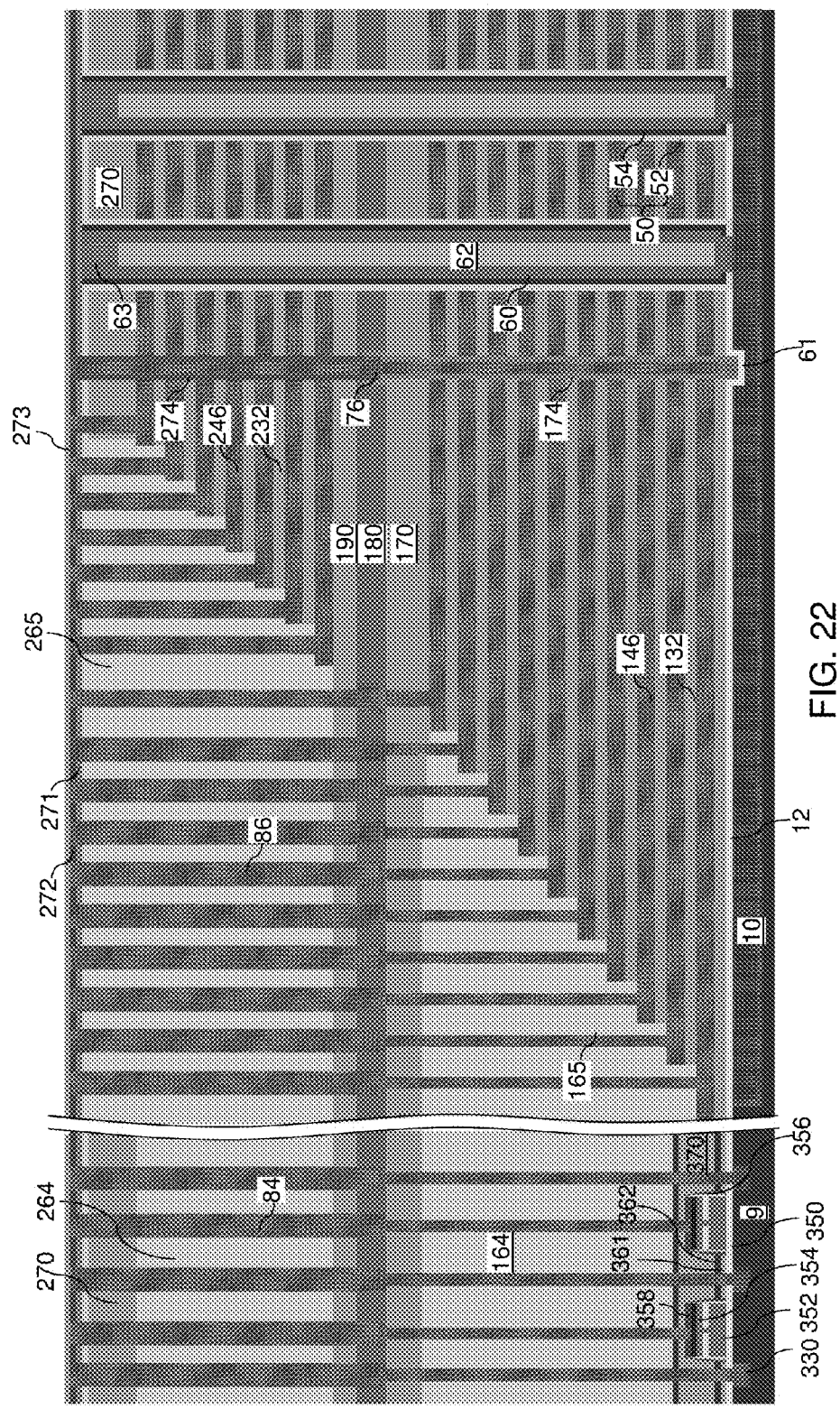
FIG. 22 is a vertical cross-sectional view of the first exemplary structure after formation of contact via structures according to the first embodiment of the present disclosure.

Referring to FIG. 22, the sacrificial upper-level backside contact trench fill structure 276, the sacrificial lower-level backside contact trench fill structure 176, and the various sacrificial contact via fill structure (183S, 183G, 183C) can be removed selective to the various dielectric materials of the second-stack-cap dielectric layer 270, the upper-level dielectric fill material layer 164, the retro-stepped second dielectric material portion 265, the interstack dielectric layer 180, the first-stack-cap dielectric layer 170, the lower-level dielectric fill material layer 164, the retro-stepped first dielectric material portion 165, and the planarization dielectric layer 370 and selective to the semiconductor materials of the active regions 330 and the source region 61 by a selective etch process. An anisotropic etch such as a reactive ion etch or an isotropic etch such as a wet etch can be employed.

At least one conductive material is deposited in the various cavities to form various contact via structures. In one embodiment, the at least one conductive material can include a combination of a metallic liner material and a metallic fill material. The metallic liner material can comprise a conductive metallic nitride (such as TiN, TaN, WN) or a conductive metallic carbide (such as TiC, TaC, WC), or a combination thereof. The metallic fill material can comprise an elemental metallic material or an intermetallic alloy of at least two metallic elements. The metallic elements that can be employed for the metallic fill material include, but are not limited to, W, Cu, Ti, Ru, etc.

Peripheral device contact via structures 84 can be formed in the cavities overlying the peripheral device region, and control gate contact via structures 86 can be formed in the cavities extending to the first and second stepped surfaces of the first stack (132, 146) and the second stack (232, 246). Further, a backside contact via structure 76 can be formed through a vertical stack of a lower-level backside contact trench and an upper-level backside contact trench. The backside contact via structure 76 can be a source contact via structure contacting the source region 61.

Each of the peripheral device contact via structure 86 is formed through the second-stack-cap dielectric layer 270, the upper-level dielectric fill material layer 164, the interstack dielectric layer 180, the first-stack-cap dielectric layer 170, the lower-level dielectric fill material layer 164, and the planarization dielectric layer 370. A first subset of the control gate contact via structures 86 contacts the first electrically conductive layers 146 and extends through the retro-stepped second dielectric material portion 265, the interstack dielectric layer 180, and the retro-stepped first dielectric material portion 165. A second subset of the control gate contact via structures 86 contacts the second electrically conductive layers 246 and can extend through the retro-stepped second dielectric material portion 265.

Figure 23:
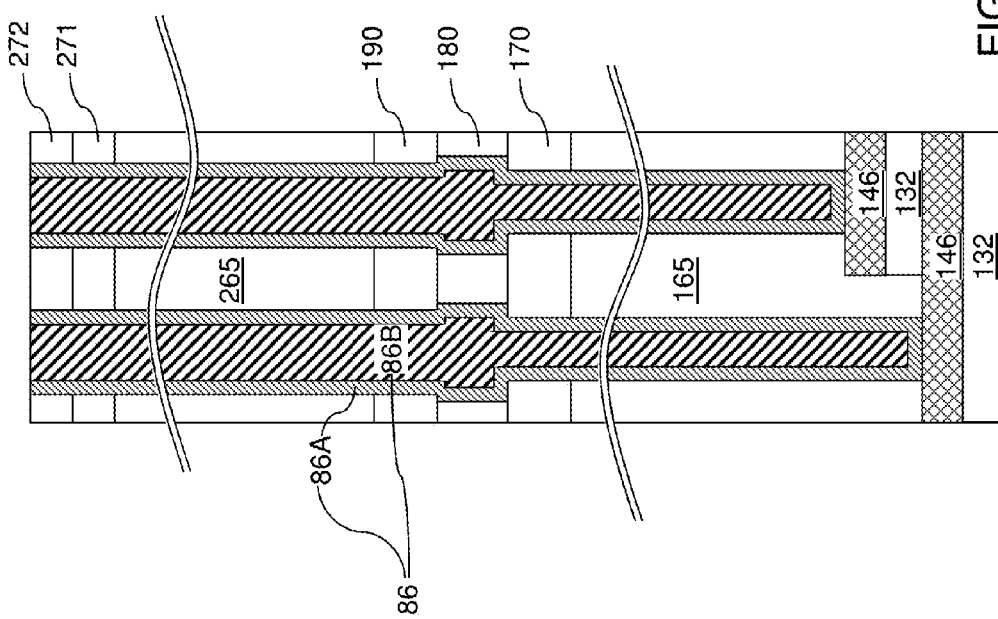
FIG. 23 is a magnified view of contact via structures of the first exemplary structure according to the first embodiment of the present disclosure.

In case the at least one conductive material includes a combination of a metallic liner material and a metallic fill material, control gate contact via structures 86 can comprise a metallic liner 86A and a metallic fill material portion 86B as illustrated in FIG. 23. Similarly, each of the peripheral device contact via structures 84 and the backside contact via structures 76 can comprise a metallic liner and a metallic fill material portion. For control gate contact via structures 86 that contact a respective first electrically conductive layer 146, the metallic liner 86A can contact the sidewalls of various dielectric material layers including the retro-stepped second dielectric material portion 265, the interstack dielectric layer 180, and the retro-stepped first dielectric material portion 165. Thus, a subset of the control gate contact via structures 86 can be formed through the first dielectric material portion 165 and the second dielectric material portion 265.

In one embodiment, at least one via contact structure (84, 76) can be formed on a top surface of at least one conductive structure (330, 61) located in, or underneath, the first stack (132, 146). Each of the at least one via contact structure (84, 76) vertically extends through the upper stack structure, the at least one dielectric material layer (170, 180, 190), and a portion of the lower stack structure.

In one embodiment, the first exemplary structure comprises a monolithic three-dimensional memory device, which includes a lower stack structure comprising a first stack of alternating layers including first electrically insulating layers 132 and first electrically conductive layers 246 and located over a substrate (9, 10), at least one dielectric material layer (170, 180, 190) overlying the lower stack structure, an upper stack structure comprising a second stack of alternating layers including second electrically insulating layers 232 and second electrically conductive layers 246 and located over the at least one dielectric material layer (170, 180, 190), a memory opening extending through the second stack, the at least one dielectric material layer (170, 180, 190), and the first stack, a memory film 50 and at least one semiconductor channel 60 located within the memory opening, and at least one via contact structure (84, 76) vertically extending through the upper stack structure, the at least one dielectric material layer (170, 180, 190), and a portion of the lower stack structure, and electrically shorted to at least one conductive structure (330, 61) located in, or underneath, the first stack.

The at least one via contact structure (84, 76) comprises a first via contact portion embedded within the lower stack structure, a second via contact portion embedded within the upper stack structure. The interface between the first via contact portion and the second via contact portion can be located between the upper stack structure and the lower stack structure. The interface between the first via contact portion and the second via contact portion is located within a horizontal plane in which the horizontal cross-sectional area of the respective via contact structure (84, 76) changes, for example, due to alignment overlay variations or due to a change in the lateral dimension (e.g., the diameter) of the respective via contact structure (84, 76). For example, the interface between the first via contact portion and the second via contact portion can be located at the interface between the interstack dielectric layer 180 and the second-stack-base dielectric layer 190. Thus, the via contacts may have wider (e.g., larger diameter) portions in layer 180 than in the upper or lower stacks. The wider portions form landing pads 84W, 86W and 76W in respective via contacts 84, 86 and 76 between the upper and lower stacks.

The monolithic three-dimensional memory device can be a vertical NAND memory device, and the first and second electrically conductive layers (146, 246) can comprise word lines of the vertical NAND memory device.

In one embodiment, the at least one dielectric material layer (170, 180, 190) can comprise a first-stack-cap dielectric layer 170, an inter-stack dielectric material layer 180 overlying the first-stack-cap dielectric layer 170. The inter-stack dielectric material layer 180 can have a greater lateral etch rate during formation of the first via cavities in the first level structure than the first-stack-cap dielectric layer 170. In this case, the first via contact portion of the at least one via contact structure (84, 76) can have a horizontal surface within a horizontal plane including the interface between the first-stack-cap dielectric layer 170 and the inter-stack dielectric material layer 180. In one embodiment, each of the at least one via contact structure has a greater lateral extent within the inter-stack dielectric material layer 180 than within the first-stack-cap dielectric layer 170.

In one embodiment, the at least one dielectric material layer (170, 180, 190) further comprises a second-stack-base dielectric layer 190 overlying the inter-stack dielectric material layer 180 and underlying the second stack (232, 246). Each of the at least one via contact structure (84, 86, 76) has a greater lateral extent within the inter-stack dielectric material layer 180 than within the second-stack-base dielectric layer 190. If desired, at least one of the via contact structures (84, 86, 76) may be wider (i.e., greater lateral extent or diameter) in the upper stack and in layer 180 than in the lower stack.

In one embodiment, the first exemplary structure comprises a monolithic three-dimensional memory device that includes a lower stack structure comprising a first stack of alternating layers including first electrically insulating layers 132 and first electrically conductive layers 146 and located over a substrate (9, 10), at least one dielectric material layer (170, 180, 190) overlying the lower stack structure, and an upper stack structure comprising a second stack of alternating layers including second electrically insulating layers 232 and second electrically conductive layers 246 and located over the at least one dielectric material layer (170, 180, 190). The at least one material layer (170, 180, 190) has a thickness that is greater than the maximum thickness of the first and second electrically insulating layers (132, 232). The monolithic three-dimensional memory device further includes a memory opening extending through the second stack, the at least one dielectric material layer (170, 180, 190), and the first stack; a memory film and at least one semiconductor channel 60 located within the memory opening; and at least one via contact structure (84, 76) vertically extending through the upper stack structure, the at least one dielectric material layer (170, 180, 190), and a portion of the lower stack structure, and electrically shorted to at least one conductive structure (330, 61) located in, or underneath, the first stack.

In one embodiment, the three-dimensional memory device can comprise a vertical NAND device, and the first and second electrically conductive layers (146, 246) in the first and second stacks comprise, or are electrically connected to, a respective word line of the vertical NAND device. In one embodiment, the substrate comprises a silicon substrate, the monolithic three-dimensional NAND memory structure comprises an array of monolithic three-dimensional NAND strings over the silicon substrate, at least one memory cell in a first device level of the array of monolithic three-dimensional NAND strings is located over another memory cell in a second device level of the array of monolithic three-dimensional NAND strings, and the silicon substrate contains an integrated circuit comprising a driver circuit (which can be one of the peripheral devices in the peripheral device region) for the memory device located thereon. In one embodiment, each NAND string comprises one of a plurality of semiconductor channels 60 in an array. At least one end portion of each of the plurality of semiconductor channels 60 extends substantially perpendicular to a top surface of the substrate (9, 10). Each NAND string can further comprise a plurality of charge storage elements, each charge storage element located adjacent to a respective one of the plurality of semiconductor channels 60, and a plurality of control gate electrodes having a strip shape extending substantially parallel to the top surface of the substrate (9, 10), the plurality of control gate electrodes comprise at least a first control gate electrode located in the first device level and a second control gate electrode located in the second device level.

Figure 24:
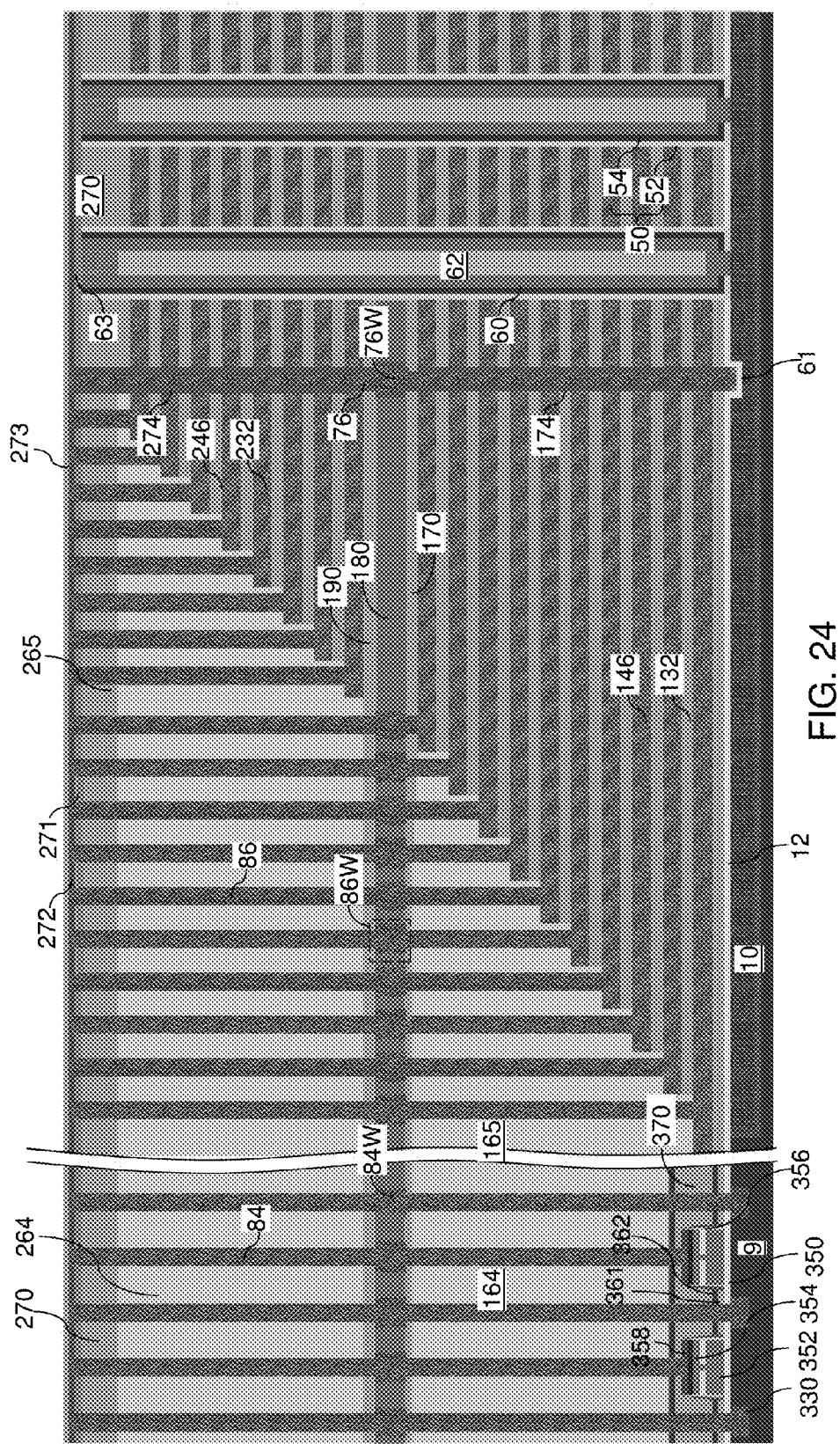
FIG. 24 is a vertical cross-sectional view of a first alternate embodiment of the first exemplary structure according to the first embodiment of the present disclosure.

Referring to FIG. 24, a first alternate embodiment of the first exemplary structure is shown. In the first alternate embodiment, each portion of the contact via cavities at the level of the interstack dielectric layer 180 can be laterally expanded prior to formation of the various sacrificial contact via fill structures (183C, 183S, 183G), or after removal of the various sacrificial contact via fill structures (183C, 183S, 183G). In one embodiment, after formation of at least one via cavity vertically extending through the upper stack structure, the at least one dielectric material layer (170, 180, 190), and a respective portion of the lower stack structure, the interstack dielectric material layer 180 can be laterally recessed farther than the first-stack-cap dielectric layer 170 from within each of the at least one via cavity employing an isotropic etch. In one embodiment, the inter-stack dielectric material layer 180 can be laterally etched farther than the second-stack-base dielectric layer 190 within each of the at least one via cavity during the isotropic etch. The at least one via cavity is filled with at least one conductive material to form the various contact via structures (84, 86, 76), which are wider in layer 180 than in the upper and lower stacks.

Figure 25:
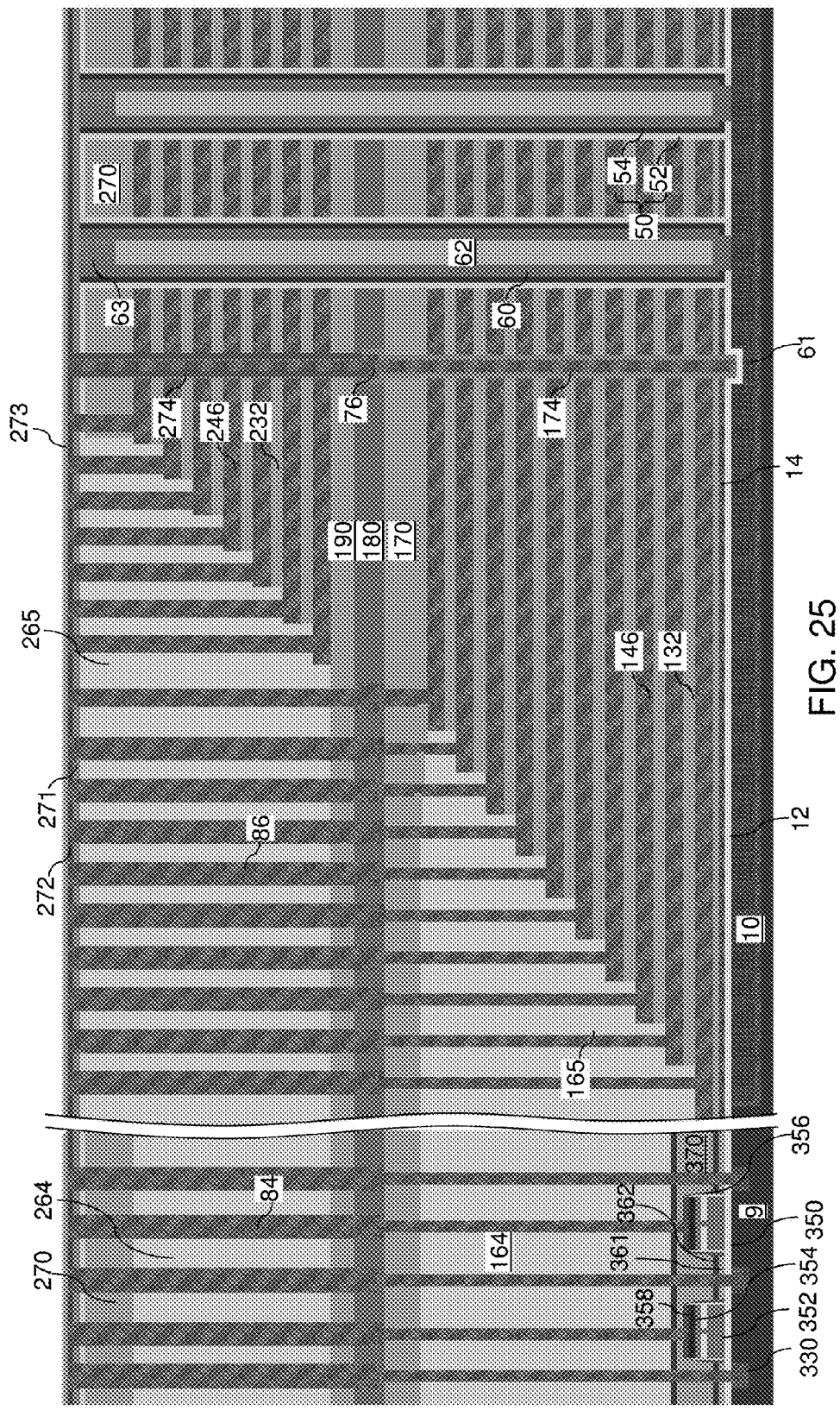
FIG. 25 is a vertical cross-sectional view of a second alternate embodiment of the first exemplary structure according to the first embodiment of the present disclosure.

Referring to FIG. 25, a second alternate embodiment of the first exemplary structure is illustrated. A dielectric metal oxide layer 14 such as an aluminum oxide layer can be employed as an etch stop layer to reduce, or eliminate, an over etch into an upper portion of the substrate (9, 10) during formation of the lower-level memory openings and the lower-level backside contact trench. The dielectric metal oxide layer 14 can be formed on top of, or directly underneath the dielectric pad layer 12.

Figure 26:
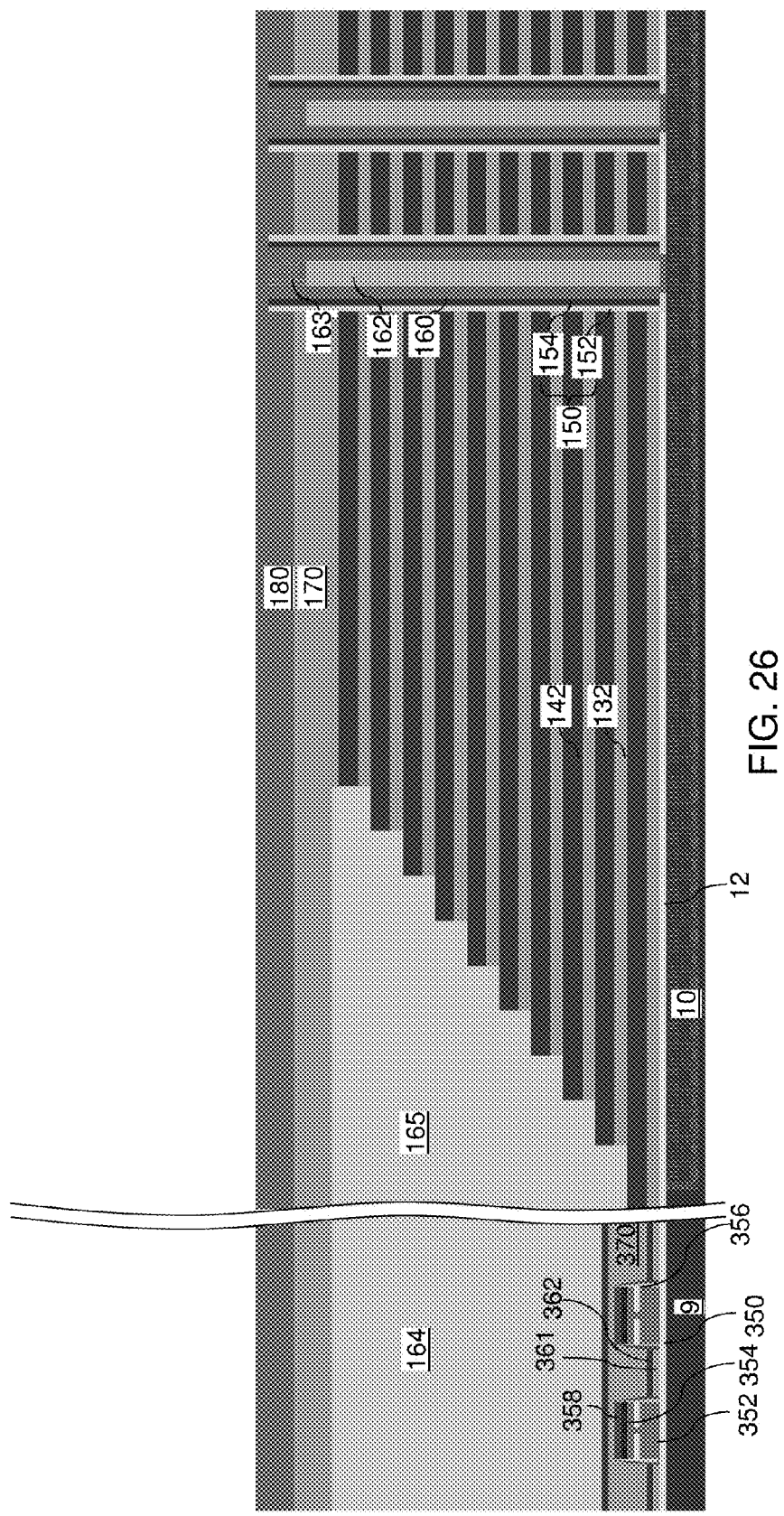
FIG. 26 is a vertical cross-sectional view of a second exemplary structure after formation of lower-level memory stack structures and an interstack dielectric layer according to a second embodiment of the present disclosure.

Referring to FIG. 26, a second exemplary structure according to a second embodiment of the present disclosure can be derived from the first exemplary structure of FIG. 5 by forming lower-level memory stack structures (150, 160), first dielectric cores 162, and doped semiconductor regions 163 in lieu of the lower opening liners 121. Specifically, a first blocking dielectric layer 152 can be formed in the sidewalls of the lower-level memory openings. The first blocking dielectric layer 152 can comprise any material that can be employed for the blocking dielectric layer 52 of the first embodiment, and can have the same thickness as in the blocking dielectric layer 52 of the first embodiment.

A first memory and tunneling layer 154 can be formed on the sidewalls of the first blocking dielectric layer 152 within each lower-level memory opening. The first memory and tunneling layer 154 can include a stack, from outside to inside, of a first charge storage layer and a first tunneling dielectric layer. The first charge storage layer can have the same composition and thickness as the charge storage layer of the first embodiment. The first tunneling dielectric layer can have the same composition and thickness as the tunneling dielectric layer of the first embodiment. The first blocking dielectric layer 152 and the first memory and tunneling layer 154 collectively constitutes a first memory film 150.

An opening can be formed through each horizontal portion of the first memory film 150 at the bottom of the lower-level memory openings by an anisotropic etch. The horizontal portion of each first memory film 150 can be removed from above the top surfaces of the interstack dielectric layer 180.

A first semiconductor channel 160 is formed within each lower-level memory opening and directly on the inner sidewall of the respective first-level memory film 150. The first semiconductor channel 160 can be formed by depositing at least one semiconductor material on the inner sidewalls of the first memory films 150 and on semiconductor surfaces of the doped semiconductor material layer 10 at the bottom of the lower-level memory openings. The semiconductor material of the first semiconductor channel 160 can be any semiconductor material that can be employed for the semiconductor channel 60 of the first embodiment.

A first dielectric core 162 can be formed within each cavity inside the first semiconductor channels 160, for example, by deposition of a dielectric material such as silicon oxide, and subsequent planarization and recessing of the dielectric material. Each remaining portion of the dielectric material inside a lower-level memory opening constitutes a first dielectric core 162. The first dielectric core 162 is an optional component, and a combination of a first memory film 150 and a first semiconductor channel 160 may completely fill a lower-level memory opening.

A doped semiconductor region 163 can be formed on the top portion of each first semiconductor channel 160, for example, by deposition of a doped semiconductor material and doping impurities by ion implantation technique. If the first semiconductor channels 160 are doped, the conductivity type of the doped semiconductor regions 163 can be the same as the conductivity type of the first semiconductor channels 160. Optionally, an additional dielectric material may be added to the interstack dielectric layer 180. The added dielectric material of the interstack dielectric layer 180 may be the same as the preexisting material of the interstack dielectric layer 180.

Figure 27:
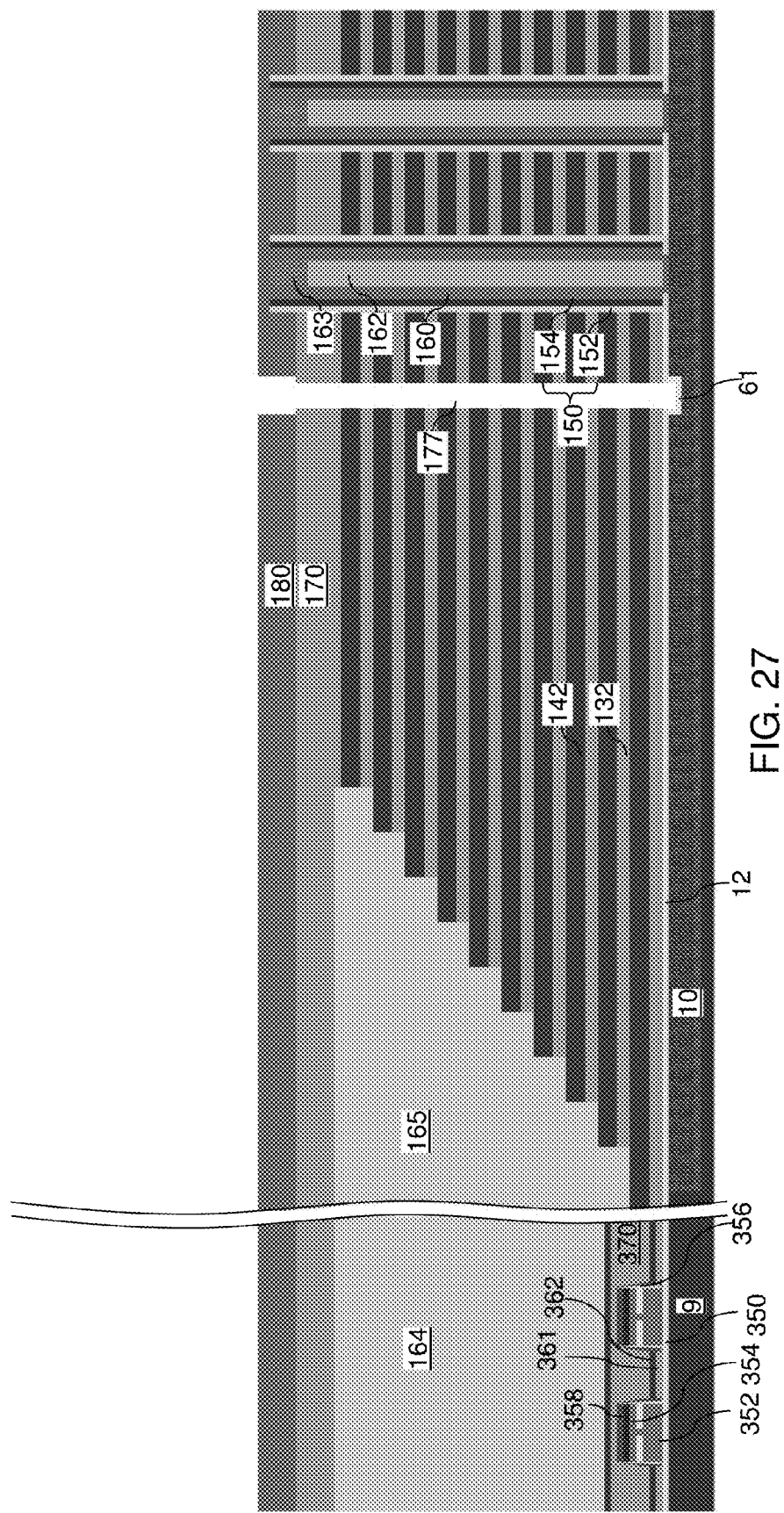
FIG. 27 is a vertical cross-sectional view of the second exemplary structure after formation of a lower-level backside contact trench according to the second embodiment of the present disclosure.

Referring to FIG. 27, a lower-level backside contact trench 177 can be formed through the interstack dielectric layer 180, the first-stack-cap dielectric layer 170, and the first stack (132, 142) employing the same methods as in the first embodiment, e.g., as illustrated in FIG. 7. A source region 61 can be formed employing the same methods as in the first embodiment, e.g., as illustrated in FIG. 7. The source region 61 can have a doping of the opposite conductivity type of the doped semiconductor regions 163. In one embodiment, the first semiconductor channels 160 can be intrinsic, or can have a conductivity type that is the opposite of a conductivity type of the source region 61.

Figure 28:
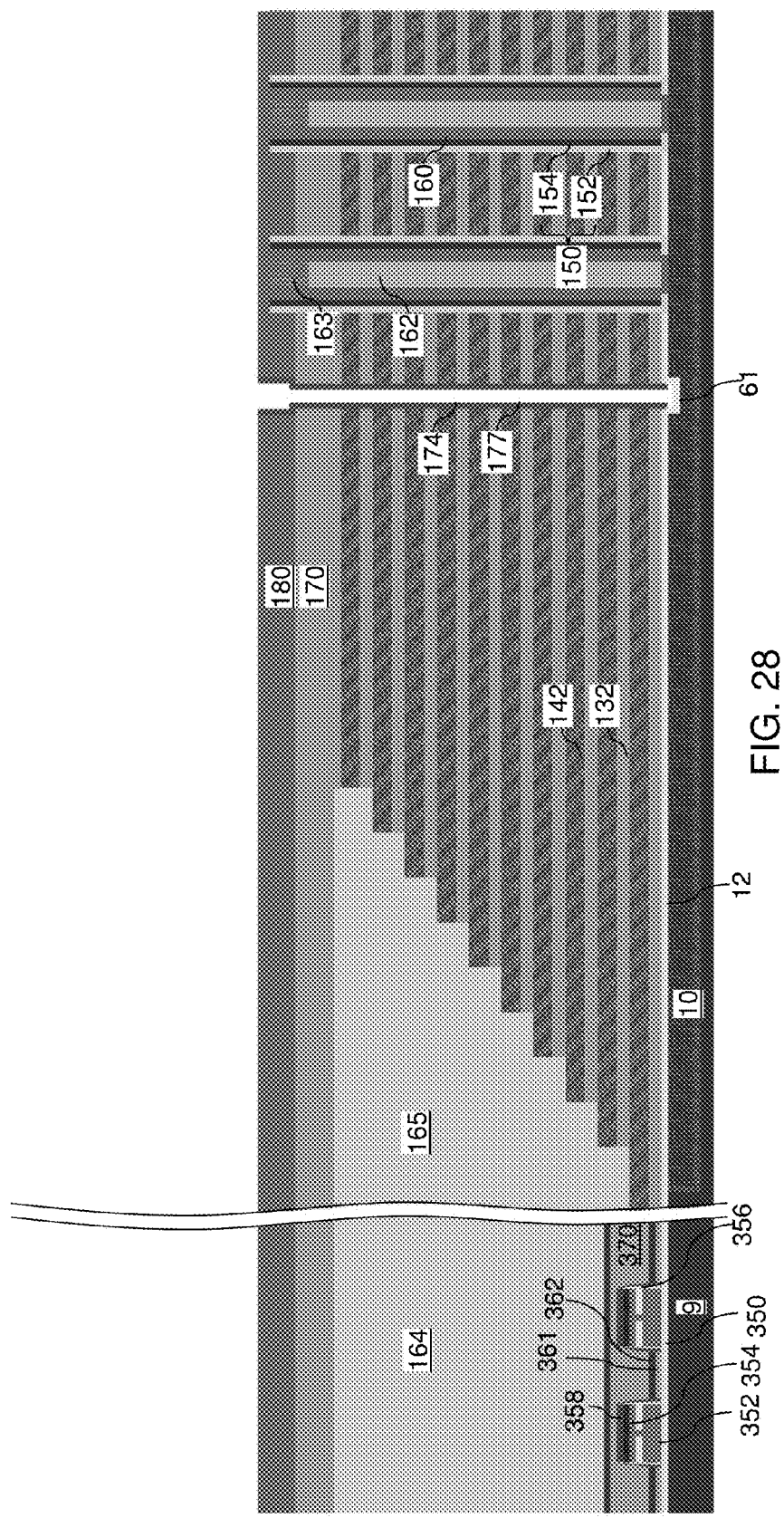
FIG. 28 is a vertical cross-sectional view of the second exemplary structure after formation of first electrically conductive layers according to the second embodiment of the present disclosure.

Referring to FIG. 28, a lower-level insulating spacer 174 can be formed on the sidewalls of the lower-level backside contact trench 177 in the same manner as in the first embodiment, e.g., by deposition of a contiguous dielectric material layer and an anisotropic etch of its horizontal portions.

Figure 29:
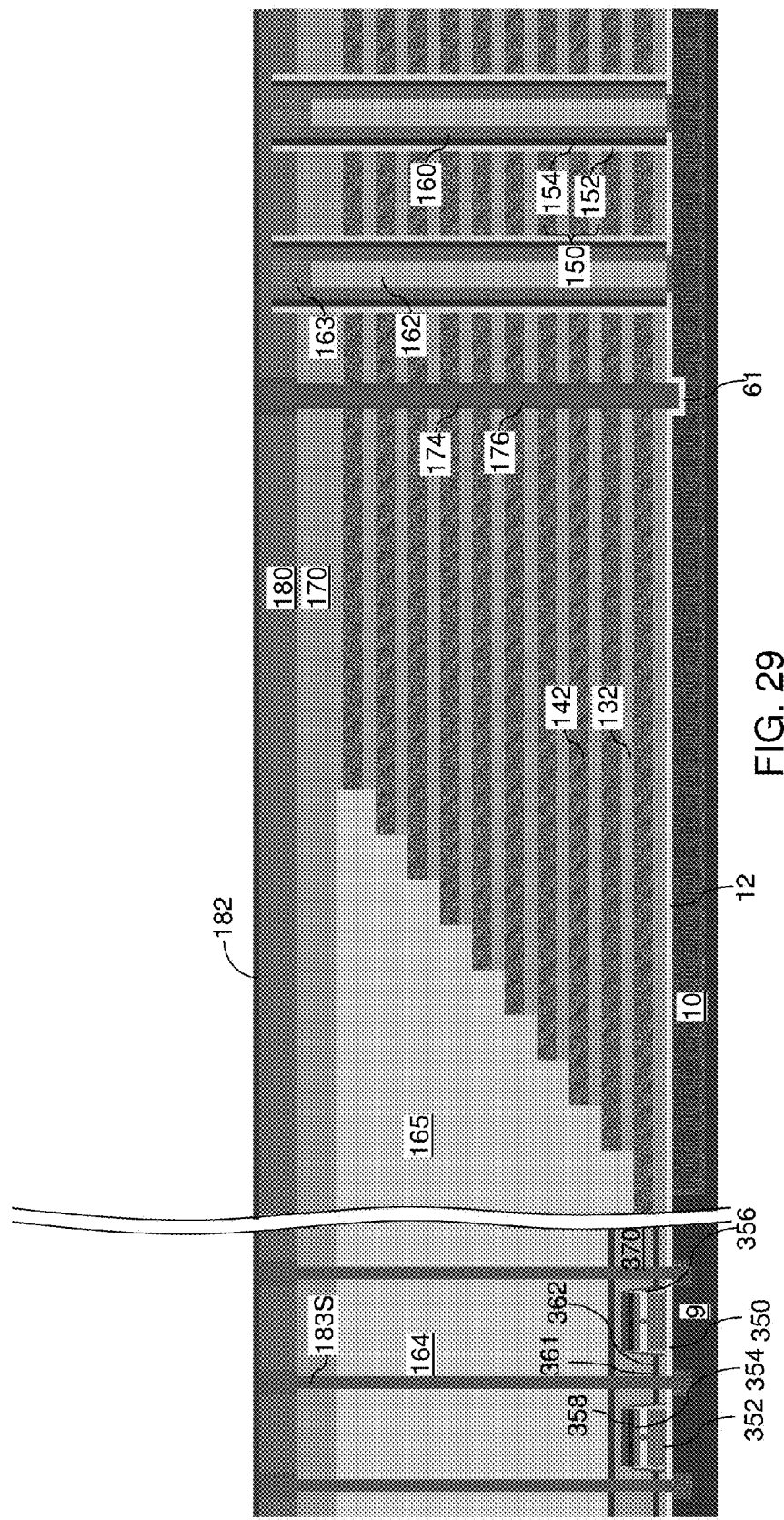
FIG. 29 is a vertical cross-sectional view of the second exemplary structure after formation of a sacrificial lower-level backside contact trench fill structure and sacrificial substrate contact via fill structures according to the second embodiment of the present disclosure.

Referring to FIG. 29, a sacrificial lower-level backside contact trench fill structure 176 and sacrificial substrate contact via fill structures 183S can be formed in the same manner as in the first embodiment, e.g., by employing the processing steps of FIGS. 10, 11, and 14. In the second embodiment, the sacrificial material of the sacrificial lower-level backside contact trench fill structure 176 and the sacrificial substrate contact via fill structures 183S can be the same as in the first embodiment, or can comprise a photoresist material or an organic polymer.

Figure 30:
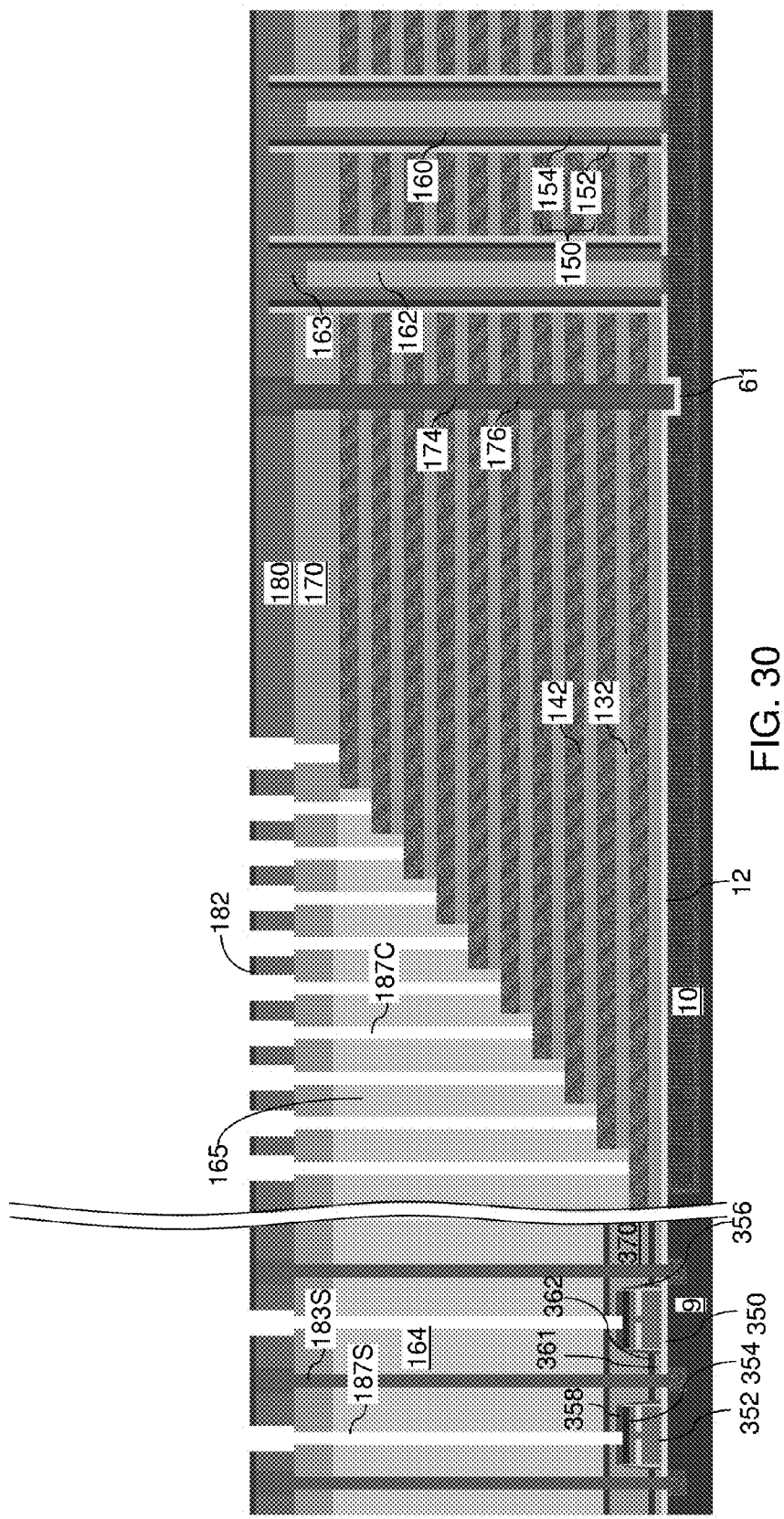
FIG. 30 is a vertical cross-sectional view of the second exemplary structure after formation of lower-level contact via cavities according to the second embodiment of the present disclosure.

Referring to FIG. 30, lower-level contact via cavities (187S, 187C) including first control gate contact via cavities 187C and first gate contact via cavities 187G can be formed through the interstack dielectric layer 180, the first-stack-cap dielectric layer 170, the lower-level dielectric fill material layer 164, and the planarization dielectric layer 370 to the gate electrodes (352, 354) of the peripheral devices and to the top surfaces of the first electrically conductive layers 146 employing the same processing steps as in the first embodiment, e.g., by performing the processing steps of FIG. 12.

Figure 31:
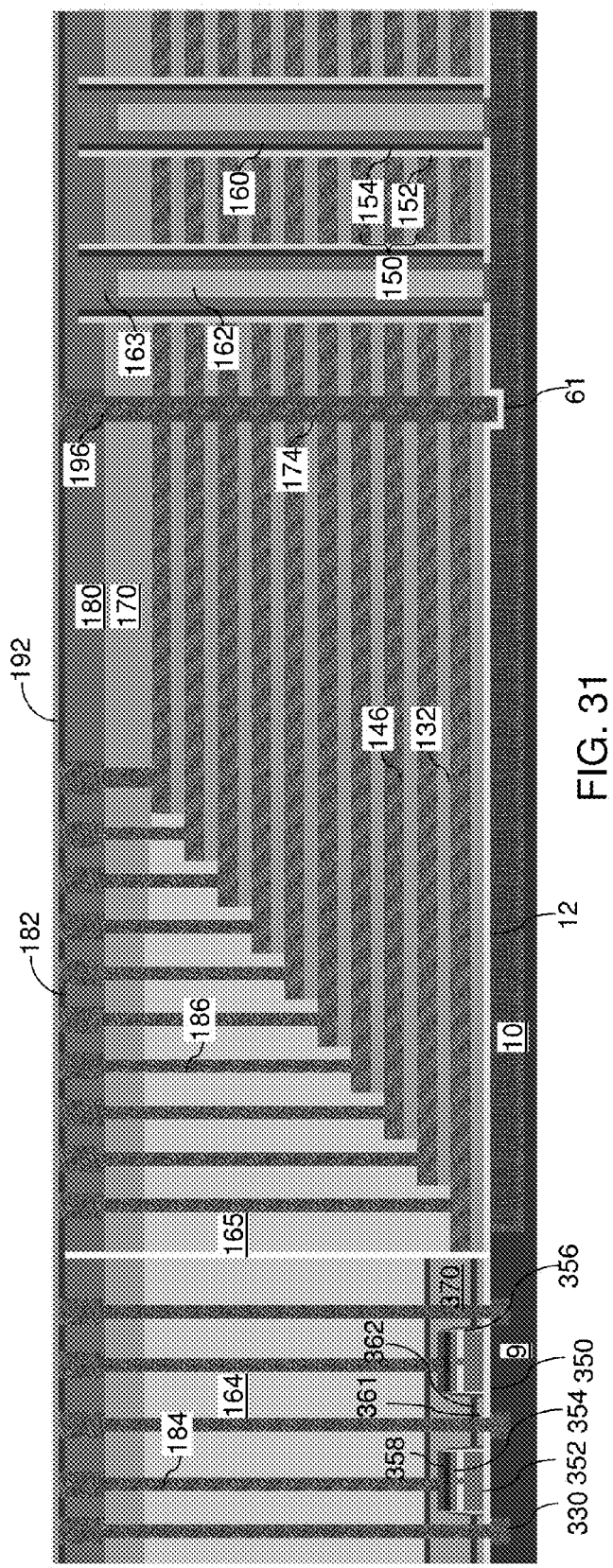
FIG. 31 is a vertical cross-sectional view of the second exemplary structure after formation of lower-level contact via structures according to the second embodiment of the present disclosure.

Referring to FIG. 31, the sacrificial lower-level backside contact trench fill structure 176 and the sacrificial substrate contact via fill structures 183S can be removed selective to the dielectric materials of the interstack dielectric layer 180, the first-stack-cap dielectric layer 170, the lower-level dielectric fill material layer 164, the planarization dielectric layer 370, and the lower-level insulating spacer 174 employing an etch process, which can be an isotropic etch or an anisotropic etch. Lower-level contact via structures (184, 186, 196) can be formed in the various cavities in the lower level structure. The lower-level contact via structures (184, 186, 196) can include first peripheral device contact via structures 184 contacting the active regions 330 or the gate electrodes (352, 354) in the peripheral device region, first control gate contact via structures 186 contacting the first electrically conductive layers 146 within the first stack (132, 146), and a first backside contact via structure 196 contacting the source region 61. The first backside contact via structure 196 can be a source contact via structure contacting the source region 61.

Figure 32:
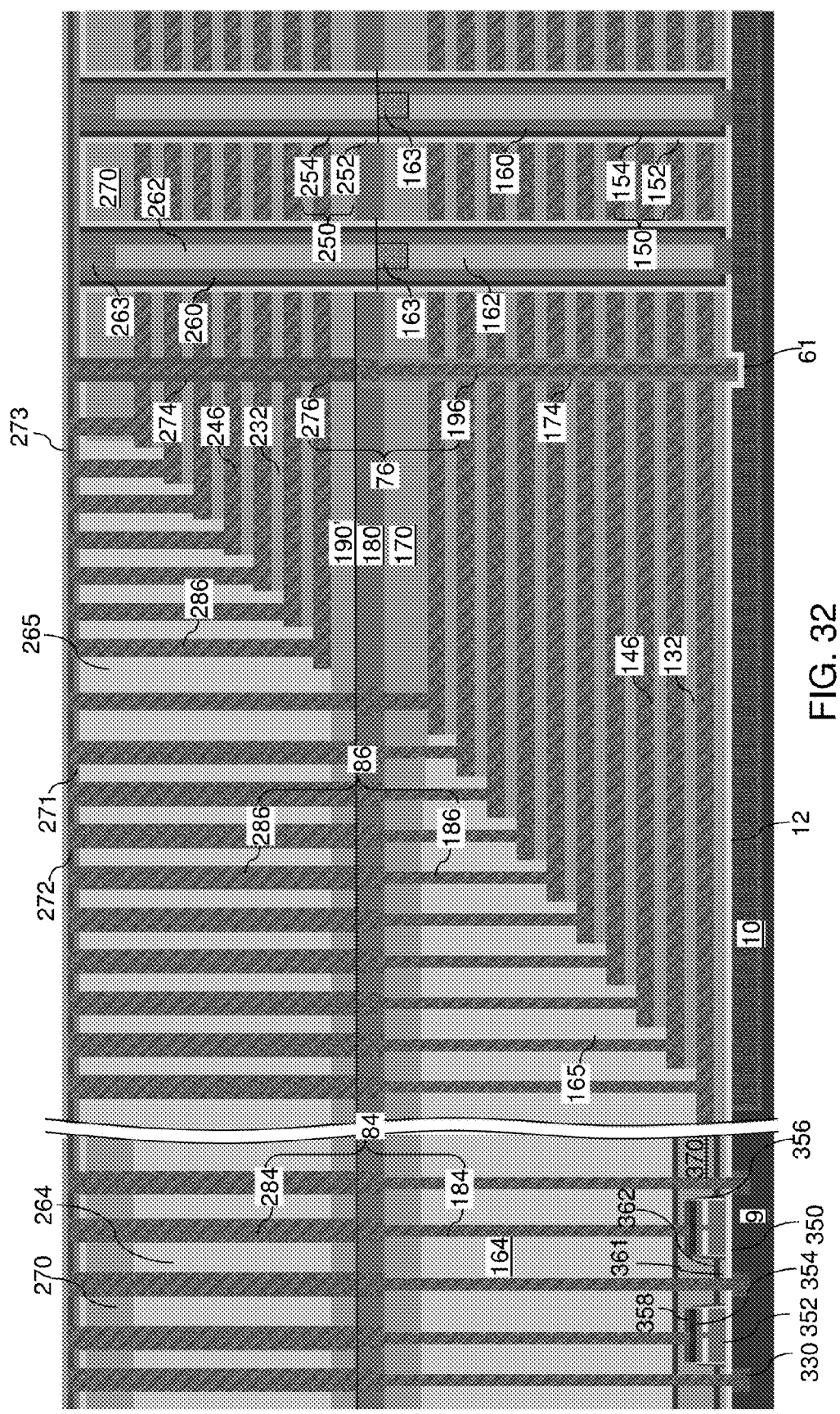
FIG. 32 is a vertical cross-sectional view of the second exemplary structure after formation of an upper-level structure according to the second embodiment of the present disclosure.

Referring to FIG. 32, the processing steps of FIGS. 15, 16, and 17 can be performed to form an upper level structure. Upon formation of upper-level memory openings 249 at a processing step corresponding to FIG. 17, top surfaces of the lower-level memory stack structures (150, 160) and/or the doped semiconductor regions 163 are physically exposed at the bottom of the upper-level memory openings.

Subsequently, upper-level memory stack structures (250, 260) can be formed employing the same processing steps for forming the lower-level memory stack structures (150, 160). Each upper-level memory stack structure (250, 260) comprises a second memory film 250 and a second semiconductor channel 260. The second memory film 250 comprises a second blocking dielectric layer 252 and a second memory and tunneling layer 254. The second blocking dielectric layer 252 can have the same composition as, and can be formed employing the same methods as, the first blocking dielectric layer 152. The second memory and tunneling layer 254 can have the same composition as, and can be formed employing the same methods as, the first memory and tunneling layer 154.

An opening can be formed through each horizontal portion of the second memory film 250 at the bottom of the upper-level memory openings by an anisotropic etch. The horizontal portion of each first second memory film 250 can be removed from above the top surfaces of the second-level-cap dielectric layer 270.

A second semiconductor channel 260 is formed within each upper-level memory opening and directly on the inner sidewall of the respective second memory film 250. The second semiconductor channel 260 can be formed by depositing at least one semiconductor material on the inner sidewalls of the second memory films 250 and on semiconductor surfaces of the doped semiconductor regions 163 at the bottom of the upper-level memory openings. The semiconductor material of the second semiconductor channel 260 can be any semiconductor material that can be employed for the semiconductor channel 60 of the first embodiment. The semiconductor material of the second semiconductor channel 260 may be the same as, or may be different from, the semiconductor material of the first semiconductor channel 160. If the second semiconductor channels 260 are doped, the second semiconductor channels 260 has a doping of the same conductivity type as the first semiconductor channels 160 and the doped semiconductor regions 163.

A second dielectric core 262 can be formed within each cavity inside the second semiconductor channels 260, for example, by deposition of a dielectric material such as silicon oxide, and subsequent planarization and recessing of the dielectric material. Each remaining portion of the dielectric material inside a lower-level memory opening constitutes a second dielectric core 162. The second dielectric core 262 is an optional component, and a combination of a second memory film 250 and a second semiconductor channel 260 may completely fill an upper-level memory opening.

A drain region 263 can be formed on the top portion of each second semiconductor channel 260, for example, by deposition of a doped semiconductor material and doping impurities by ion implantation technique. If the first and second semiconductor channels (160, 260) are doped, the conductivity type of the drain regions 263 can be the opposite of the conductivity type of the first and second semiconductor channels (160, 260). Optionally, a first upper-stack planarization stopping layer 271 and/or a second upper-stack planarization stopping layer 272 can be subsequently formed.

Upper-level contact via cavities (287S, 287G, 287C, See FIG. 21) are formed through the upper-stack planarization stopping layers (271, 272) and at least one of the second-stack-cap dielectric layer 270, the upper-level dielectric fill material layer 164, the retro-stepped second dielectric material portion 265, the interstack dielectric layer 180, the first-stack-cap dielectric layer 170, the lower-level dielectric fill material layer 164, the retro-stepped first dielectric material portion 165, and the planarization dielectric layer 370. The same processing steps can be employed as in the first embodiment, e.g., as illustrated in FIG. 21. The upper-level contact via cavities can comprise second peripheral device contact via cavities overlying, and extending to a top surface of, a respective first peripheral device contact via structures 184, and second control gate contact via cavities. A first subset of the second control gate contact via cavities overlies, and extends to top surfaces of, the first control gate contact via structures 186. A second subset of the second control gate contact via cavities extends to top surfaces of the second electrically conductive layers 246 in the second stepped surfaces. Further, the upper-level contact via cavities can comprise an upper-level backside contact trench that extends to a top surface of the first backside contact via structure 196.

The various upper-level contact via cavities are filled with at least one conductive material to form second contact via structures (284, 286, 276). The second contact via structures (284, 286, 276) can comprise second peripheral device contact via structures 284 overlying, and extending to a top surface of, a respective first peripheral device contact via structures 184, and second control gate contact via structures 286. Each vertically stacked pair of a first peripheral device contact via structure 184 and a second peripheral device contact via structure 284 collectively constitutes a peripheral device contact via structure 84. A first subset of the second control gate contact via structures 286 overlies, and extends to top surfaces of, the first control gate contact via structures 186, which collectively constitutes a control gate contact via structures 86. A second subset of the second control gate contact via structures 286 extends to top surfaces of the second electrically conductive layers 246 in the second stepped surfaces. Further, the upper-level contact via structures can comprise a second backside contact via structure 276 that extends to a top surface of the first backside contact via structure 196. The first backside contact via structure and the second backside contact via structure 276 collectively constitute a backside contact via structure 76, which can be a source contact via structure.

In the second embodiment, at least one memory film (150, 250), e.g., the first memory film 150 and the second memory film 250, and at least one semiconductor channel (160, 260), e.g., the first semiconductor channel 160 and the second semiconductor channel 260, are formed within each vertically adjoined pair of a lower memory opening and an upper memory opening. The first and second semiconductor channels (160, 260) cam be intrinsic, or can have a conductivity type that is the same of the conductivity type of the doped semiconductor regions 163.

At least one via contact structure (84, 76) can be formed on a top surface of at least one conductive structure (330, 61) located in, or underneath, the first stack. Each of the at least one via contact structure (84, 76) vertically extends through the upper stack structure, the at least one dielectric material layer (170, 180, 190), and a portion of the lower stack structure. Each of the at least one via contact structure (84, 76) can include a first via contact portion (184 or 196) extending through a portion of the lower stack structure and a second via contact portion (284 or 276) through the upper stack structure and directly on the first via contact portion. The interface between the first via contact portion and the second via contact portion can be formed between the upper stack structure and the lower stack structure. In one embodiment, the interface between the first via contact portion and the second via contact portion can be coplanar with the interface between the interstack dielectric structure 180 and the second-stack-base dielectric structure 190.

Additional via contact structures (186, 286) can comprise a plurality of additional contact via structures 86 that contact a respective first electrically conductive layer 146 within the first stack. The second exemplary structure comprises a monolithic three-dimensional memory device including: a lower stack structure comprising a first stack of alternating layers including first electrically insulating layers 132 and first electrically conductive layers 146 and located over a substrate (9, 10); at least one dielectric material layer (170, 180, 190) overlying the lower stack structure; and an upper stack structure comprising a second stack of alternating layers including second electrically insulating layers 232 and second electrically conductive layers 246 and located over the at least one dielectric material layer (170, 180, 190). The at least one material layer (170, 180, 190) has a thickness that is greater than the maximum thickness of the first and second electrically insulating layers (146, 246). The monolithic three-dimensional memory device further includes a memory opening extending through the second stack, the at least one dielectric material layer (170, 180, 190), and the first stack; at least one memory film, e.g., the first memory film 150 and the second memory film 250, and at least one semiconductor channel, e.g., the first semiconductor channel 160 and the second semiconductor channel 260, located within the memory opening; and at least one via contact structure (84, 76) vertically extending through the upper stack structure, the at least one dielectric material layer (170, 180, 190), and a portion of the lower stack structure, and electrically shorted to at least one conductive structure (330, 61) located in, or underneath, the first stack. A dielectric cap layer 273 can be formed above the various upper-level via contact structures (284, 286, 276) in the upper stack structure.

Each of the at least one via contact structure (84, 76) comprises: a first via contact portion (184 or 196) embedded within the lower stack structure; and a second via contact portion (284 o4 276) embedded within the upper stack structure.

In one embodiment, the interstack dielectric layer 180 can be laterally recessed faster, and farther, than the first-level-cap dielectric layer 170 and the second-level-base dielectric layer 190 in the same manner as in the first embodiment. In one embodiment, the first via contact portion (184 or 196) has a horizontal surface within a horizontal plane including the interface between the first-stack-cap dielectric layer 170 and the inter-stack dielectric material layer 180.

In one embodiment, the three-dimensional memory device can comprise a vertical NAND device, and the first and second electrically conductive layers (146, 246) in the first and second stacks comprise, or are electrically connected to, a respective word line of the vertical NAND device. In one embodiment, the substrate comprises a silicon substrate, the monolithic three-dimensional NAND memory structure comprises an array of monolithic three-dimensional NAND strings over the silicon substrate, at least one memory cell in a first device level of the array of monolithic three-dimensional NAND strings is located over another memory cell in a second device level of the array of monolithic three-dimensional NAND strings, and the silicon substrate contains an integrated circuit comprising a driver circuit (which can be one of the peripheral devices in the peripheral device region) for the memory device located thereon. In one embodiment, each NAND string comprises a plurality of semiconductor channels (160, 260). At least one end portion of each of the plurality of semiconductor channels (160, 260) extends substantially perpendicular to a top surface of the substrate (9, 10). Each NAND string can further comprise a plurality of charge storage elements, each charge storage element located adjacent to a respective one of the plurality of semiconductor channels (160, 260), and a plurality of control gate electrodes having a strip shape extending substantially parallel to the top surface of the substrate (9, 10), the plurality of control gate electrodes comprise at least a first control gate electrode located in the first device level and a second control gate electrode located in the second device level.

The dielectric pillar structures of the present disclosure function as stress-compensating or stress-cancelling pillar structures for electrically conductive lines, which can be, for example, tungsten word lines that are under high tensile stress. The present disclosure provides metal contact landing pads for electrically connecting a lower-level memory array and an upper-level memory array. Further, reuse of various lithographic masks between the lower-level memory stack structure and the upper-level memory stack structure can provide the benefit of cost reduction.

The present disclosure enables monolithic integration of MANOS layers between a lower-level memory array and an upper-level memory array. The number of levels for vertical integration of memory arrays is unlimited, and contact via structures having very high aspect ratios can be provided. Further, misalignment and overly variations can be reduced between levels in the vertically integrated multilevel memory stack structures.

Unlike prior integration schemes, dummy word lines are not needed at junction areas between a lower level structure and an upper level structure. Cell contact and peripheral contact open issues are addressed through the methods of the present disclosure. In some embodiments, the cell current can be improved over prior art structures because there is no breakdown in the lower level and upper level MANOS formation. In some embodiments, lower level terrace contacts and peripheral contacts can be combined and reduced to a single mask level.

Each metal contact pad of the lower-level contact via structures (including the lower-level terrace contact via structures (i.e., lower-level word line contact via structures), lower-level peripheral device contact via structures, lower-level backside contact via structures) can be are self-aligned to underlying vertically-extending via portion, and can have a greater lateral dimension than any underlying lower-level via portion of the respective lower-level contact via structure, which increases alignment tolerance for a corresponding upper-level contact via structure. A vertically-extending via portion that is narrower than the overlying metal contact pad can be particularly beneficial for the lower-level terrace contact via structures narrower lateral dimensions at a bottom portion of a via cavity provides a greater process window for dry etch process variations.

In some embodiments, the upper-level memory array contact via structures and the upper-level peripheral contact via structures can have a greater lateral dimension that each respective underlying bottom-level contact via structures. This feature makes it possible to reduce the overall resistance of the contact via structures, and to reduce the associated RC delay. Each backside contact via structure is provided with a spacer liner (e.g., an insulating spacer) to prevent metallic contamination and word line shorts through the backside contact via structure.

In some embodiment, a metallic oxide bottom layer can prevent, or reduce, overetch into the semiconductor substrate during formation of the lower-level memory openings and the lower-level backside contact trench. As a result, high aspect ratio etch processes can be can be provided without overetch into the substrate.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three-dimensional memory device comprising:
    a lower stack structure comprising a first stack of alternating layers including first electrically insulating layers and first electrically conductive layers and located over a substrate;
    at least one dielectric material layer overlying the lower stack structure;
    an upper stack structure comprising a second stack of alternating layers including second electrically insulating layers and second electrically conductive layers and located over the at least one dielectric material layer;
    a memory opening extending through the second stack, the at least one dielectric material layer, and the first stack;
    a memory film and at least one semiconductor channel located within the memory opening;
    at least one via contact structure vertically extending through the upper stack structure, the at least one dielectric material layer, and a portion of the lower stack structure, and electrically shorted to at least one conductive structure located in, or underneath, the first stack; and
    a plurality of dielectric pillar structures comprising a stress-compensating dielectric material and extending through first stepped surfaces of the first stack,
    wherein:
    the at least one via contact structure comprises:
        a first via contact portion embedded within the lower stack structure; and
        a second via contact portion embedded within the upper stack structure;
    the lower stack structure further comprises a first dielectric material portion located on, and over, first stepped surfaces of the first stack;
    the upper stack structure further comprises a second dielectric material portion located on, and over, second stepped surfaces of the second stack;
    the at least one via contact structure extends through the first dielectric material portion and the second dielectric material portion; and
    at least two of the plurality of dielectric pillar structures pass through different numbers of layers among the first electrically insulating layers, and the stress-compensating dielectric material and the electrically conductive layers apply stresses of opposite types to the substrate.

2. The monolithic three-dimensional memory device of claim 1, wherein:
    the at least one conductive structure comprises the first electrically conductive layers within the first stack;
    a plurality of additional contact via structures extending through the upper stack structure and into the lower stack structure contact a respective first electrically conductive layer within the first stack;
    the monolithic three-dimensional memory device is a vertical NAND memory device; and
    the first and second electrically conductive layers comprise word lines of the vertical NAND memory device.

3. The monolithic three-dimensional memory device of claim 1, wherein the plurality of dielectric pillar structures apply compressive stress to the first stack.

4. The monolithic three-dimensional memory device of claim 3, wherein the plurality of dielectric pillar structures comprise tantalum oxide.

5. The monolithic three-dimensional memory device of claim 1, wherein:
    the at least one conductive structure comprises a source region containing a doped semiconductor material and located underneath the first stack: and
    the at least one via contact structure comprises a source contact via structure contacting the source region.

6. The monolithic three-dimensional memory device of claim 5, further comprising a insulating spacer, wherein:
    an inner sidewall of the insulating spacer contacts a sidewall of the source contact via structure; and
    an outer sidewall of the insulating spacer contacts sidewalls of the first electrically insulating layers and the first electrically conductive layers.

7. The monolithic three-dimensional memory device of claim 1, wherein each of the at least one via contact structure comprises:
    a metallic liner contiguously extending at least from a horizontal plane including a top surface of the second stack to a top surface of a respective first electrically conductive layer in the first stack; and a metallic fill material portion embedded within the metallic liner and contiguously extending at least from the horizontal plane to a top surface of a horizontal portion of the metallic liner that is vertically spaced from the top surface of the respective first electrically conductive layer by a thickness of the metallic liner.

8. The monolithic three-dimensional memory device of claim 1, wherein the at least one dielectric material layer comprises:
a first-stack-cap dielectric layer; and
an inter-stack dielectric material layer overlying the first-stack-cap dielectric layer,
wherein the at least one via contact structure has a greater lateral extent within the inter-stack dielectric material layer than within the first-stack-cap dielectric layer.

9. The monolithic three-dimensional memory device of claim 8, wherein:
the at least one dielectric material layer further comprises a second-stack-base dielectric layer overlying the inter-stack dielectric material layer and underlying the second stack; and
the at least one via contact structure has a greater lateral extent within the inter-stack dielectric material layer than within the second-stack-base dielectric layer.

10. The monolithic three-dimensional memory device of claim 1, wherein:
the at least one dielectric material layer has a thickness that is greater than a maximum thickness of the first and second electrically insulating layers;
the at least one dielectric material layer comprises:
a first-stack-cap dielectric layer; and
an inter-stack dielectric material layer overlying the first-stack-cap dielectric layer; and
the first via contact portion has a horizontal surface within a horizontal plane including the interface between the first-stack-cap dielectric layer and the inter-stack dielectric material layer.

11. The monolithic three-dimensional memory device of claim 1, wherein the at least one semiconductor channel comprises:
a first semiconductor channel located within the lower stack structure; and
a second semiconductor channel located within the upper stack structure, wherein a doped semiconductor region contacts a top surface of the first semiconductor channel and a bottom surface of the semiconductor channel, and is located between a first horizontal plane including a topmost surface of the at least one dielectric material layer and a second horizontal plane including a bottommost surface of the at least one dielectric material layer.

12. The monolithic three-dimensional memory device of claim 11, further comprising a drain region contacting a top portion of the second semiconductor channel and having a doping of an opposite conductivity type from the doped semiconductor region, wherein the first and second semiconductor channels are intrinsic or have a conductivity type that is the opposite of a conductivity type of the drain region.

13. The monolithic three-dimensional memory structure of claim 1, wherein:
the monolithic three-dimensional memory structure comprises a monolithic three-dimensional NAND memory device;
the first and second electrically conductive layers comprise, or are electrically connected to, a respective word line of the monolithic three-dimensional NAND memory device;
the substrate comprises a silicon substrate;
the monolithic three-dimensional NAND memory structure comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
each NAND string comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

14. The monolithic three-dimensional memory device of claim 1, wherein the at least one dielectic material layer comprises
a first dielectric material portion located on, and over, the first stepped surfaces of the first stack.

15. The monolithic three-dimensional memory device of claim 14, wherein the plurality of dielectric pillar structures apply compressive stress to the first stack.

16. The monolithic three-dimensional memory device of claim 15, wherein the plurality of dielectric pillar structures comprise tantalum oxide.

17. The monolithic three-dimensional memory device of claim 14, wherein:
the first stack of alternating layers, the first dielectric material portion, and the plurality of dielectric pillar structures are located within the lower stack structure; and
the at least one dielectric material layer has a thickness that is greater than a maximum thickness of the first and second electrically insulating layers.

18. The monolithic three-dimensional memory device of claim 17, wherein:
the upper stack structure further comprises a second dielectric material portion located on, and over, second stepped surfaces of the second stack;
a plurality of additional contact via structures extending through the upper stack structure and into the lower stack structure contact a respective first electrically conductive layer within the first stack;
the at least one conductive structure comprises the first electrically conductive layers within the first stack;
the monolithic three-dimensional memory device is a vertical NAND memory device; and
the first and second electrically conductive layers comprise word lines of the vertical NAND memory device.

19. The monolithic three-dimensional memory structure of claim 13, wherein:
the monolithic three-dimensional memory structure comprises a monolithic three-dimensional NAND memory device;

the first and second electrically conductive layers comprise, or are electrically connected to, a respective word line of the monolithic three-dimensional NAND memory device;

the substrate comprises a silicon substrate;

the monolithic three-dimensional NAND memory structure comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and each NAND string comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

20. A method of forming the three-dimensional memory device of claim 1, comprising:
forming the lower stack structure over the substrate;
forming the at least one dielectric material layer over the lower stack structure;
forming the upper stack structure over the at least one dielectric material layer, and
forming the at least one via contact structure on a top surface of at least one conductive structure located in, or underneath, the first stack.

21. The method of claim 20, wherein:
forming the lower stack structure further comprises forming lower memory openings extending through the lower stack structure and filled with a respective lower memory opening fill structure;
forming the upper stack structure further comprises forming upper memory openings extending through the second stack; and
the method further comprises forming the memory film and the at least one semiconductor channel within each vertically adjoined pair of a lower memory opening and an upper memory opening.

22. The method of claim 21, further comprising removing the lower memory opening fill structures after formation of the upper memory openings, wherein the at least one semiconductor channel is a single semiconductor channel extending through the upper stack structure, the at least one dielectric material layer, and the lower stack structure.

23. The method of claim 21, wherein each vertically adjoined pair of a lower memory opening and an upper memory opening extends through the upper stack structure, the at least one dielectric material layer, and the lower stack structure.

24. The method of claim 20 further comprising:
forming memory openings extending through the first and the second stack; and
forming at least one memory film and at least one semiconductor channel within each respective memory opening.

25. The method of claim 21, wherein:
forming the lower stack structure further comprises forming lower memory openings extending through the lower stack structure;
forming the upper stack structure further comprises forming upper memory openings extending through the second stack; and
the at least one semiconductor channel is formed by:
forming a first semiconductor channel within a respective lower memory opening in the lower stack structure prior to forming of the upper stack structure; and
forming a second semiconductor channel within a respective upper memory opening the upper stack structure.

26. The method of claim 25, further comprising:
forming a doped semiconductor region on a top surface of the first semiconductor channel, wherein the second semiconductor channel is formed on the doped semiconductor region; and
forming a drain region directly on a top portion of the second semiconductor channel, wherein the drain region has an opposite conductivity type from the doped semiconductor region, and
wherein the first and second semiconductor channels are intrinsic or have a conductivity type that is the opposite of a conductivity type of the drain region.

27. The method of claim 20, further comprising:
patterning the first stack to form first stepped surfaces thereupon;
forming a first dielectric material portion on the first stepped surfaces, wherein the least one dielectric material layer is formed over the first dielectric material portion;
patterning the second stack to form second stepped surfaces thereupon after the step of forming the first dielectric material portion; and
forming a second dielectric material portion on the second stepped surfaces, wherein:
the at least one via contact structure is formed through the first dielectric material portion and the second dielectric material portion;
the at least one conductive structure comprises the first electrically conductive layers within the first stack;
a plurality of additional contact via structures extending through the upper stack structure and into the lower stack structure contact a respective first electrically conductive layer within the first stack;
the three-dimensional memory device is a vertical NAND memory device; and
the first and second electrically conductive layers comprise word lines of the vertical NAND memory device.

28. The method of claim 20, wherein the at least one dielectric material layer has a thickness that is greater than a maximum thickness of the first and second electrically insulating layers.

29. The method of claim 20, further comprising forming a plurality of tantalum oxide dielectric pillar structures through first stepped surfaces of the first stack, wherein at least two of the plurality of dielectric pillar structures pass through different numbers of layers among the first electrically insulating layers, and wherein the plurality of dielectric pillar structures applies compressive stress to the first stack.

30. The method of claim 20, wherein:
the at least one conductive structure comprises a source region containing a doped semiconductor material and located underneath the first stack; and
the at least one via contact structure comprises a source contact via structure contacting the source region.

31. The method of claim 20, wherein forming the at least one via contact structure comprises:
depositing a metallic liner directly on physically exposed top surfaces of the first electrically conductive layers; and
depositing a metallic fill material portion within each cavity surrounded by a contiguous portion of the metallic liner, wherein:
the at least one conductive structure comprises the first electrically conductive layers within the first stack; and
the at least one via contact structure comprises a plurality of via contact structures contacting a top surface of a respective first electrically conductive layer within the first stack.

32. The method of claim 20, wherein:
forming the at least one dielectric material layer comprises:
forming a first-stack-cap dielectric layer over the first stack; and
forming an inter-stack dielectric material layer over the first-stack-cap dielectric layer; and
forming the at least one via contact structure comprises:
forming at least one lower via cavity vertically extending through the lower stack structure;
forming the first via contact portion within the at least one lower via cavity;
forming at least one upper via cavity vertically extending through the upper stack structure and the at least one dielectric material layer;
laterally recessing the inter-stack dielectric material layer farther than the first-stack-cap dielectric material employing an isotropic etch; and
forming the second via contact portion within the at least one upper via cavity in contact with the first via contact portion.

33. The method of claim 32, wherein:
forming the at least one dielectric material layer further comprises forming a second-stack-base dielectric layer over the inter-stack dielectric material layer; and
wherein the inter-stack dielectric material layer is laterally etched farther than the second-stack-base dielectric layer within each of the at least one via cavity during the isotropic etch.

34. The method of claim 20, wherein forming the at least one via contact structure comprises:
forming at least one lower via cavity vertically extending through the lower stack structure;
forming the first via contact portion within the at least one lower via cavity;
forming at least one upper via cavity vertically extending through the upper stack structure and the at least one dielectric material layer, wherein the at least one upper via cavity is wider than the at least one lower via cavity; and
forming the second via contact portion within the at least one upper via cavity in contact with the first via contact portion.

35. The method of claim 20, wherein:
an interface between the first via contact portion and the second via contact portion is formed between the upper stack structure and the lower stack structure;
the at least one dielectric material layer comprises:
a first-stack-cap dielectric layer, and
an inter-stack dielectric material layer overlying the first-stack-cap dielectric layer; and
the first via contact portion has a horizontal surface within a horizontal plane including the interface between the first-stack-cap dielectric layer and the inter-stack dielectric material layer.

36. The method of claim 20, wherein:
the three-dimensional memory device comprises a vertical NAND device;
the first and second electrically conductive layers in the first and second stacks comprise, or are electrically connected to, a respective word line of the vertical NAND device;
the substrate comprises a silicon substrate;
the monolithic three-dimensional NAND memory structure comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
each NAND string comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

37. The method of claim 20, further comprising:
forming a dielectric metal oxide layer over the substrate prior to forming the first stack of alternating layers; and
employing the dielectric metal oxide layer as an etch stop layer during formation of at least one opening through the first stack of alternating layers.

38. The method of claim 20, further comprising
patterning the first stack to form first stepped surfaces, wherein the first stepped surfaces include horizontal surfaces of the first electrically insulating layers;
forming via cavities extending to a respective first electrically conductive layer through a respective overlying first electrically insulating layer;
patterning the second stack to form second stepped surfaces, wherein the second stepped surfaces include horizontal surfaces of the second electrically insulating layers; and
forming via cavities extending to a respective second electrically conductive layer through a respective overlying second electrically insulating layer.

* * * * *